(12) United States Patent
Iwasa

(10) Patent No.: US 8,411,186 B2
(45) Date of Patent: Apr. 2, 2013

(54) SOLID STATE IMAGING DEVICE, IMAGING APPARATUS, AND AD CONVERSION METHOD

(75) Inventor: Hiroshi Iwasa, Kanagawa (JP)

(73) Assignee: Sony Corporation, Tokyo (JP)

( * ) Notice: Subject to any disclaimer, the term of this patent is extended or adjusted under 35 U.S.C. 154(b) by 330 days.

(21) Appl. No.: 12/805,928

(22) Filed: Aug. 25, 2010

(65) Prior Publication Data

US 2011/0080507 A1 Apr. 7, 2011

(30) Foreign Application Priority Data

Oct. 2, 2009 (JP) ................................. 2009-230236

(51) Int. Cl.
*H04N 5/335* (2011.01)
(52) U.S. Cl. ....................................... 348/308; 348/294
(58) Field of Classification Search .................. 348/308, 348/294; 250/208.1
See application file for complete search history.

(56) References Cited

U.S. PATENT DOCUMENTS

| | | | |
|---|---|---|---|
| 7,683,818 B2* | 3/2010 | Muramatsu et al. | 341/164 |
| 2011/0221942 A1* | 9/2011 | Taura | 348/294 |
| 2012/0002088 A1* | 1/2012 | Fukushima | 348/294 |
| 2012/0104233 A1* | 5/2012 | Mori et al. | 250/208.1 |

FOREIGN PATENT DOCUMENTS

JP 2007-243265 9/2007

* cited by examiner

*Primary Examiner* — Tuan Ho
(74) *Attorney, Agent, or Firm* — Rader, Fishman & Grauer PLLC

(57) ABSTRACT

A solid state imaging device includes: an AD conversion section having one comparison section, which receives a reference signal from a reference signal generator that generates the reference signal whose level gradually changes and which compares the reference signal with an analog signal to be processed, and one counting section, which receives a count clock for AD conversion and performs a count operation on the basis of a comparison result of the comparison section, for each of M signal lines to which the signal is supplied and that acquires the signal on the basis of output data of the counting section; an operation period control section controlling an operation period of the counting section on the basis of the comparison result; and a control section performing control regarding which of the signals, which are supplied through the M signal lines, is to be processed and which one of m levels of the signals to be processed is to be processed and controlling the processing order.

17 Claims, 41 Drawing Sheets

<REFERENCE SIGNAL COMPARISON TYPE AD CONVERSION METHOD: BASIC>

FIG.4A
<FIRST EMBODIMENT (FIRST EXAMPLE)>
(1)
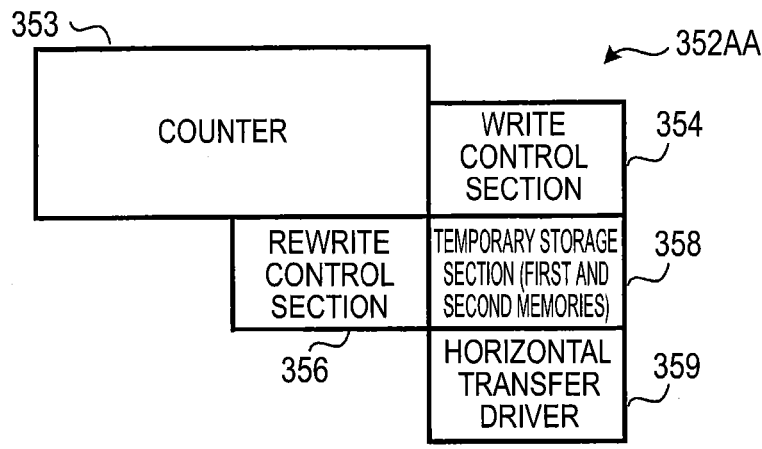
(2)
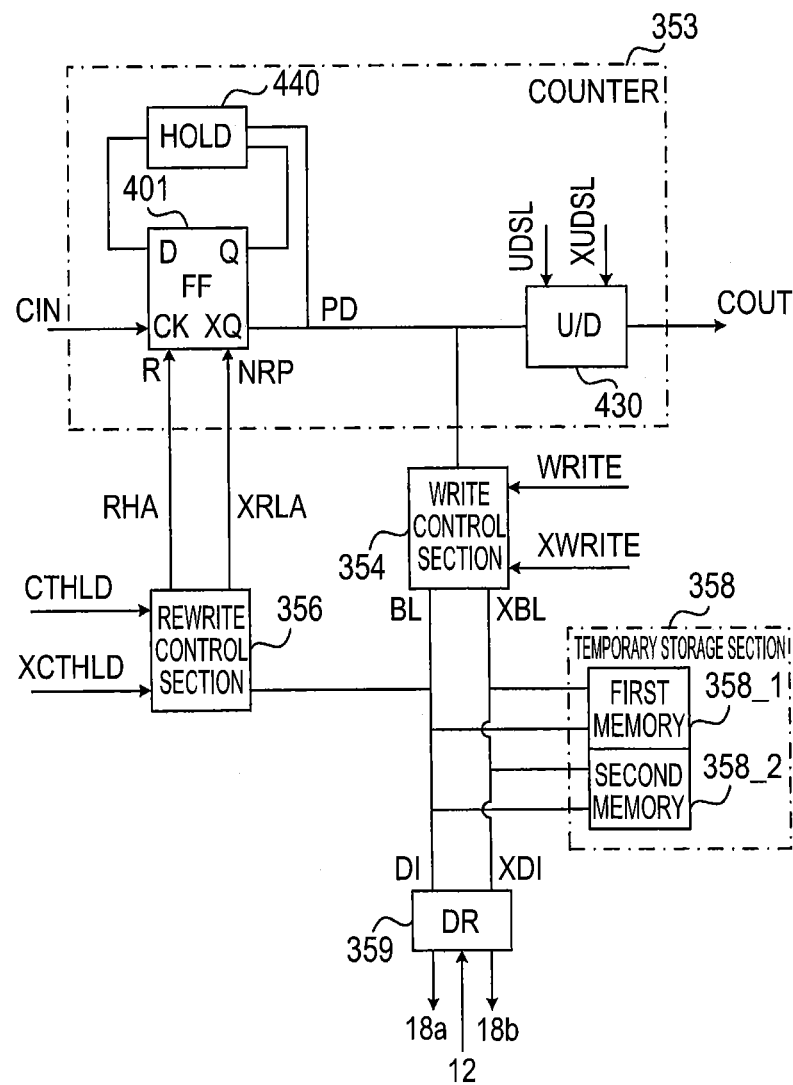

FIG.4D
<OPERATION OF D FLIP-FLIP 401>
(1) UP-COUNT TYPE
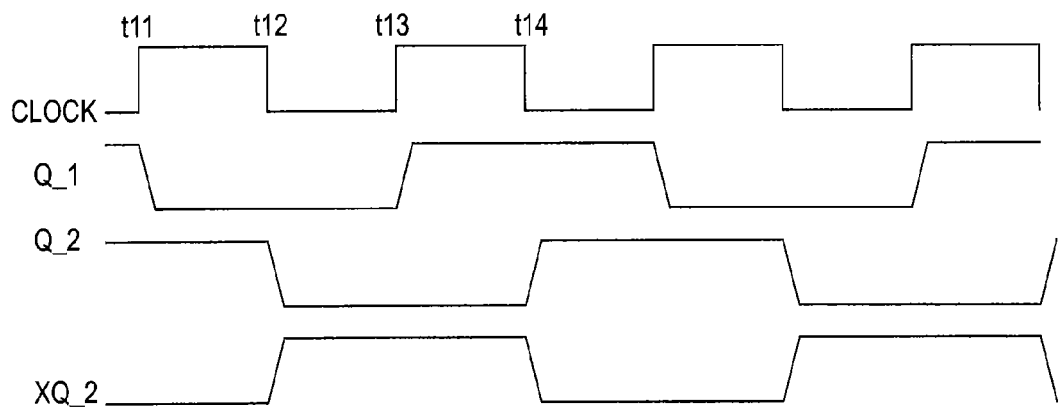
(2) DOWN-COUNT TYPE
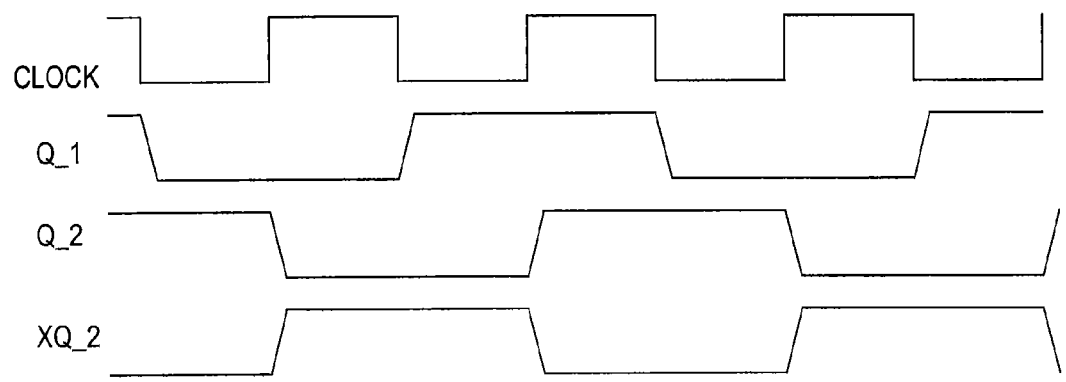

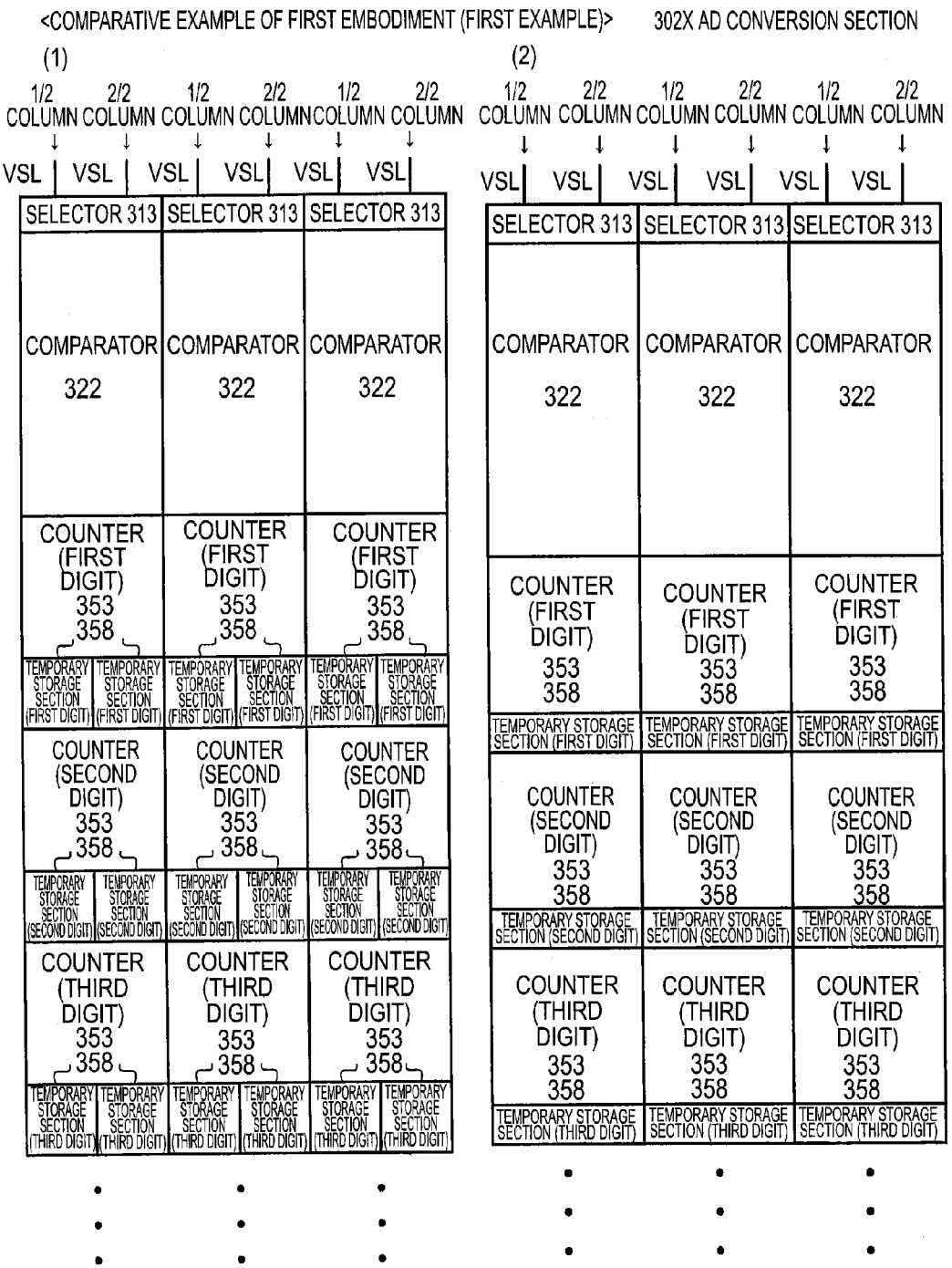

<COMPARATIVE EXAMPLE OF FIRST EMBODIMENT (FIRST EXAMPLE)>

FIG.5C
<PROCESSING TIME IN COMPARATIVE EXAMPLE>
(1) COLUMN SHARING
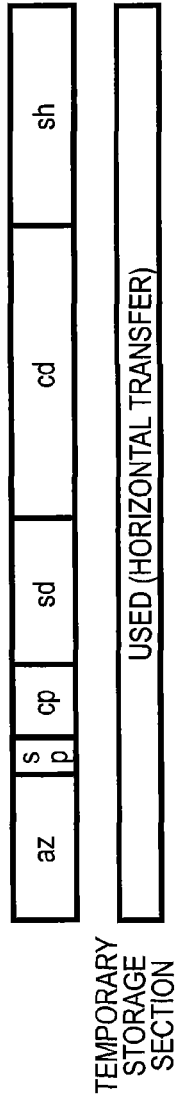
EXAMPLE OF PROCESSING TIME OF ONE ROW:10.3us
EXAMPLE OF MAXIMUM HORIZONTAL TRANSFER TIME:10.3us
(2) VERTICAL SIGNAL LINE SEPARATE SETTLING TYPE COLUMN SHARING
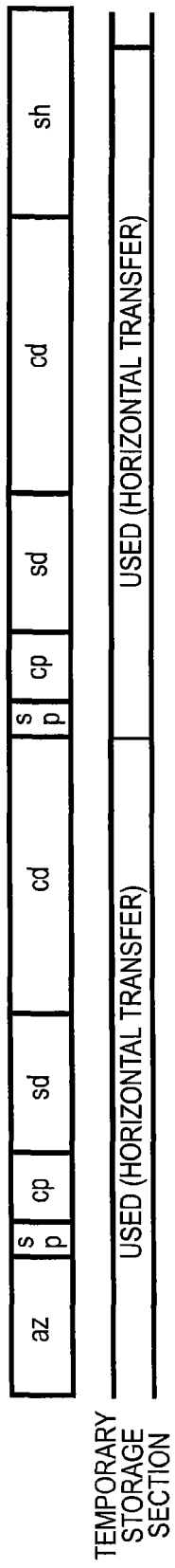
EXAMPLE OF PROCESSING TIME OF ONE ROW:16.4us
EXAMPLE OF MAXIMUM HORIZONTAL TRANSFER TIME:7.8us

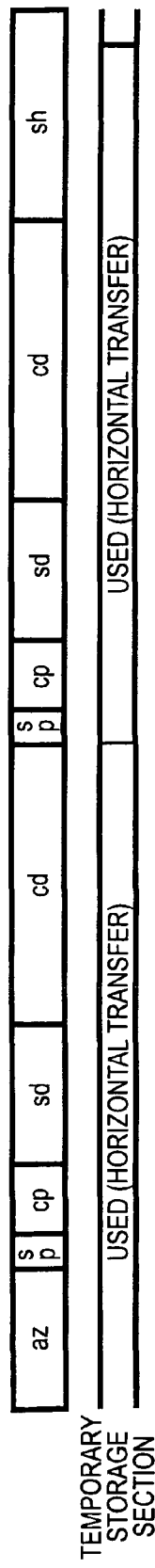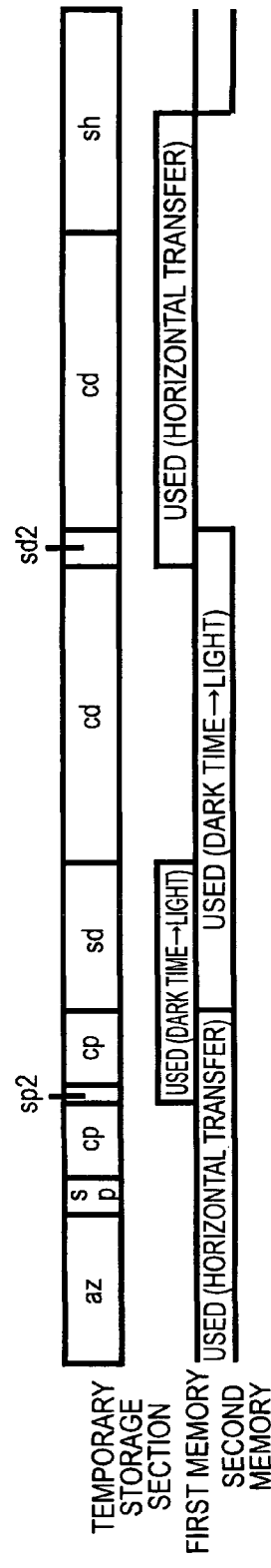
FIG.6B

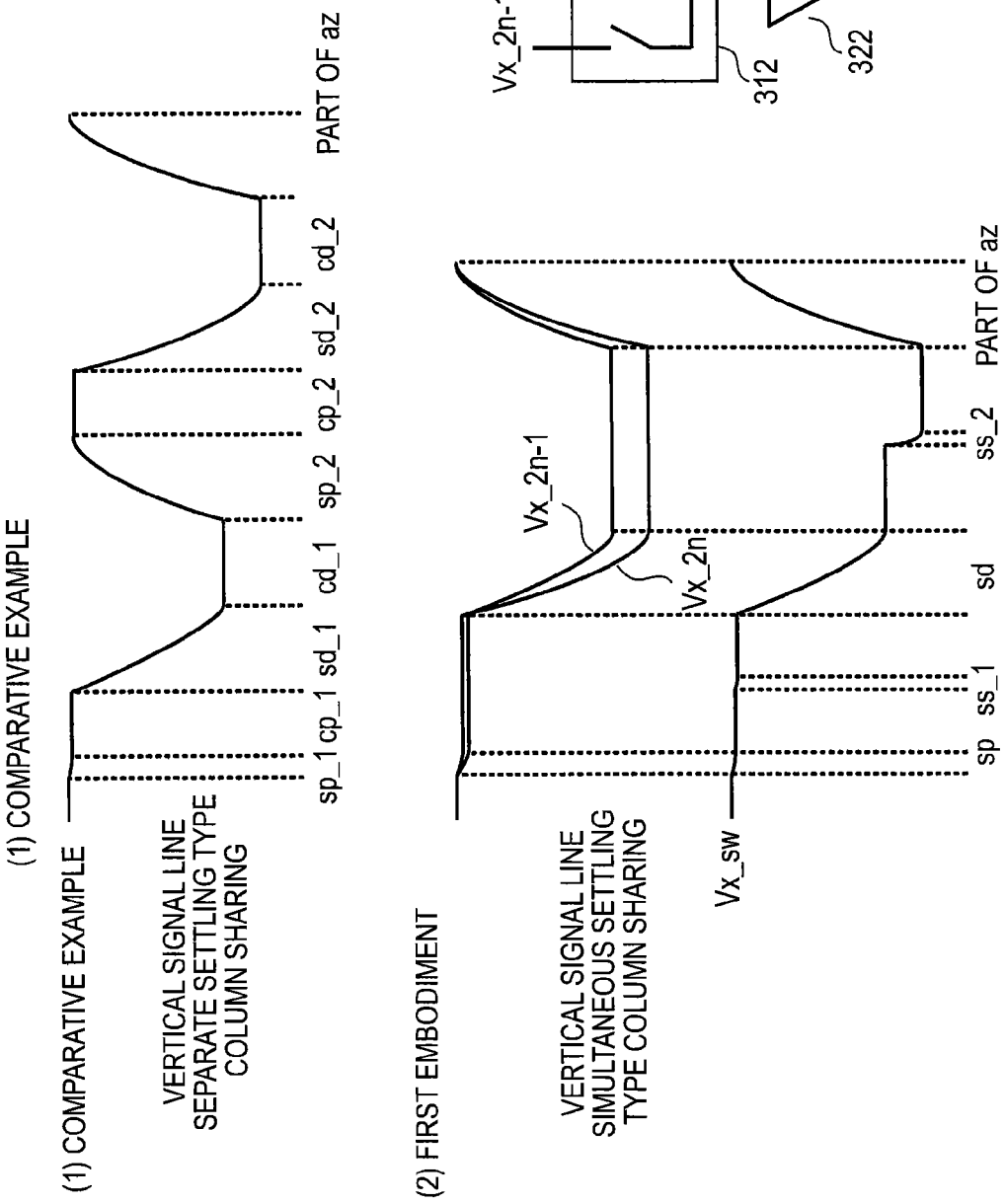

FIG.7A
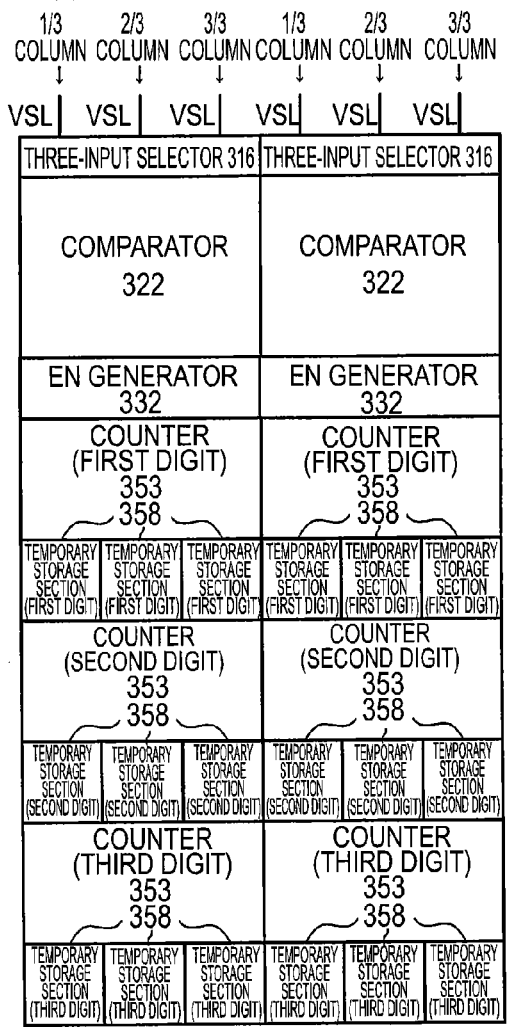
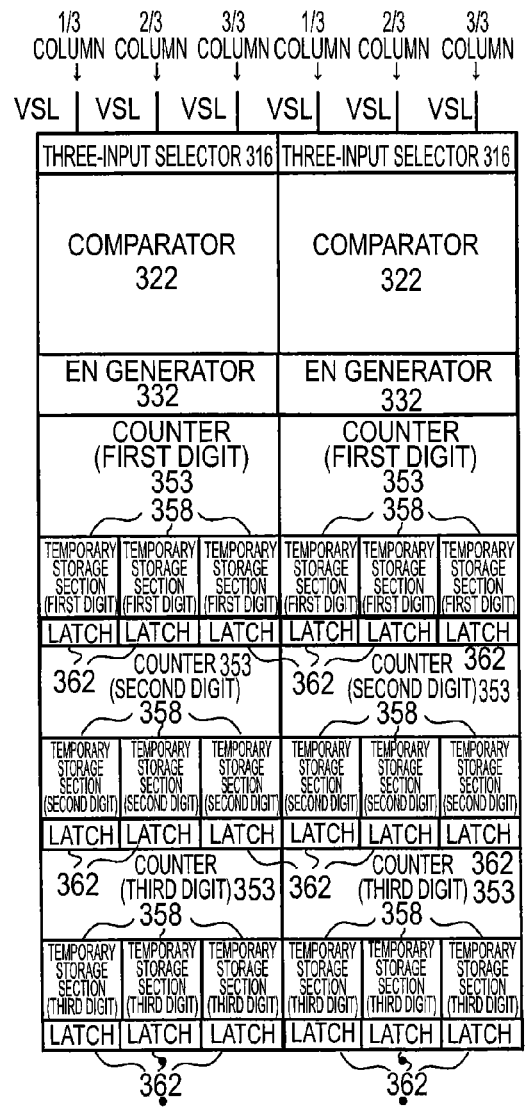
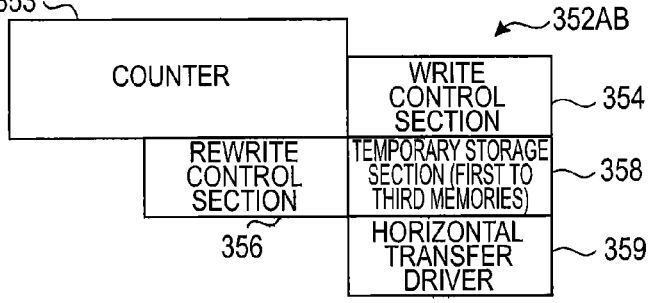

FIG. 8A
<FIRST EMBODIMENT (SECOND EXAMPLE)>
(1)
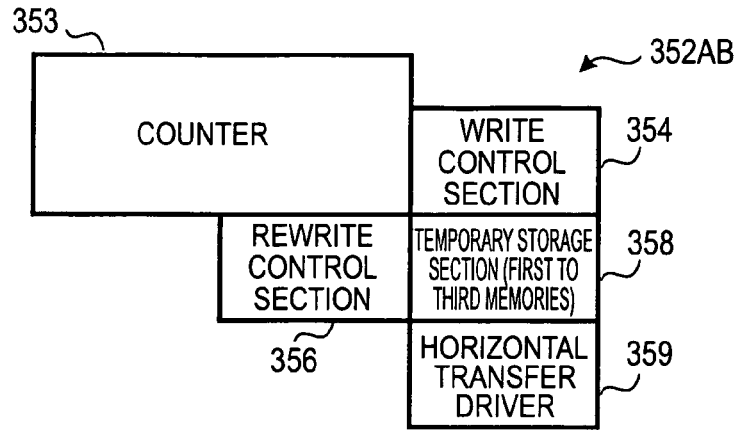
(2)
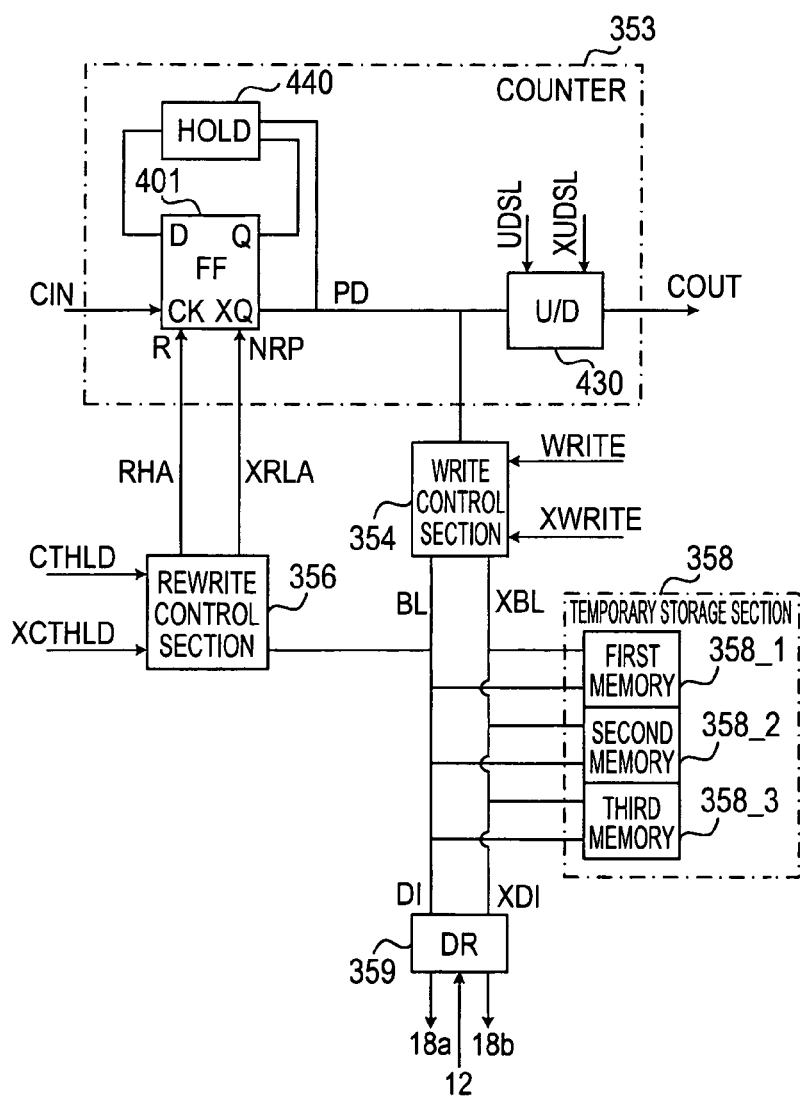

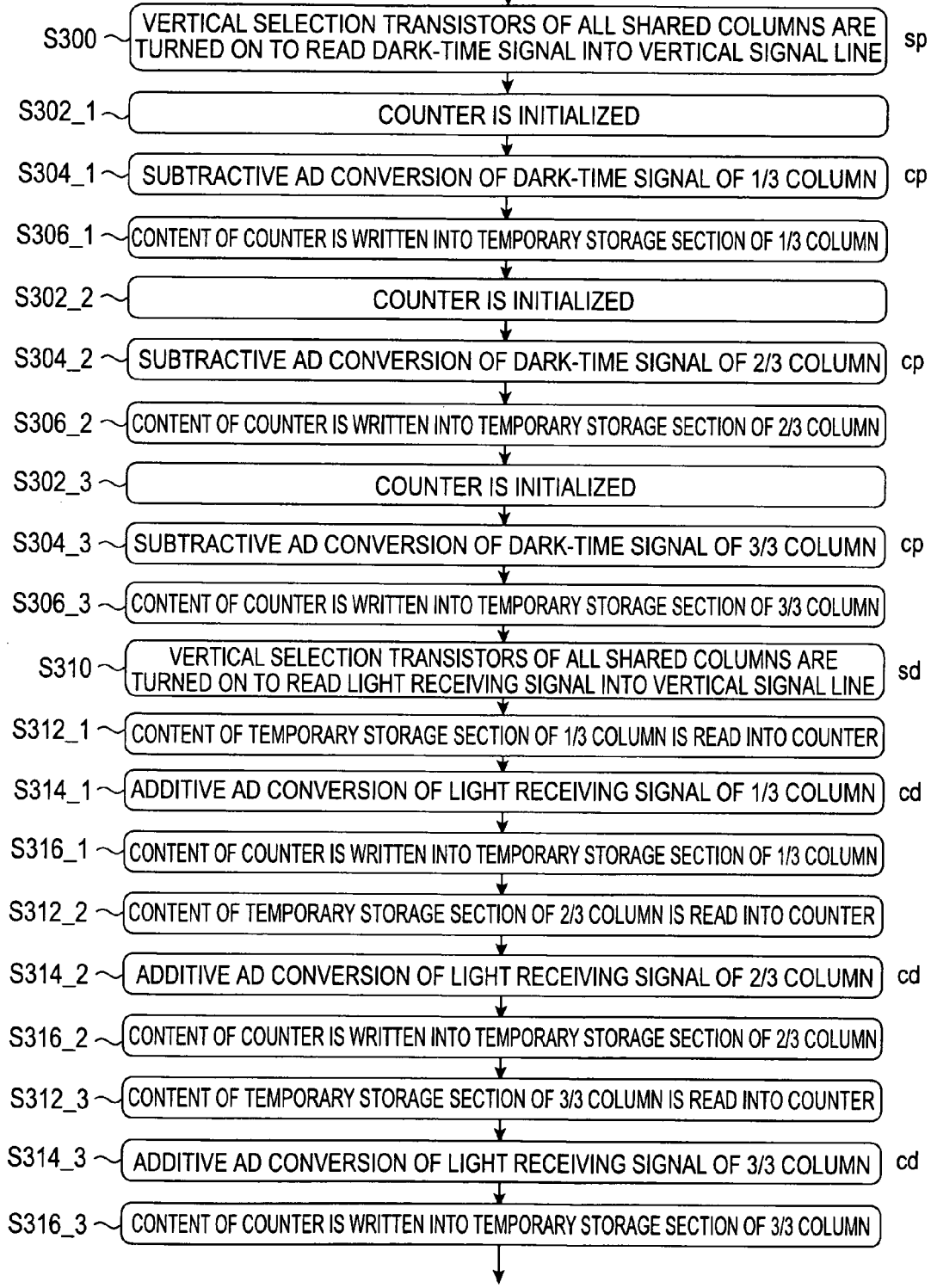

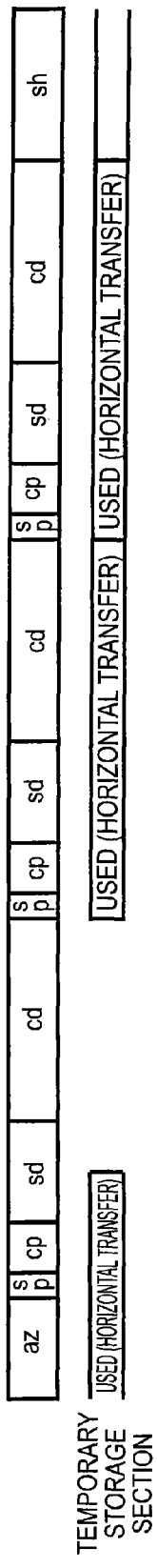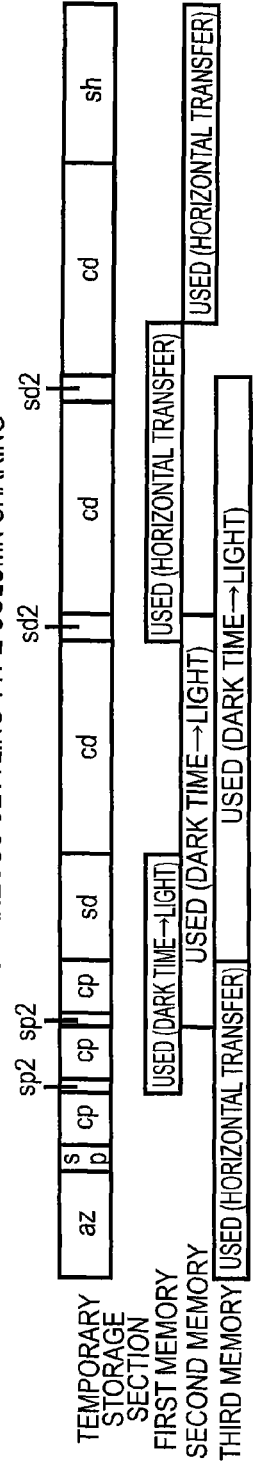
FIG. 9B

FIG.10A
<FIRST EMBODIMENT (THIRD EXAMPLE)>
(1)
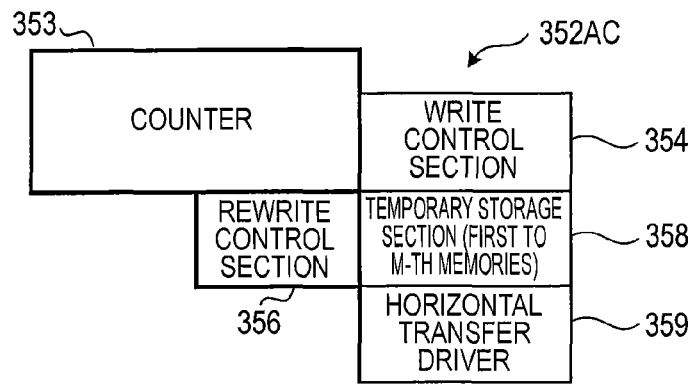
(2)
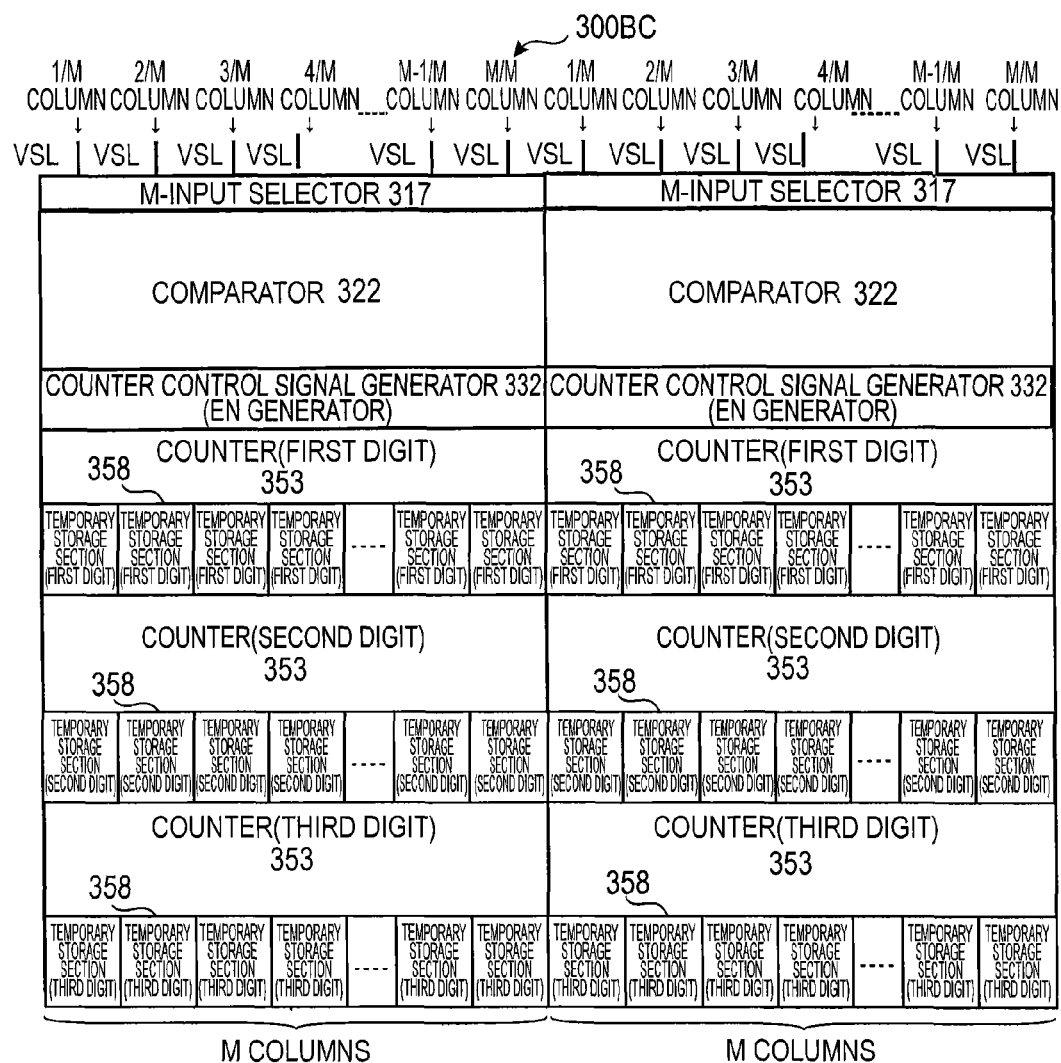

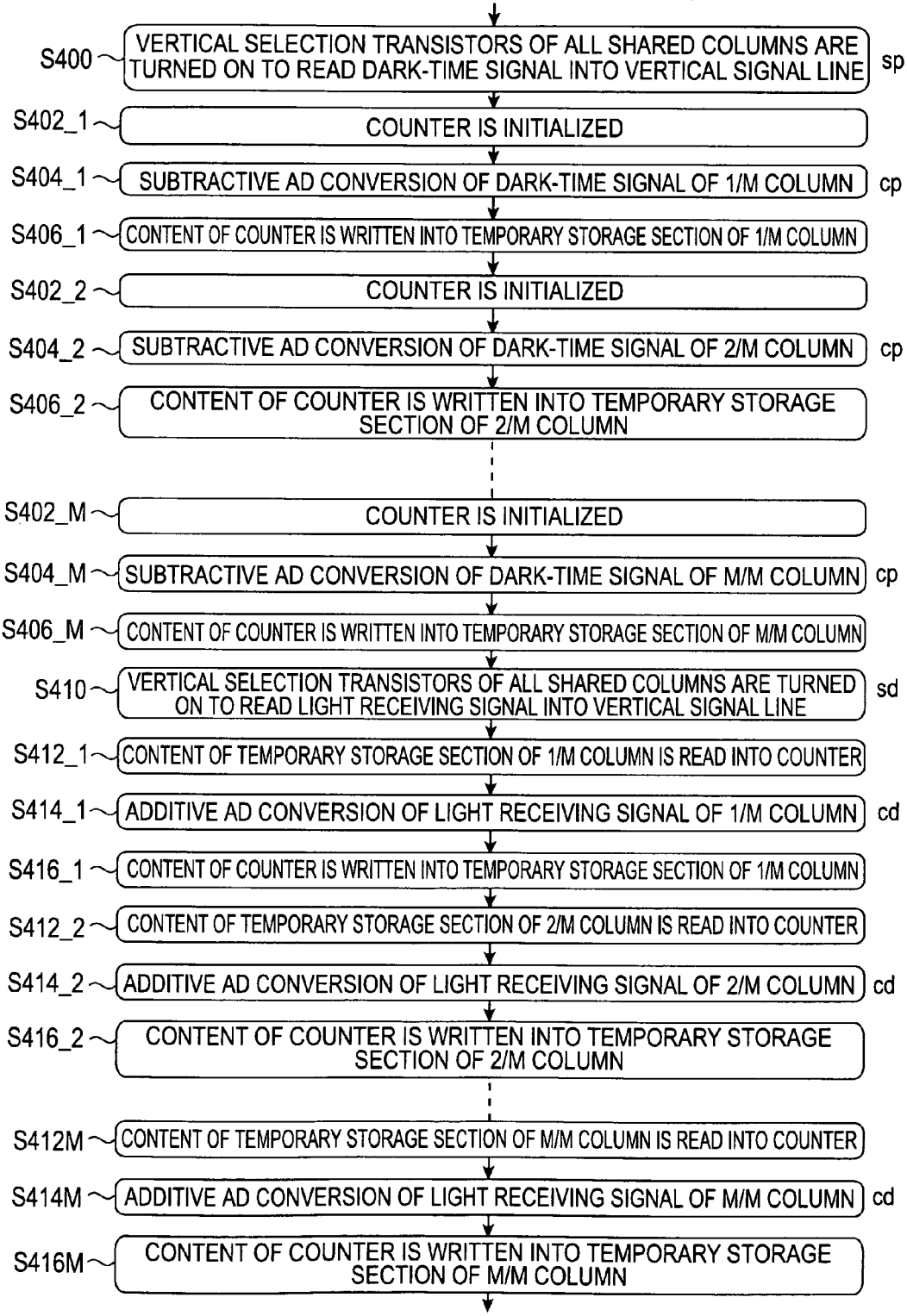

<SECOND EMBODIMENT (FIRST EXAMPLE)>

<SECOND EMBODIMENT (SECOND EXAMPLE)>

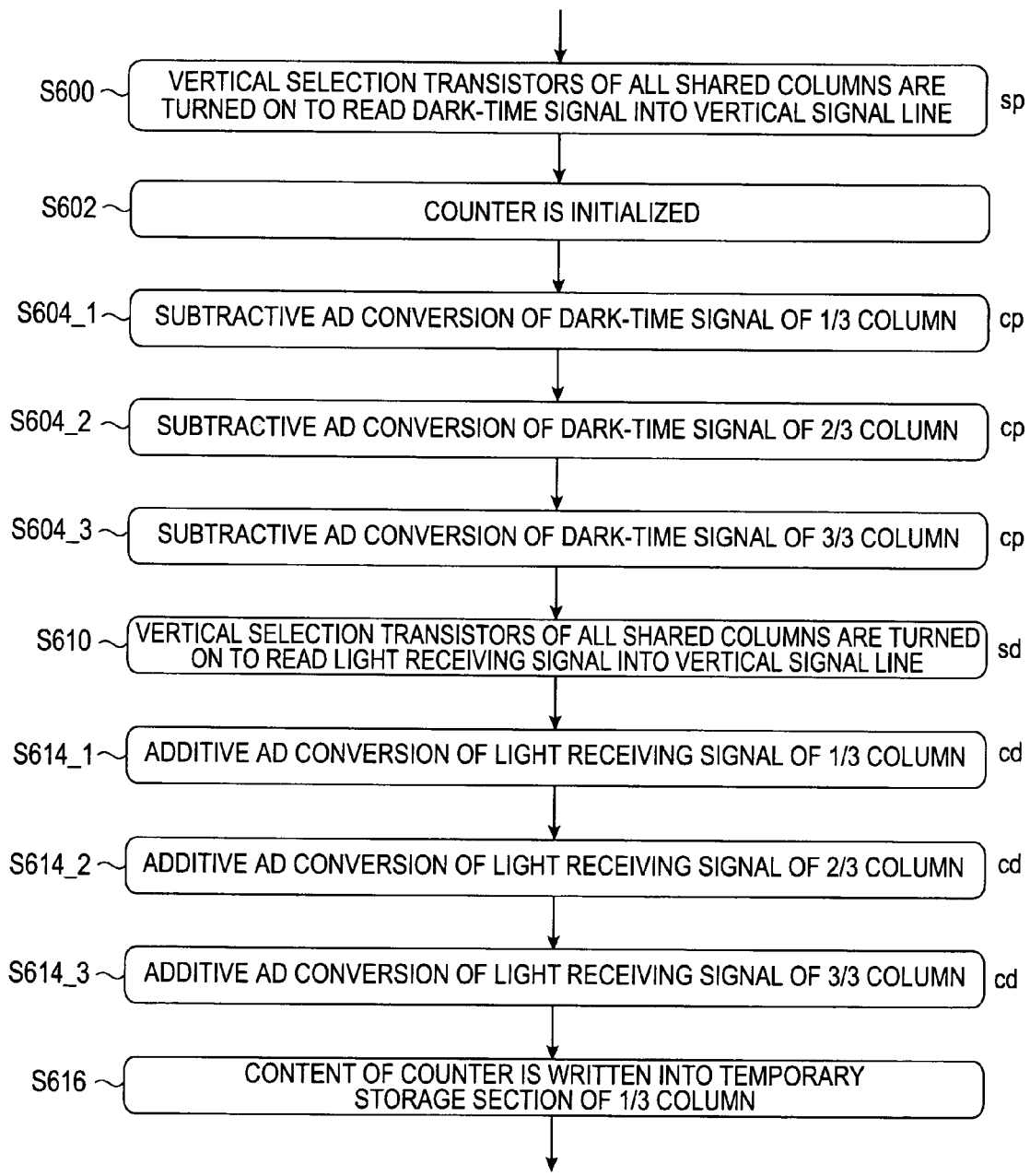

FIG. 13A
<SECOND EMBODIMENT (THIRD EXAMPLE)>
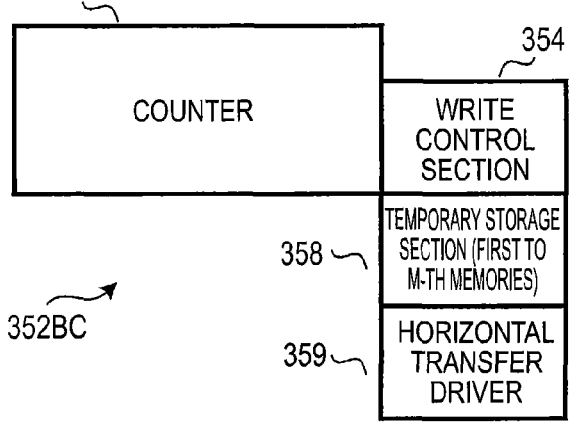
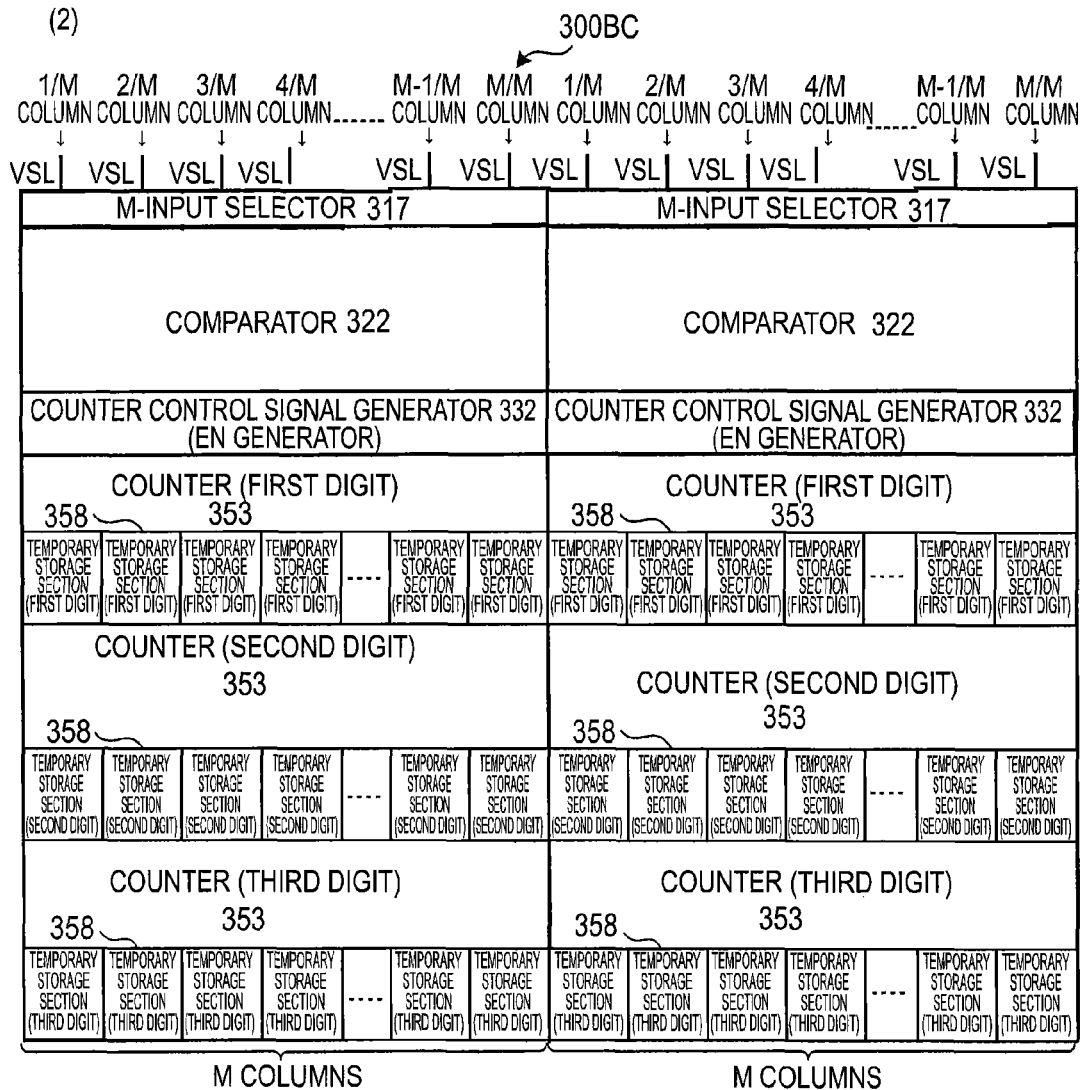

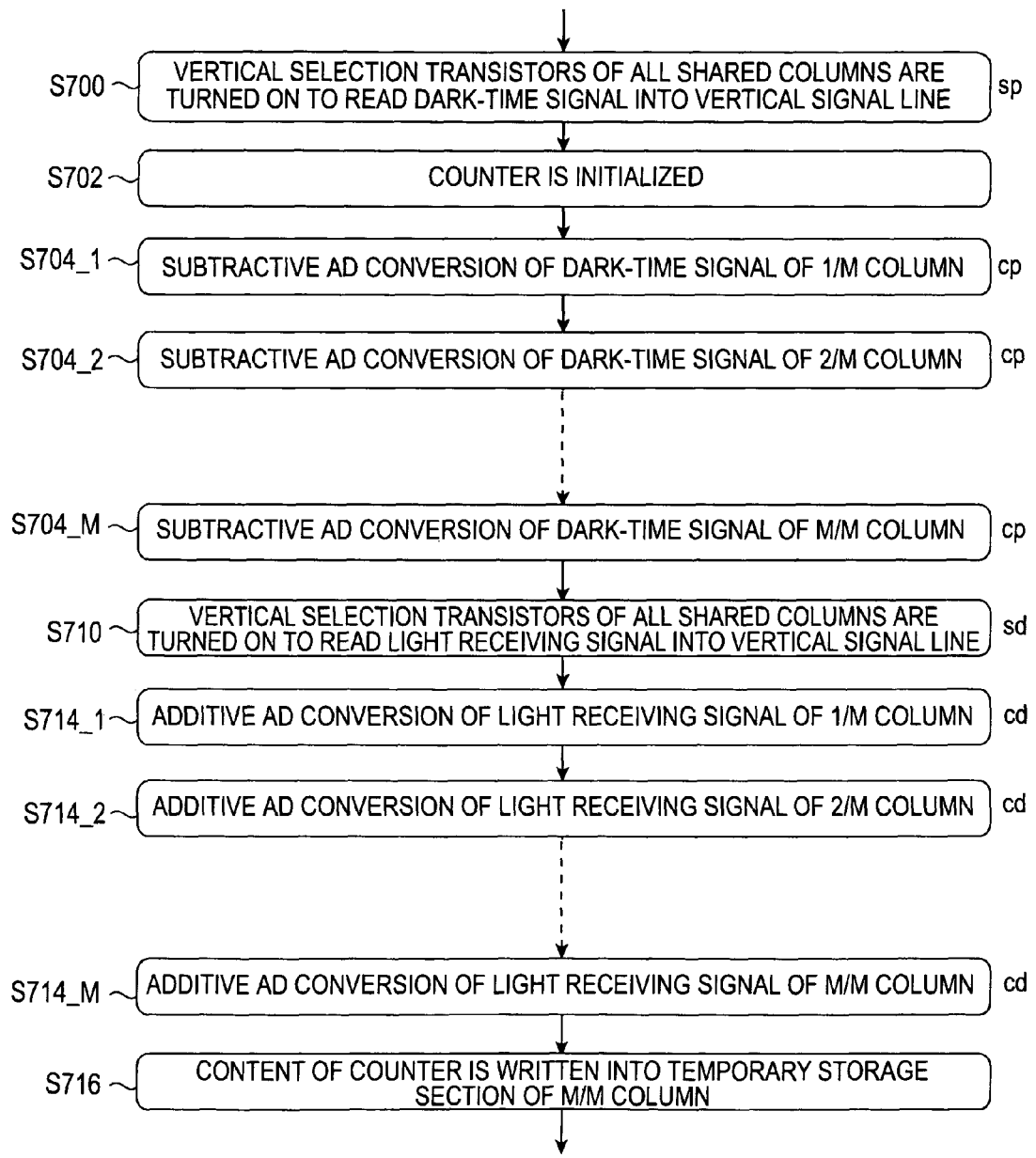

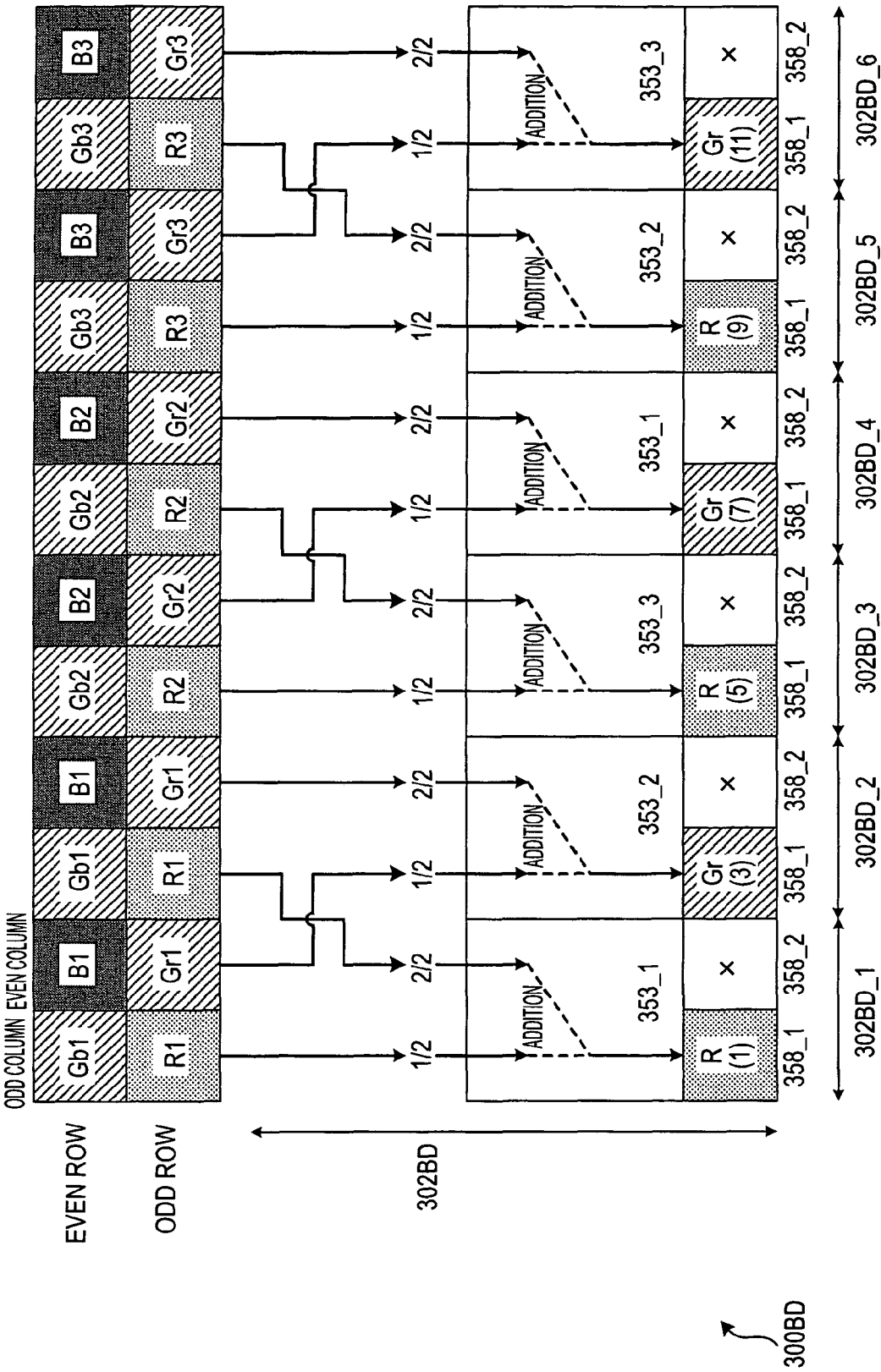

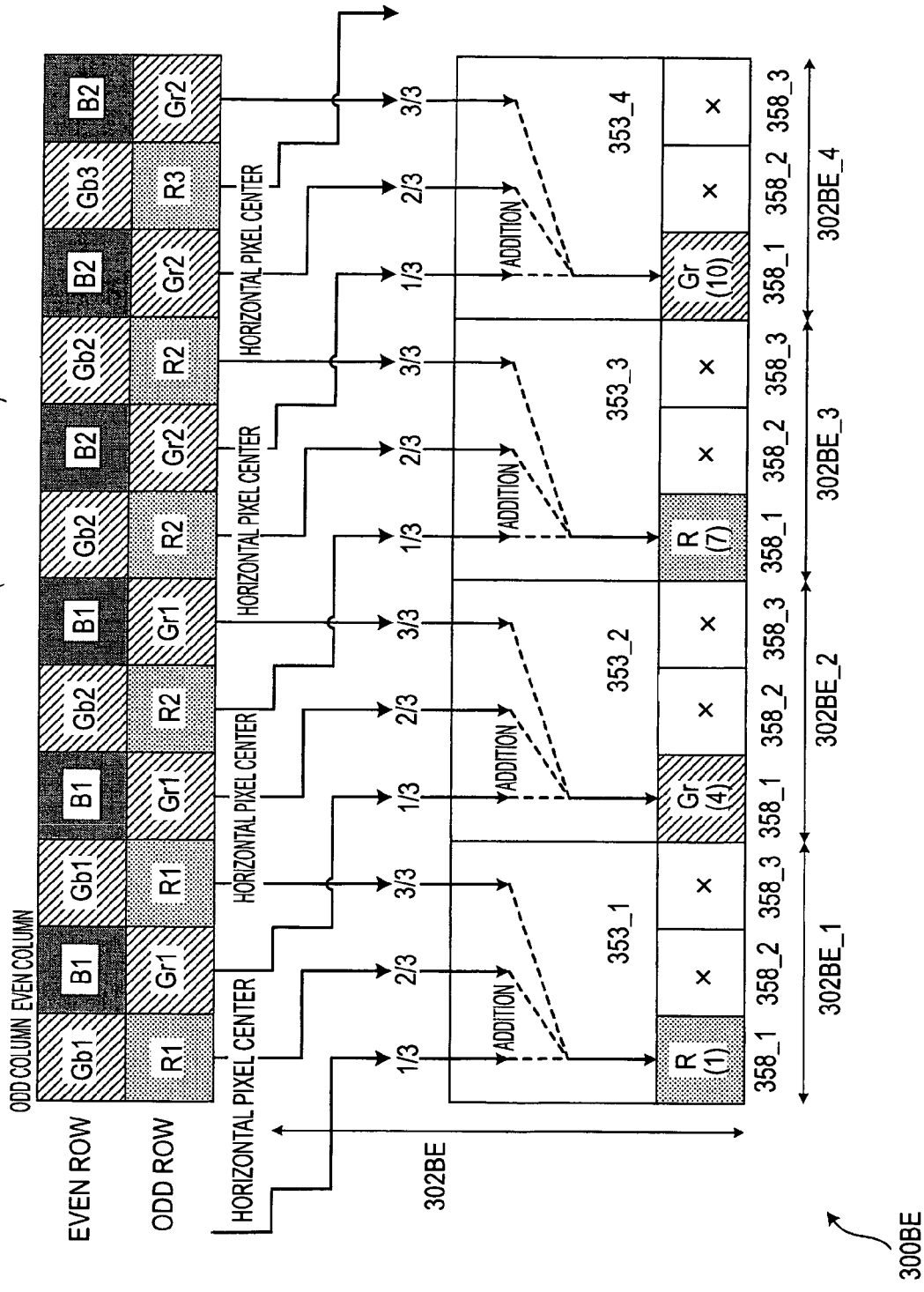

FIG.16A
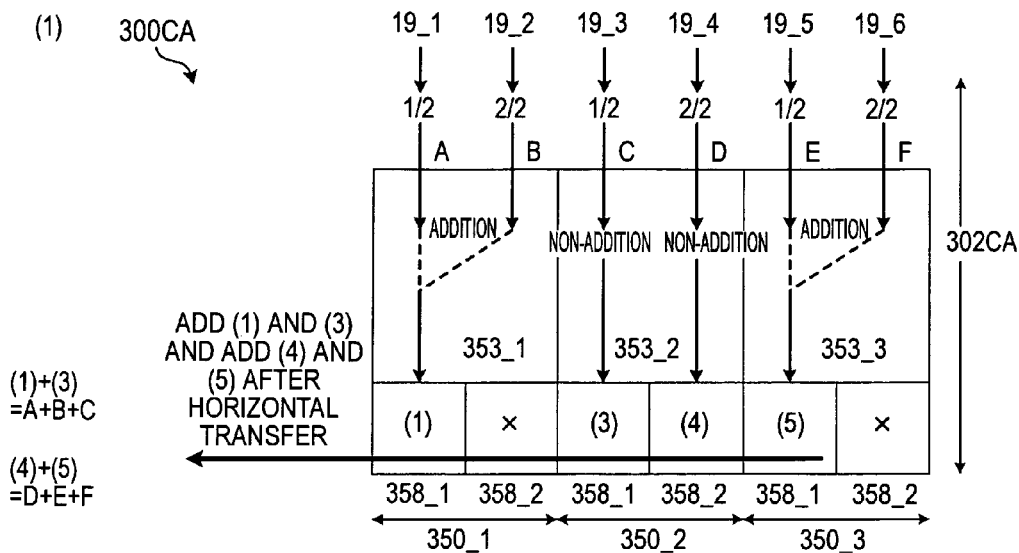
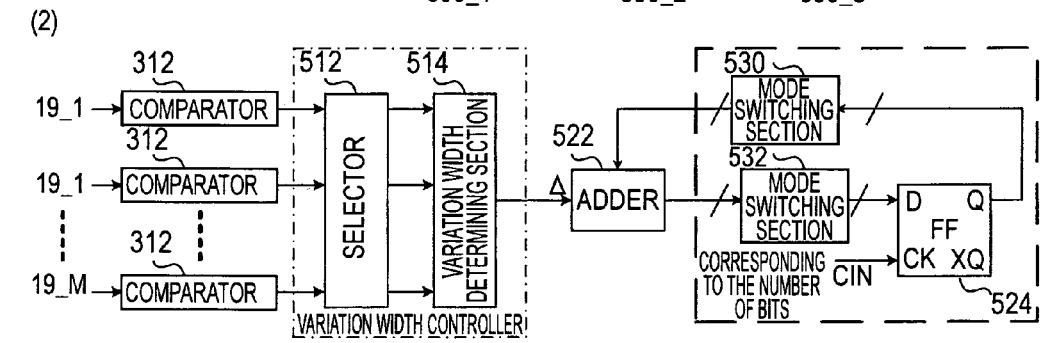
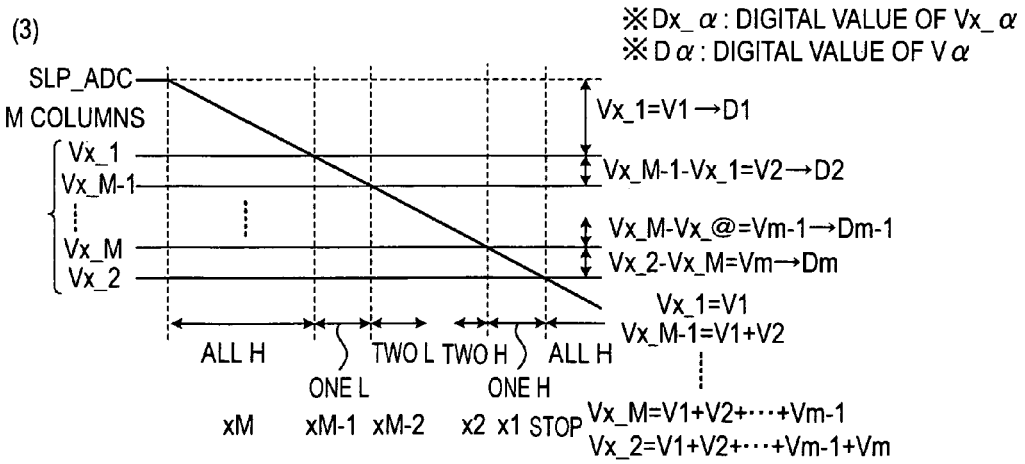

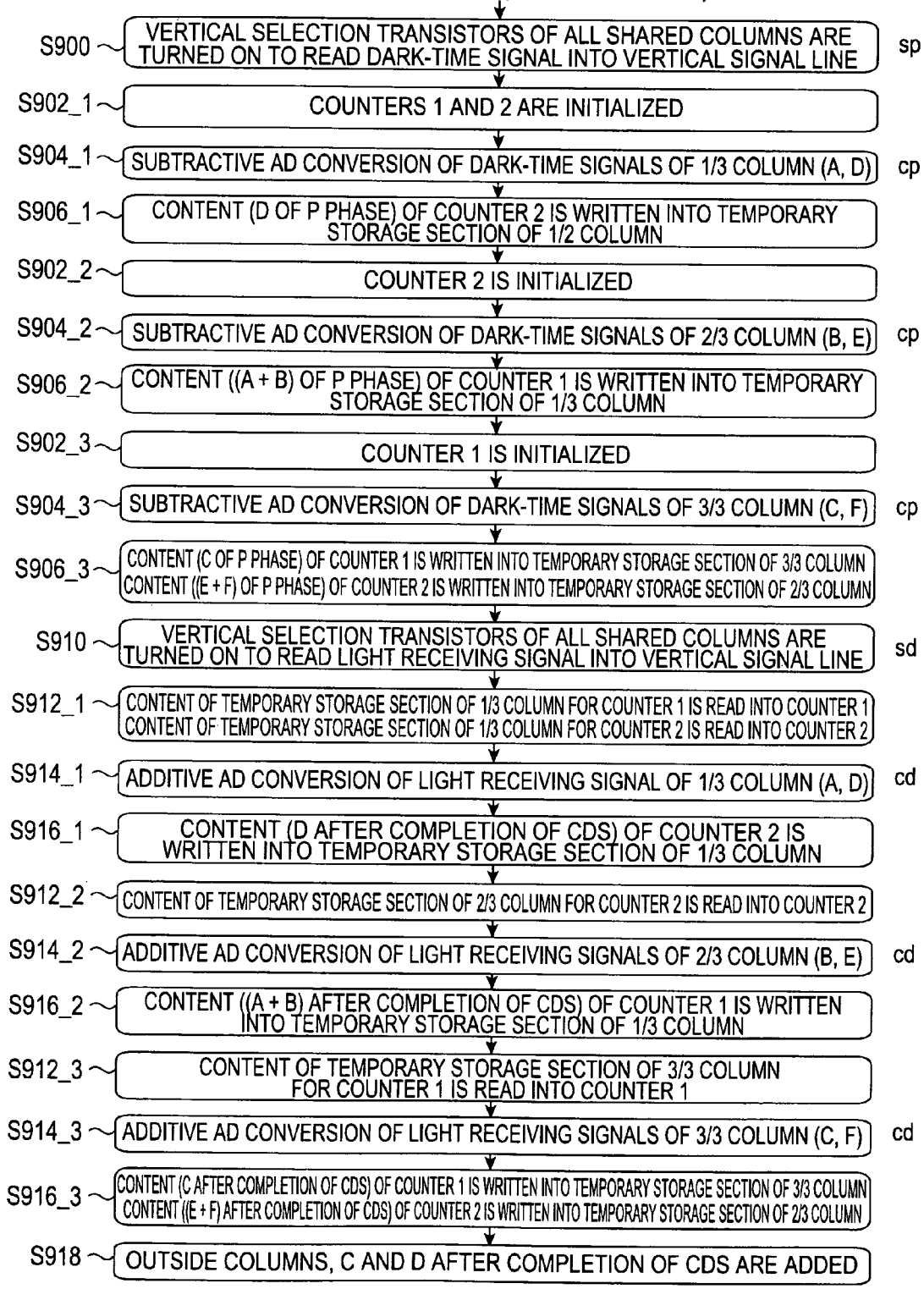

FIG.18
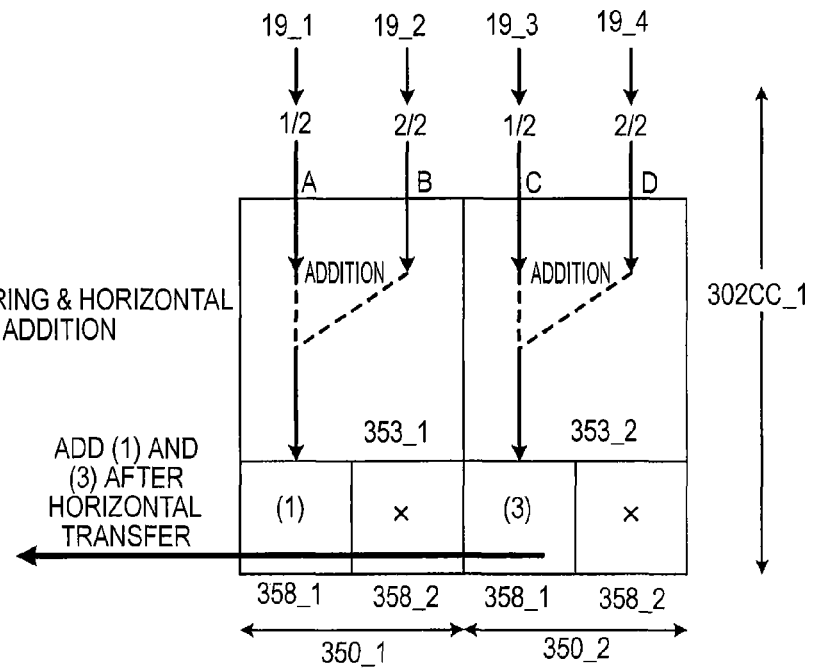
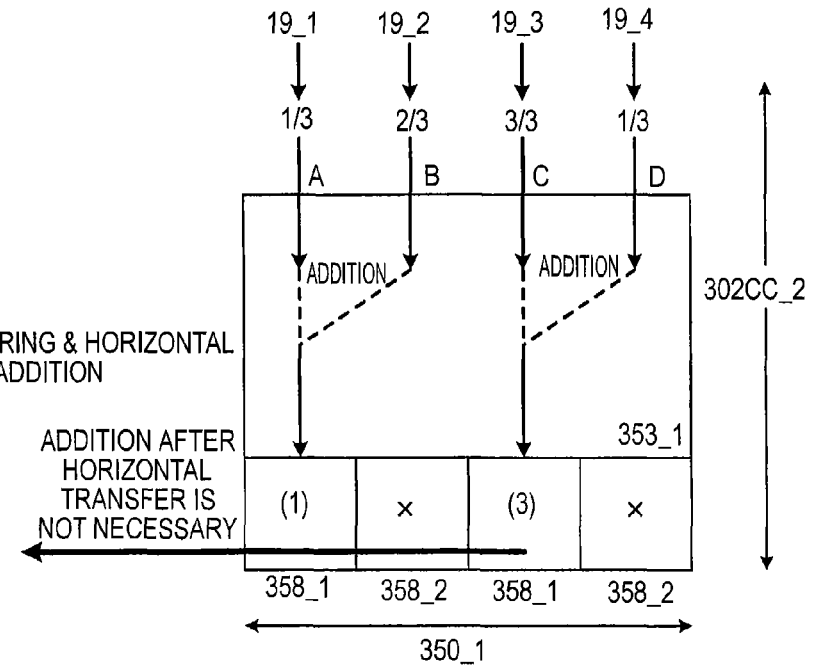

<FOURTH EMBODIMENT-POWER CONSUMPTION REDUCTION>

<FIFTH EMBODIMENT – IMPROVEMENT IN HORIZONTAL TRANSFER EFFICIENCY>

<SIXTH EMBODIMENT>

SOLID STATE IMAGING DEVICE, IMAGING APPARATUS, AND AD CONVERSION METHOD

BACKGROUND OF THE INVENTION

1. Field of the Invention

The present invention relates to a solid state imaging device, an imaging apparatus, and an AD conversion method.

2. Description of the Related Art

An imaging apparatus configured such that one signal processor is shared between a plurality of columns of a pixel array section is known (see JP-A-2007-243265). This is advantageous in that the circuit configuration becomes compact and so on because one signal processor is shared by a plurality of columns.

SUMMARY OF THE INVENTION

In the case where one signal processor is shared between a plurality of columns, however, it is not necessarily efficient to perform signal processing at a signal processing timing when a sharing configuration is not applied, taking time until the entire process is completed into consideration. Moreover, when performing horizontal pixel addition, a problem occurs if the addition number is different from the number of shared columns.

In view of the above, it is desirable to provide a structure capable of shortening a processing time, in a configuration in which one signal processor is shared between a plurality of columns, compared with the case of performing signal processing at a signal processing timing when a sharing configuration is not applied. In addition, it is desirable to provide a structure capable of utilizing addition processing in shared columns even if the addition number is different from the number of shared columns when performing horizontal pixel addition.

According to one embodiment of the present invention, a so-called reference signal comparison type AD conversion is performed even in the case of a sharing configuration. In this case, control is performed regarding which of signals to be processed, which are supplied through M signal lines, is to be processed, which one of m levels of the signals to be processed is to be processed, and the processing order.

Accordingly, signal processing can be performed at a different signal processing timing from the case where the sharing configuration is not applied. For example, control may be performed such that AD conversion is performed in order of a combination of levels with the same meaning of the signals to be processed. Moreover, AD conversion of addition in a sharing unit may also be performed. Moreover, regarding a portion in which addition in a sharing unit is not possible, processing may be performed after division into a portion in which addition in a sharing unit is possible and a portion in which addition in a sharing unit is not possible.

According to another embodiment of the present invention, a so-called reference signal comparison type AD conversion is performed even in the case of a sharing configuration. Signal addition is also performed together. In this case, if the sharing number X is not equal to the addition number Y, addition using a counting section is performed with the least common multiple of X and Y as a basic processing unit for a portion in which addition of Y signals to be processed is possible, but AD conversion of signals to be processed using the counting section is separately performed for a portion in which addition of the Y signals to be processed is difficult.

According to the one embodiment of the present invention, the processing time can be shortened compared with the signal processing timing when the sharing configuration is not adopted.

According to the another embodiment of the present invention, regarding the portion in which addition based on the sharing configuration is possible, the function is utilized. As a result, the processing efficiency is improved compared with the case where digital addition is performed after performing AD conversion of all signals to be processed.

BRIEF DESCRIPTION OF THE DRAWINGS

FIG. 4A is a view showing the outline of one digit of two columns;

FIG. 4D is a timing chart for explaining a frequency dividing operation of a D flip-flop;

FIG. 5A is a view showing an example of the configuration of a column AD converter in a comparative example of the first embodiment;

FIG. 5C is a view for explaining a comparison result of the processing time for one row at the time of all pixel readout in a case where two column sharing is applied and a case where two column sharing is not applied, in the comparative example;

FIG. 6B is a view for explaining a comparison result of the processing time for one row at the time of all pixel readout in two column sharing of a comparative example and two column sharing of the first embodiment (first example);

FIG. 6C is a view for explaining a difference between the comparative example and the first embodiment (first example) through the relationship with a settling period;

FIG. 7A is a view for explaining the first embodiment (second example) of column signal processing;

FIG. 8A is a view showing the outline of one digit of three columns of a count processor used in an AD conversion section of the first embodiment (second example);

FIG. 9A is a flow chart for explaining the operations of AD conversion and CDS processing at the time of all pixel readout in a column AD converter of the first embodiment (second example);

FIG. 9B is a view for explaining the effects of an all pixel readout in the column AD converter of the first embodiment (second example);

FIG. 10A is a view for explaining the first embodiment (third example) of column signal processing;

FIG. 10B is a flow chart for explaining the operations of AD conversion and CDS processing at the time of all pixel readout in a column AD converter of the first embodiment (third example);

FIG. 12B is a flow chart for explaining the operations of AD conversion and CDS processing at the time of all pixel readout in a column AD converter of the second embodiment (second example);

FIG. 13A is a view illustrating a second embodiment (third example) of column signal processing;

FIG. 13B is a flow chart showing an example of the procedures of AD conversion and CDS processing at the time of all pixel readout in a column AD converter of the second embodiment (third example);

FIG. 14 is a view illustrating the second embodiment (fourth example) of column signal processing;

FIG. 15 is a view illustrating the second embodiment (fifth example) of column signal processing;

FIG. 16A is a view illustrating a third embodiment (first example) of column signal processing;

FIG. 17B is a flow chart showing an example of the procedures of AD conversion and CDS processing at the time of horizontal additive readout of a sharing unit in a column AD converter of the third embodiment (second example);

FIG. 18 is a view for explaining the third embodiment (third example) of column signal processing;

DESCRIPTION OF THE PREFERRED EMBODIMENTS

Figure 1:
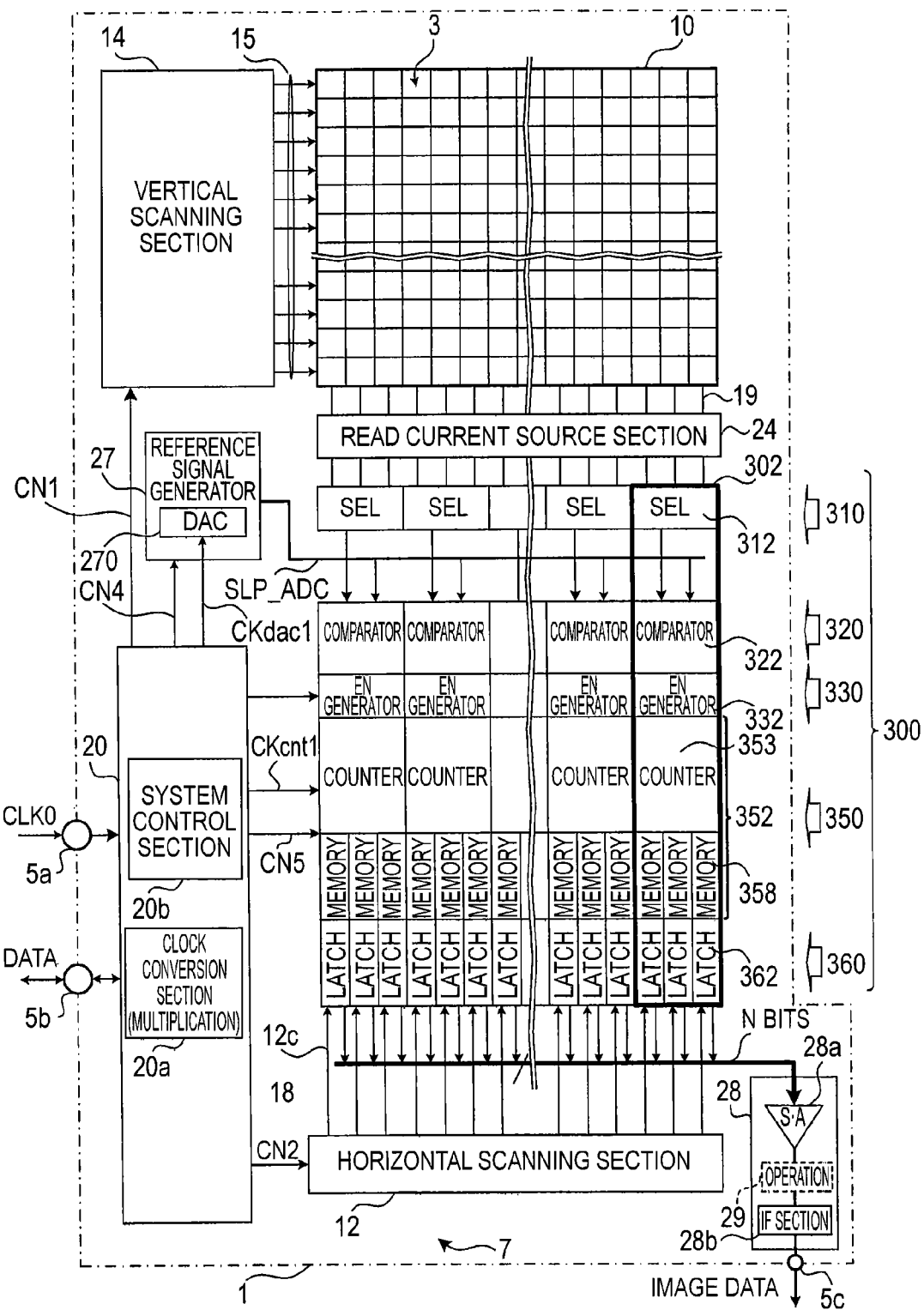
FIG. 1 is a view showing the basic configuration of a CMOS type solid state imaging device (CMOS image sensor) which is a solid state imaging device according to an embodiment of the present invention.

Hereinafter, embodiments of the present invention will be described in detail with reference to the accompanying drawings.

In addition, the explanation will be given in the following order.

1. Solid state imaging device: basic configuration
2. Exemplary configuration and basic operation of a unit pixel
3. First embodiment: column signal processing—all pixel readout
4. Second embodiment: column signal processing—all column horizontal additive readout of a sharing unit
5. Third embodiment: column signal processing—horizontal additive readout of a sharing unit
6. Fourth embodiment: column signal processing—power consumption reduction
7. Fifth embodiment: column signal processing—improvement in horizontal transfer efficiency
8. Sixth embodiment: Imaging apparatus In addition, the case where a CMOS type solid state imaging device, which is an example of an X-Y address type solid state imaging device, is used as a device will be described below as an example. Unless there is a special notice, the CMOS type solid state imaging device will be described assuming that all unit pixels are formed of nMOS (n channel-type MOS transistor) and a signal charge is a negative charge (electron). However, this is only an example, and the target device is not limited to the MOS-type solid state imaging device. The unit pixel may be formed of pMOS (p channel-type MOS transistor) and the signal charge may be a positive charge (hole).

All embodiments to be described below may be similarly applied to all kinds of semiconductor devices for detection of the physical quantity distribution in which a plurality of unit pixels sensitive to electromagnetic waves input from the outside, such as light or radiant rays, are arrayed linearly or in a matrix and which read a signal by address control.

<Solid State Imaging Device: Basic Configuration>

[Overview]

FIG. 1 is a view showing the basic configuration of a CMOS type solid state imaging device (CMOS image sensor) which is a solid state imaging device according to an embodiment of the present invention. The solid state imaging device is also an example of a semiconductor device. A solid state imaging device 1 includes a pixel array section 10 in which a plurality of unit pixels 3 are arrayed in a two-dimensional matrix. In the solid state imaging device 1, it is possible to make the pixel array section 10 prepare for color imaging by using a color separating filter in which color filters of R, G, and B are arrayed in a Bayer pattern, for example.

In FIG. 1, rows and columns are shown in a state where parts of the rows and columns are omitted for the sake of simplicity. In practice, however, tens to thousands of unit pixels 3 are arrayed in each row or each column. The unit pixel 3 has an amplifier in a pixel which has three or four transistors, for example, a charge transfer transistor, a reset transistor, and an amplifying transistor, in addition to a photodiode as a light receiving element (charge generator) that is an example of a detection section, which will be described later. From the unit pixel 3, a pixel signal voltage Vx is output through a vertical signal line 19 for every column.

In the pixel array section 10, the unit pixels 3 may be arrayed in a two-dimensional manner. Moreover, the arrangement pattern is not limited to the two-dimensional grid shape. For example, the unit pixels 3 may be arrayed in an inclined grid shape based on pixel shift, or the unit pixels 3 may be arrayed in a honeycomb shape.

In the pixel signal voltage Vx of the vertical signal line 19, a signal level Ssig (light receiving signal) appears in a time-sequence manner after a reset level Srst (dark-time signal)

including noise of a pixel signal as a reference level. For example, the reset level Srst is a level obtained by adding a reset component Vrst to a feed-through level Sfeed. The signal level Ssig is a level obtained by adding a signal component Vsig to the reset level Srst, and the signal component Vsig can be obtained by Ssig(=Srst+Vsig)−Srst. This differential processing is equivalent to a so-called CDS processing. By acquiring a dark-time signal and a light receiving signal and then acquiring the difference (level difference), a noise component is equal in both the dark-time signal and the light receiving signal. Accordingly, the amount of noise included in the difference becomes very small.

The solid state imaging device 1 includes a column AD converter 300 in which AD conversion sections 302, each of which has a CDS (Correlated Double Sampling) processing function or a digital conversion function, are provided in column parallel. Although described in detail later, a vertical line selecting section 310, a comparison section 320, a count operation period control section 330, and a counting section 350, and a data storage section 360 are provided in the column AD converter 300, and the AD conversion section 302 is formed by a group of these functional elements of one column.

"Column parallel" means that functional elements (in this example, the AD conversion section 302), such as a plurality of CDS processing function sections or digital conversion sections (AD conversion sections), are provided in parallel to the vertical signal line 19 (an example of a column signal line) of a vertical column. Such a read method is called a column read method.

In a typical column read method, the vertical signal line 19 and the AD conversion section 302 are disposed in a one-to-one manner. In the present embodiment, however, a so-called column sharing configuration is adopted in which one AD conversion section 302 is provided for a plurality of predetermined columns. Accordingly, the column AD converter 300 has the vertical line selecting section 310 which selects one vertical signal line 19 for a plurality of predetermined columns. By adopting the column sharing configuration, a comparator and a counter can be shared among a plurality of columns. As a result, since the occupied area of the column AD converter 300 on a sensor chip can be reduced, there are advantages such as a reduction in manufacturing costs.

In addition, the solid state imaging device 1 includes a read current source section 24 which supplies to the unit pixel 3 an operating current (read current) for pixel signal read, a reference signal generator 27 which supplies to the column AD converter 300 a reference signal SLP_ADC for AD conversion, and an output section 28.

A driving controller 7 includes a horizontal scanning section 12 (column scanning circuit), a vertical scanning section 14 (row scanning circuit), and a communication and timing control section 20 for realizing a control circuit function for sequentially reading signals of the pixel array section 10.

Although not shown, the horizontal scanning section 12 has a horizontal address setting section, a horizontal driving section, and the like which controls the column address or column scanning and instructs the column position of data to be read at the time of a data transfer operation. Although not shown, the vertical scanning section 14 has a vertical address setting section, a vertical driving section, and the like which control the row address or row scanning. The horizontal scanning section 12 and the vertical scanning section 14 start operations (scanning) of selecting a row and a column in response to control signals CN1 and CN2 supplied from the communication and timing control section 20.

The communication and timing control section 20 includes a functional block of a timing generator (an example of a read address controller) that supplies a clock, which is synchronized with a master clock CLK0 input through a terminal 5a, to each section (scanning sections 12 and 14 or the column AD converter 300) in the device. In addition, the communication and timing control section 20 includes a functional block of a communication interface that receives the master clock CLK0 supplied from an external main controller through the terminal 5a or receives data, which commands an operation mode or the like supplied from the external main controller through a terminal 5b and that outputs data including the information on the solid state imaging device 1 to the external main controller.

For example, the communication and timing control section 20 has a clock conversion section 20a which has a function of a clock converter that generates an internal clock, a system control section 20b which has a communication function or a function of controlling each section, and the like. The clock conversion section 20a has a multiplication circuit, which generates a pulse with a higher frequency than the master clock CLK0 on the basis of the master clock CLK0 input through the terminal 5a, and generates an internal clock, such as a count clock CKcnt1 or a count clock CKdac1.

The output section 28 has a sense amplifier 28a (S·A), which detects a signal (digital data with a small amplitude) on a horizontal signal line 18 that is a signal line for data transfer (transfer wiring line), and an interface section 28b (IF section) having a function for interface between the solid state imaging device 1 and the outside. An output of the interface section 28b is connected to an output end 5c, so that the image data is output to a subsequent-stage circuit. In the output section 28, a digital operation section 29 which performs various kinds of digital processing may be provided between the sense amplifier 28a and the interface section 28b when necessary.

The unit pixel 3 is connected to the vertical scanning section 14 through a row control line 15 for line selection and connected to the AD conversion section 302, which is provided for every vertical column of the column AD converter 300, through the vertical signal line 19. Here, the row control line 15 indicates all wiring lines extending from the vertical scanning section 14 to pixels.

The vertical scanning section 14 selects a row of the pixel array section 10 and supplies a pulse necessary for the row. The vertical address setting section selects not only a row through which a signal is read (read row; also called a selection row or a signal output row) but also a row for electronic shutter and the like.

[Details of a Column AD Circuit and a Reference Signal Generator]

As an AD conversion method in the AD conversion section 302, various methods may be considered from the point of view of circuit structure, processing speed (improvements in the speed), resolution, and the like. As an example, an AD conversion method called a reference signal comparison type AD conversion method, a slope integration type AD conversion method, or a ramp signal comparison type AD conversion method is adopted. This method has a feature where the circuit size is not increased even if it is provided in parallel, since an AD converter can be realized with a simple configuration. In the reference signal comparison type AD conversion, a count operation effective period Ten (here, a count enable signal EN indicating the period) is determined on the basis of a time from the start of conversion (start of comparison processing) to the end of conversion (end of comparison processing), and a signal to be processed is converted into digital data on the basis of the clock number of the period.

The information acquired by comparison processing is pulse information with time information corresponding to the size of an analog signal (here, the pixel signal voltage Vx). In the reference signal comparison type AD conversion processing, the effective period of count processing is determined on the basis of the pulse information (time information) acquired by the comparison processing, and the count processing of changing the value at a fixed rate is performed in the effective period of the count processing. As a typical example, the least significant digit is changed by 1 at reference clock periods using a counter. The count value obtained as a result is acquired as digital data corresponding to the size of the analog signal.

Undoubtedly, any thing capable of performing count processing of changing the value at a fixed rate may be used, and various modifications may be made without being limited to the configuration which uses a counter. For example, it is possible to use an adder or an adder-subtractor and a data holding section (latch), which holds the result at reference clock periods, in order to form a cyclic count processor and to set the variation value of each time to a fixed rate (typically, 1).

When the reference signal comparison type AD conversion method is adopted, it may also be considered to provide the reference signal generator 27 for every AD conversion section 302. For example, there is a case of adopting the configuration where a comparator and a reference signal generator are provided for every AD conversion section 302 and the value of a reference signal is sequentially changed on the basis of a comparison result of the comparator by the reference signal generator of the corresponding column. In this case, however, the circuit size or the power consumption increases. Therefore, in the present embodiment, a configuration in which the reference signal generator 27 is used in common for all AD conversion sections 302 is adopted so that the reference signal SLP_ADC generated by the reference signal generator 27 is used in common by all AD conversion sections 302.

Accordingly, the reference signal generator 27 has a DA converter 270 (DAC; Digital Analog Converter) and generates the reference signal SLP_ADC of inclination (rate of change), which is indicated by control data CN4 from the communication and timing control section 20, from the initial value indicated by the control data CN4 in synchronization with the count clock CKdac1. The count clock CKdac1 may be the same as the count clock CKcnt1 for count processing of the counting section 350. It is preferable that the reference signal SLP_ADC has a waveform which has a predetermined inclination as a whole and changes linearly. The reference signal SLP_ADC may change in a smooth slope shape or may change sequentially in a stepwise manner.

In the reference signal comparison type AD conversion, the count operation effective period Ten (signal indicating the period is called the count enable signal EN) is determined on the basis of a comparison result of the reference signal SLP_ADC and the pixel signal voltage Vx using the comparison section 320, and the analog signal to be processed is converted into digital data on the basis of the clock number of the count clock CKcnt1 in a period where the count enable signal EN is active.

Processing regarding the reference level (reset level Srst) is called processing of a precharge phase (may be abbreviated to a P phase), and processing regarding the signal level Ssig is called processing of a data phase (may be abbreviated to a D phase). In the case where the D phase processing is performed after the P phase processing, the D phase processing is processing on the signal level Ssig obtained by adding the signal component Vsig to the reset level Srst.

Regarding the count operation effective period Ten, there are a first-half count method in which counting is performed until a comparison output is inverted for both P and D phases, a second-half count method in which counting is performed after a comparison output is inverted for both P and D phases, and a first-half and second-half count method in which counting is performed until a comparison output is inverted for one of the P and D phases and counting is performed after a comparison output is inverted for the other one of the P and D phases. Moreover, in each of the methods, CDS processing may be performed within columns by cleverly combining the count modes of P and D phases or controlling initial value setting at the start of P phase processing.

The applicant proposes various kinds of reference signal comparison type AD conversion methods, such as setting the count operation effective period Ten or performing the differential processing (CDS processing) within the AD conversion section 302, and basically, these methods may also be adopted in each embodiment to be described later.

In all of the processing examples, in principle, the reference signal SLP_ADC is supplied to a voltage comparator and an analog pixel signal input through the vertical signal line 19 is compared with the reference signal SLP_ADC. Then, by counting the clock number in the designated count operation effective period Ten by starting the counting in a clock signal when the count operation effective period Ten starts, AD conversion is performed.

In order to perform the reference signal comparison type AD conversion described above, each AD conversion section 302 of the column AD converter 300 in the present embodiment includes a selector 312, a comparator 322 (voltage comparator), a counter control signal generator 332 (EN generator), a count processor 351 (counter 353, temporary storage section 358), and a latch 362 (memory). Preferably, the counter 353 is made to be switchable between an up-count mode and a down-count mode.

The temporary storage section 358 (may be described as a memory in drawings) also has the same function as what is called a latch in the solid state imaging device industry. Since the temporary storage section 358 may be made to have a configuration close to a memory cell of an SRAM, it is called a temporary storage section instead of a latch in this specification.

Undoubtedly, the temporary storage section and the latch may be different components or may be interpreted as the same meaning. In this specification, a term of the temporary storage section is defined on the basis of a way of thinking that the temporary storage section and the latch are different components. Since the temporary storage section can also serve as a latch in the solid state imaging device industry, the temporary storage section is treated like being able to serve as a latch.

The comparison section 320 is formed by a group of comparators 322 of the respective AD conversion sections 302. The vertical line selecting section 310 is formed by a group of selectors 312 of the respective AD conversion sections 302. The count operation period control section 330 is formed by a group of counter control signal generators 332 of the respective AD conversion sections 302. The counting section 350 is formed by a group of count processors 352 (counters 353, temporary storage sections 358, and the like) of the respective AD conversion sections 302. The data storage section 360 is formed by a group of latches 362 of the respective AD conversion sections 302. In the present embodiment, the count processor 352 includes various functional elements in addition to the counters 353 and the temporary storage sections 358, as will be described later.

In the column AD converter 300 of the present embodiment, the count operation period control section 330 (counter control signal generator 332) is disposed between the comparison section 320 (comparator 322) and the counting section 350 (counter 353).

The comparison section 320 (comparator 322) compares the reference signal SLP_ADC generated by the reference signal generator 27 (DA converter 270) with the pixel signal voltage Vx which is obtained from the unit pixel 3 of the selected row through the vertical signal line 19 selected by the vertical line selecting section 310 (selector 312). The comparison section 320 inverts the comparison output Co (comparator output) when the reference signal SLP_ADC and the pixel signal voltage Vx are equal.

The counter control signal generator 332 of the count operation period control section 330 generates the count enable signal EN on the basis of the comparison output Co and the control information from the communication and timing control section 20 and supplies the count enable signal EN to the counter 353 to control the count operation period of the counter 353.

A control signal CN5 which designates other control information, such as reset processing or setting of the initial value Dini in the P phase count processing or whether the counter 353 operates the count processing of P and D phases in the up-count mode or down-count mode, is input from the communication and timing control section 20 to the counter 353 of each AD conversion section 302.

The reference signal SLP_ADC generated by the reference signal generator 27 is input to one input terminal (+) of the comparator 322 and input terminals (+) of the other comparators 322 in common. To the other input terminal (−) of the comparator 322, the vertical signal line 19 selected by the corresponding selector 312 is connected and the pixel signal voltage Vx from the pixel array section 10 is input separately.

The count clock CKcnt1 from the communication and timing control section 20 is input to a clock terminal CK of the counter 353 and clock terminals CK of the other counters 353 in common. When the data storage section 360 is not provided, a control pulse is input from the horizontal scanning section 12 to the counting section 350 through a control line 12c. The counting section 350 has a latch function of holding a count result and holds the counter value until there is an instruction using a control pulse through the control line 12c.

In the present embodiment, basically, the counting section 350 performs CDS processing. However, the P phase data of the reset level Srst and the D phase data of the signal level Ssig may be separately transmitted toward the output section 28, and the CDS processing may be performed by the digital operation section 29 provided after the AD conversion section 302, without being limited to the above configuration.

Components of the driving controller 7, such as the horizontal scanning section 12 and the vertical scanning section 14, are formed integrally with the pixel array section 10 in a semiconductor region, such as single crystal silicon, using the same technique as a technique for manufacturing a semiconductor integrated circuit. That is, they are formed as a so-called one chip (provided on the same semiconductor substrate). Thus, the solid state imaging device 1 according to the present embodiment is formed.

The solid state imaging device 1 may be formed as one chip in which respective sections are integrally formed in a semiconductor region as described above. However, although not shown, the solid state imaging device 1 may also be formed in the shape of a module which has an imaging function and in which not only various signal processors, such as the pixel array section 10, the driving controller 7, and the column AD converter 300, but also an optical system, such as an imaging lens, an optical low pass filter, and an infrared cut-off filter, are included.

The output side of each AD conversion section 302, for example, an output of the counter 353 may be connected to the horizontal signal line 18. Moreover, in order to make a so-called pipeline horizontal transfer possible, a configuration may be adopted in which the data storage section 360 (latch 362) as a memory device having a latch, which holds a count result acquired in the counter 353 until the count result becomes an object of horizontal transfer, is provided after the counter 353, as shown in the drawing. The data storage section 360 holds and stores the count data output from the counter section 353 at an instructed timing. The pipeline horizontal transfer means performing the column processing (AD conversion or CDS processing) and the horizontal transfer in parallel.

In the present embodiment, for example, the temporary storage section 358 is used to start counting from the AD conversion result of the dark-time signal at the start of AD conversion of a light signal, which will be described in detail later. In other words, except for this period, the temporary storage section 358 is used as a latch, that is, the temporary storage section 358 can be used for horizontal transfer. However, when a latch is not provided separately from the temporary storage section 358, a period occurs for which the latch may not be used for horizontal transfer. Accordingly, it is necessary to perform the horizontal transfer at high speed. On the other hand, if a latch is provided separately from a temporary storage section, both the latch and the temporary storage section can be separately used. Accordingly, since AD conversion and horizontal transfer can be performed in parallel, it is not necessary to perform the horizontal transfer at high speed.

The horizontal scanning section 12 has a function of a read scanning section, which reads the count value that each data storage section 360 (latch 362) holds in parallel with execution of corresponding processing of each comparison section 320 and each counter 353 of the column AD converter 300. The output of the data storage section 360 is connected to the horizontal signal line 18. The horizontal signal line 18 is a signal line with a bit width of the AD conversion section 302 or a width corresponding to twice the bit width (for example, at the time of complementary output) and is connected to the output section 28 which has the sense amplifier 28a corresponding to each output line. The number of horizontal transfer channels of the horizontal signal line 18 is not limited to one. Using a plurality of channels, data transfer may be performed for groups each of which includes a plurality of columns. In addition, a configuration is adopted in which each of the counter 353, the data storage section 360, and the horizontal signal line 18 corresponds to N bits.

<Exemplary Configuration and Basic Operation of a Unit Pixel>

Figure 2A:
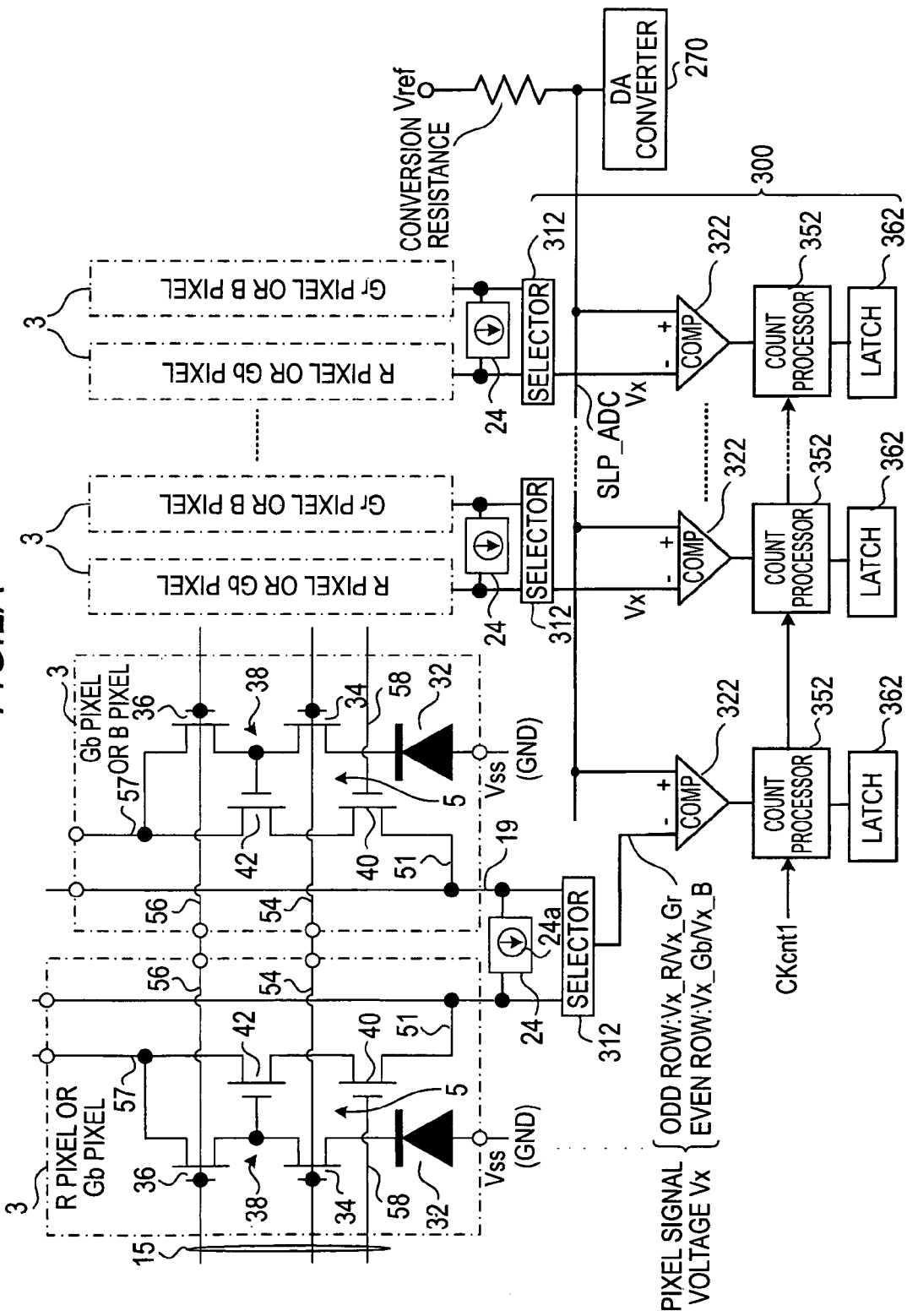
FIG. 2A is a view showing the simple circuit configuration of the solid state imaging device when AD conversion processing and CDS processing are taken into consideration.
Figure 2B:
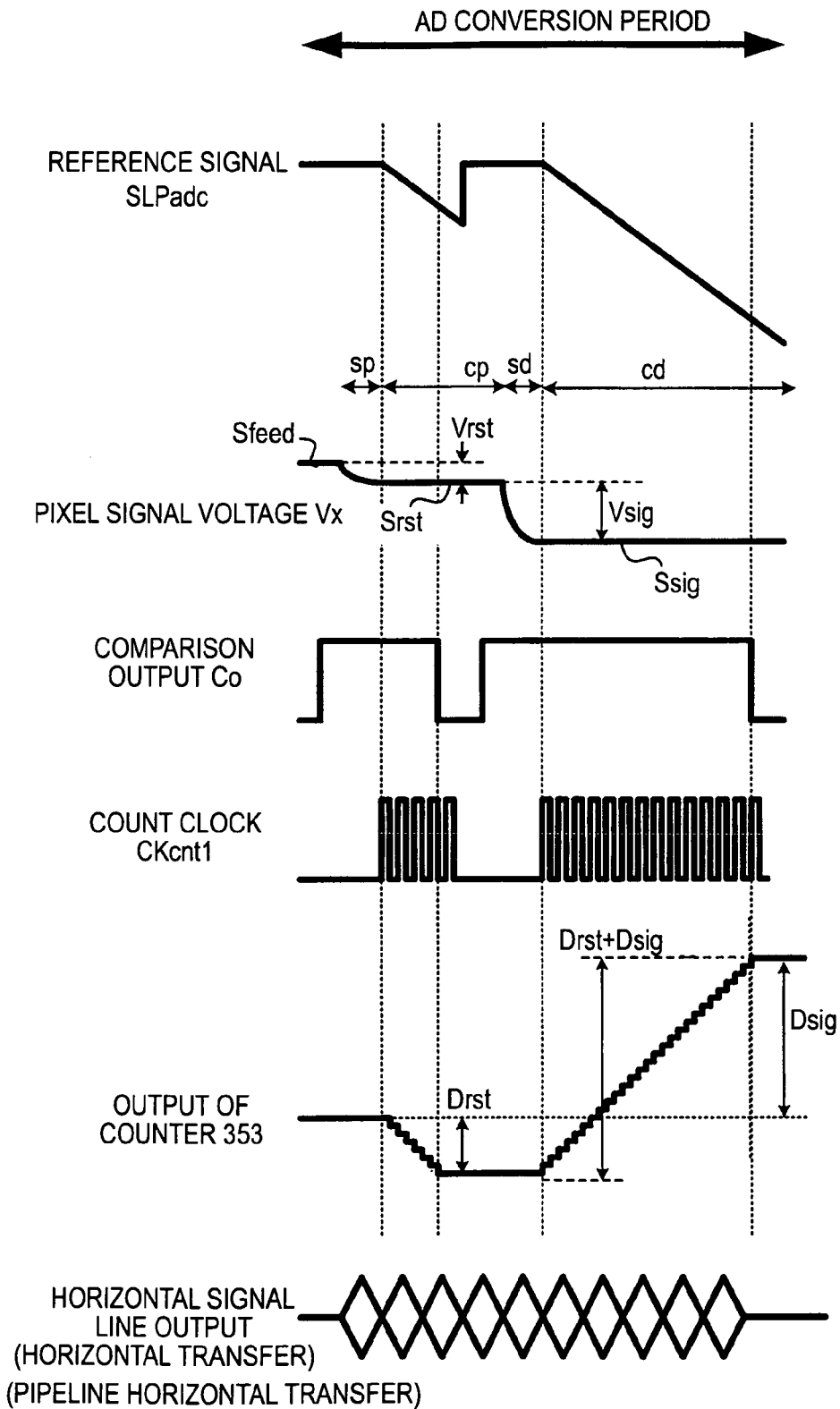
FIG. 2B is a timing chart for explaining the basis of reference signal comparison type AD conversion processing.

FIGS. 2A and 2B are explanatory views of the unit pixel 3, which is used in the solid state imaging device 1 according to the present embodiment, and its operation. Here, FIG. 2A is a view showing the simple circuit configuration of the solid state imaging device 1 when AD conversion processing and CDS processing are taken into consideration. FIG. 2B is a timing chart for explaining the basis of reference signal comparison type AD conversion processing.

As shown in FIG. 2A, first, the unit pixel 3 includes a charge generator 33. The charge generator 33 is a functional section including a photoelectric conversion element which performs photoelectric conversion of incident visible light into the amount of electric charge corresponding to the amount of light. In addition, the unit pixel 3 includes not only the charge generator 33 but also four transistors (a read selection transistor 34, a reset transistor 36, a vertical selection transistor 40, and an amplifying transistor 42) as basic components which form a pixel signal generator, as an example.

A transfer wiring line 54, a reset wiring line 56, and a vertical selection line 58 are included in the row control line 15. In the solid state imaging device 1 according to the present embodiment, these three row control lines 15 are provided in common for the unit pixels 3 of the same pixel row. In addition, the three row control lines 15 are connected to output ends corresponding to each pixel row of the vertical scanning section 14 (not shown in FIG. 2A) in units of a pixel row.

That is, in the solid state imaging device 1 according to the present embodiment, the column AD converter 300 has a column sharing configuration, and all unit pixels 3 to be shared are driven at the same timing when driving each unit pixel 3 of the pixel array section 10. This is very different from the case where each pixel to be shared is driven at separate timing, since the structure disclosed in JP-A-2007-243265 is a pixel shift structure in which driving is separately performed for each row shifted. A difference regarding whether the driving timing of the unit pixel 3 to be shared is simultaneous (present embodiment) or separate (JP-A-2007-243265) and a difference of the AD conversion processing time caused by this will be described in detail later. In the following description, the method of the present embodiment in which pixels to be shared are driven at the same timing is called a shared pixel simultaneous driving method, and a method (for example, a method disclosed in JP-A-2007-243265) in which pixels to be shared are driven at different timings is called a shared pixel separate driving method.

The read selection transistor 34 which forms a transfer section is driven by a transfer signal TRG supplied through the transfer wiring line 54. The reset transistor 36 which forms an initialization section is driven by a reset signal RST supplied through the reset wiring line 56. The vertical selection transistor 40 is driven by a vertical selection signal VSEL supplied through the vertical selection line 58.

The charge generator 32 is an example of a detection section which detects a change in physical quantity with an electric charge. The pixel signal generator 5 converts an electric charge detected by the charge generator 32 into the pixel signal voltage Vx. The read selection transistor 34 is an example of a transfer section which transfers the electric charge detected by the charge generator 32 to the pixel signal generator 5 on the basis of the input transfer control potential (transfer signal TRG). The reset transistor 36 is an example of an initialization section which initializes the electric potential of the pixel signal generator 5. This initialization operation is called a pixel reset.

The charge generator 33 is an example of a detection section formed by a light receiving element DET, such as a photodiode PD. One end (anode side) of the light receiving element DET is connected to a reference potential Vss (negative potential: for example, about −1 V) on the low potential side, and the other end (cathode side) is connected to an input end (typically, a source) of the read selection transistor 34. In addition, the reference potential Vss may be a ground potential GND. An output end (typically, a drain) of the read selection transistor 34 is connected to a connection node to which the reset transistor 36, a floating diffusion 38, and the amplifying transistor 42 are connected. A source of the reset transistor 36 is connected to the floating diffusion 38, and a drain of the reset transistor 36 is connected to a reset power supply Vrd (usually set in common with the power supply Vdd).

A drain of the vertical selection transistor 40 is connected to a source of the amplifying transistor 42, a source of the vertical selection transistor 40 is connected to a pixel line 51, and a gate (especially called a vertical selection gate SELV) of the vertical selection transistor 40 is connected to the vertical selection line 58, as an example. A gate of the amplifying transistor 42 is connected to the floating diffusion 38, a drain of the amplifying transistor 42 is connected to the power supply Vdd, and a source of the amplifying transistor 42 is connected to the pixel line 51 through the vertical selection transistor 40 and is also connected to the vertical signal line 19. In addition, the present invention is not limited to such a connection configuration. The vertical selection transistor 40 and the amplifying transistor 42 may be disposed inversely. For example, a configuration may also be adopted in which the drain of the vertical selection transistor 40 is connected to the power supply Vdd, the source of the vertical selection transistor 40 is connected to the drain of the amplifying transistor 42, and the source of the amplifying transistor 42 is connected to the pixel line 51.

One end of the vertical signal line 19 extends to the column AD conversion section 300, and the read current source section 24 is connected in the path. Although not shown in detail, the read current source section 24 has a load MOS transistor in each vertical column. Gates are connected between a reference current source section and a transistor to thereby form a current mirror circuit which functions as a current source 24a for the vertical signal line 19. In addition, a source follower configuration in which an approximately constant operating current (read current) is supplied may be adopted between the read current source section 24 and the amplifying transistor 42.

Between the vertical signal line 19 of each column and the column AD converter 300 including the AD conversion section 302 based on the column sharing method, the vertical line selecting section 310 including the selector 312 which selects one of the plurality of columns and connects it to the one corresponding AD conversion section 302 is provided. An output end of the selector 312 is connected to one terminal (in this example, an inverting input end) of the comparator 322. Accordingly, the pixel signal voltage Vx is selectively supplied to the AD conversion section 302 of the column AD converter 300 through the vertical signal line 19 for every unit pixels 3 of M columns.

In the AD conversion section 302, the pixel signal voltage Vx read from the unit pixel 3 to the vertical signal line 19 is compared with the reference signal SLP_ADC using the comparator 322 of the AD conversion section 302. Then; the counter control signal generator 332 (not shown) converts the pixel signal voltage Vx of the vertical signal line 19 into digital data by operating the counter 353 on the basis of the count enable signal EN and changing the reference signal potential while making it correspond to the count operation in a one-to-one manner.

For example, FIG. 2B shows an example of adopting a method in which CDS processing is also completed within columns by setting the count operation effective period Ten on the basis of a first-half count method and setting the count mode differently for differential processing of P and D phases.

In the P phase processing period which is an AD conversion period regarding the reset level Srst, the count value of each flip-flop of the count processor 352 is reset to the initial value "0". The count processor 352 is set to a down-count mode and comparison processing of the reference signal SLP_ADC and the P phase level of the pixel signal voltage Vx, which is performed by the comparator 322, and count processing of the count processor 352 using the count clock CKcnt1 are executed in parallel to thereby perform AD conversion of P phase level. As a result, a count value indicating the digital value (reset data) Drst corresponding to the size of the reset level Srst (indicating −Drst when a sign is taken into consideration) is held in the count processor 352.

In the D phase processing period which is an AD conversion period regarding the signal level Ssig, the signal component Vsig corresponding to the amount of incident light for every unit pixel 3 is read in addition to the reset level Srst, and the same operation as reading of the P phase is performed. The count processor 352 is set to an up-count mode on the contrary to the P phase processing. Comparison processing of the reference signal SLP_ADC and the D phase level of the pixel signal voltage Vx, which is performed by the comparator 322, and count processing of the count processor 352 are executed in parallel to thereby perform AD conversion of D phase level.

In this case, an up-count operation is performed using the digital value (reset data) Drst of the reset level Srst of the pixel signal voltage Vx, which is acquired at the time of reading and AD conversion of a P phase, as a start point, on the contrary to the P phase. Since the signal level Ssig, is a level obtained by adding the signal component Vsig to the reset level Srst, the count value of AD conversion result of the signal level Ssig is basically "Drst+Dsig". However, since the start point in the up-count operation is "−Drst" which is an AD conversion result of the reset level Srst, the count value which is actually held in the count processor 352 is "−Drst+(Dsig+Drst)=Dsig".

That is, in this example, different count modes are set like setting the down-count mode for P phase processing and the up-count mode for D phase processing. Accordingly, differential processing between the count number "−Drst", which is an AD conversion result of the reset level Srst, and the count number "Drst+Dsig", which is an AD conversion result of the signal level Ssig, is automatically performed within the count processor 352. The count number Dsig corresponding to the differential processing result is held in the count processor 352. The count number Dsig held in the count processor 352 corresponding to the differential processing result indicates signal data corresponding to the signal component Vsig.

By the differential processing in the count processor 352 based on two signal read and count processing, it is possible to remove the reset level Srst including a variation for every unit pixel 3. Accordingly, an AD conversion result of only the signal component Vsig corresponding to the amount of incident light for every unit pixel 3 can be acquired with a simple configuration. Therefore, the AD conversion section 302 operates not only as a digital converter, which converts an analog pixel signal into digital pixel data, but also as a section which has a function of CDS processing.

Here, a signal charge generated in the charge generator 32 after a pixel reset is transferred to the floating diffusion 38 by turning on the vertical selection transistor 40 for the unit pixel 3 to be read, such that the signal potential corresponding to a light receiving signal appears in the vertical signal line 19. As a basic electrical potential change of the vertical signal line 19 at the time of these series of operations, for example, the signal level Ssig (light receiving signal) appears after the reset level Srst (dark-time signal) as shown in FIG. 2B.

As also can be seen from the drawing, it is necessary to start count processing after each level is stabilized in order to perform AD conversion of each level in the P phase processing period or the D phase processing period. For example, a predetermined time (called a dark-time signal settling period sp) is necessary until the reset level Srst output as the pixel signal voltage Vx is stabilized by performing a pixel reset. In addition, it is necessary to complete AD conversion processing of the P phase within a period for which the reset level Srst is stable (called a dark-time signal countable period cp). Similarly, a predetermined time (called a light receiving signal settling period sd) is also necessary until the signal level Ssig output as the pixel signal voltage Vx is stabilized by performing charge transfer. In addition, it is necessary to complete AD conversion processing of the P phase within a period for which the signal level Ssig is stable (called a light receiving signal countable period cd).

In a configuration where one AD conversion section 302 is not shared between a plurality of columns, such a response is predicted to determine a timing of AD conversion processing. On the other hand, in a configuration where one AD conversion section 302 is shared between a plurality of columns, the settling period becomes a problem when acquiring all digital data to be shared within one horizontal period. In the AD conversion processing of the present embodiment to be described later, processing is performed in consideration of this point.

Column Signal Processing

First Embodiment—All Pixel Readout

First Example

Two Column Sharing & Monochrome

Figure 3A:
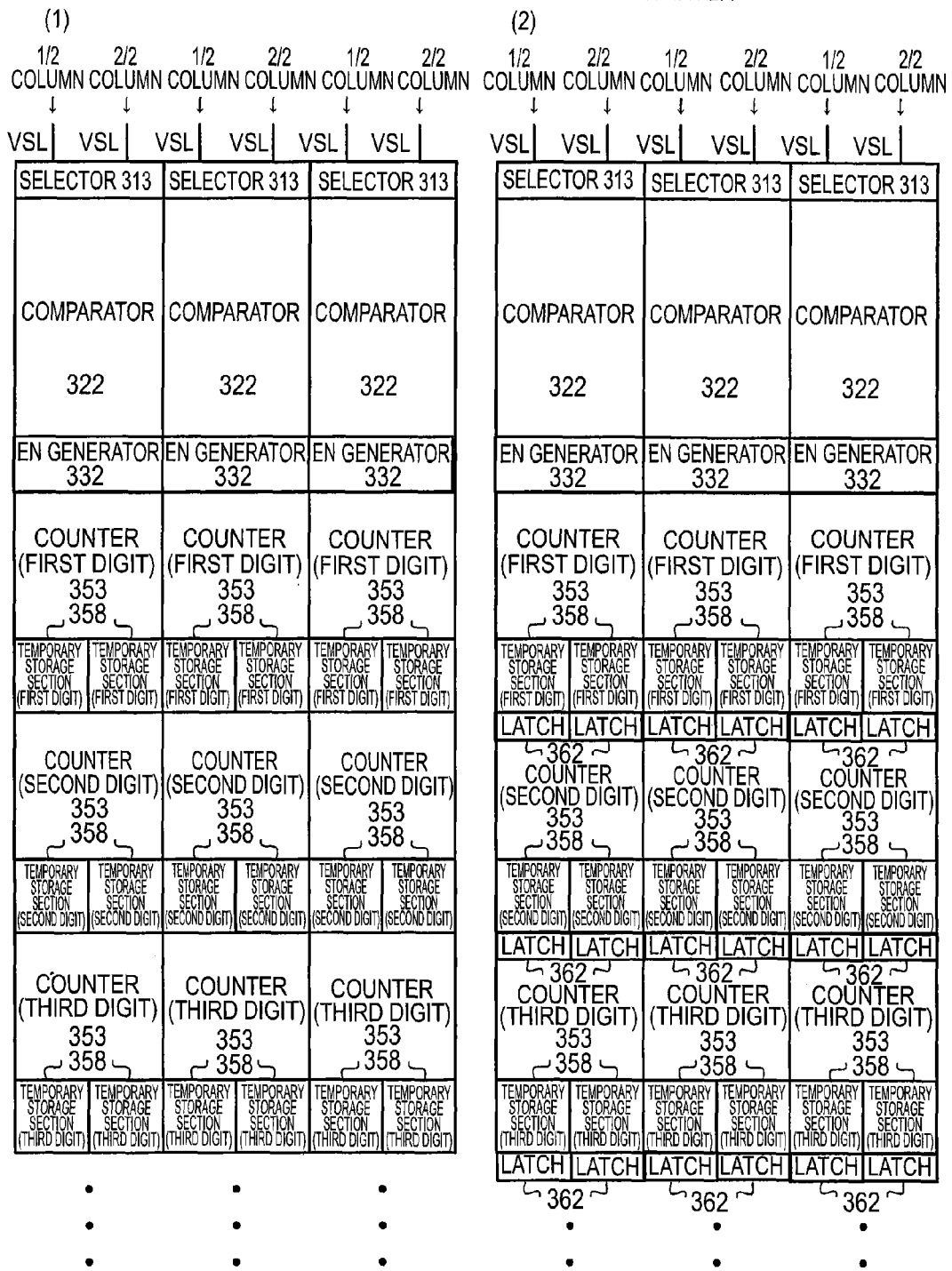
FIG. 3A is a view for explaining a first embodiment (first example) of column signal processing.

FIG. 3A is a view for explaining a first embodiment (first example) of column signal processing (AD conversion processing and CDS processing: the same hereinbelow unless there is a special notice). The first embodiment is different from other embodiments, which will be described later, in that all pixel readout is performed.

Here, a column AD converter 300AA of the first embodiment (first example) is an example of the configuration, in which one AD conversion section 302AA is shared between two columns (two vertical signal lines 19: also called pixel columns), when the solid state imaging device 1 is for monochrome imaging. Moreover, as signal processing, a case where all pixel readout is performed is shown. A group of an odd column and an even column adjacent thereto will be described as two columns to be shared.

As shown in (1) in FIG. 3A, each AD conversion section 302AA has a "2 input-1 output" type selector 312 (called a two-input selector 313) which selects one from the vertical signal lines 19 of two columns ((2n−1)-th column and (2n)-th column: n is a positive integer of 1 or more). After the two-input selector 313, the comparator 322, the counter control signal generator 332, the counter 353, and the temporary storage section 358 are disposed in order.

Regarding the counter 353 and the temporary storage section 358, the counter 353 and the pair of temporary storage sections 358 are provided for every digit so as to correspond to each digit of N bits.

In (1) in FIG. 3A, one counter 353 is shared between two columns, but the temporary storage section 358 is provided corresponding to each of (2n−1)-th and (2n)-th columns. One (first memory) of the temporary storage section 358 is described as a temporary storage section 358_1, and the other (second memory) is described as a temporary storage section 358_2. For example, the count data of the (2n−1)-th column is stored in the temporary storage section 358_1, and the count data of the (2n)-th column is stored in the temporary storage section 358_2. For example, the counter 353 is provided corresponding to 13 digits so as to be shared between two columns, and the temporary storage sections 358_1 and 358_2 are provided in each column in numbers equal to the number of counters (in this example, 13 counters).

Although the detailed explanation will be given later, at the time of all pixel readout, the count data of the counter 353 is temporarily stored in the temporary storage section 358 of the corresponding column after P phase processing ends for every column, the count data temporarily stored in the temporary storage section 358 is read (rewritten) before D phase processing of the corresponding column, and D phase processing is started from the rewritten count data. This configuration is a configuration capable of completing CDS processing by the AD conversion section 302AA for every column.

On the other hand, (2) in FIG. 3A shows an example of the configuration corresponding to pipeline horizontal transfer. Here, the latch 362 is further provided after the count processor 352 (counter 353) for every column. The latch 362 is provided corresponding to each of (2n−1)-th and (2n)-th columns. For example, the latch 362 is provided in each column in numbers equal to the number of counters (in this example, 13 counters). One of the latches 362 is described as a latch 362_1, and the other one is described as a latch 362_2. For example, the count data of the (2n−1)-th column is stored in the latch 362_1, and the count data of the (2n)-th column is stored in the latch 362_2.

For every column, the count data of the counter 353 is stored in the latch 362 of the corresponding column after D phase processing ends (CDS processing is completed). Then, at a corresponding read timing in horizontal transfer, the stored count data is output to the horizontal signal line 18.

Moreover, in (2) in FIG. 3A, if the count data of P phase processing stored in the temporary storage section 358 of the corresponding column is not read (rewritten) before D phase processing, the data stored in the latch 362 becomes count data which has not been subjected to CDS processing. In this case, in the pipeline horizontal transfer, both a P phase processing result stored in the temporary storage section 358 and a D phase processing result stored in the latch 362 are transmitted to the digital operation section 29, and the digital operation section 29 performs the CDS processing. The temporary storage section 358 in this case has only the same function as the latch 362 for pipeline horizontal transfer. This is advantageous in that control of the initial value becomes easy because it is not necessary to provide a rewrite circuit in the column AD converter 300.

Although not shown in FIG. 3A, in the AD conversion section 302AA, a circuit for exchange of data or a horizontal transfer driver is provided between the counter 353 and the latch 362 for every two columns corresponding to the number of digits, in addition to those described above.

Example of the Configuration of a Two-Input Selector

Figure 3B:
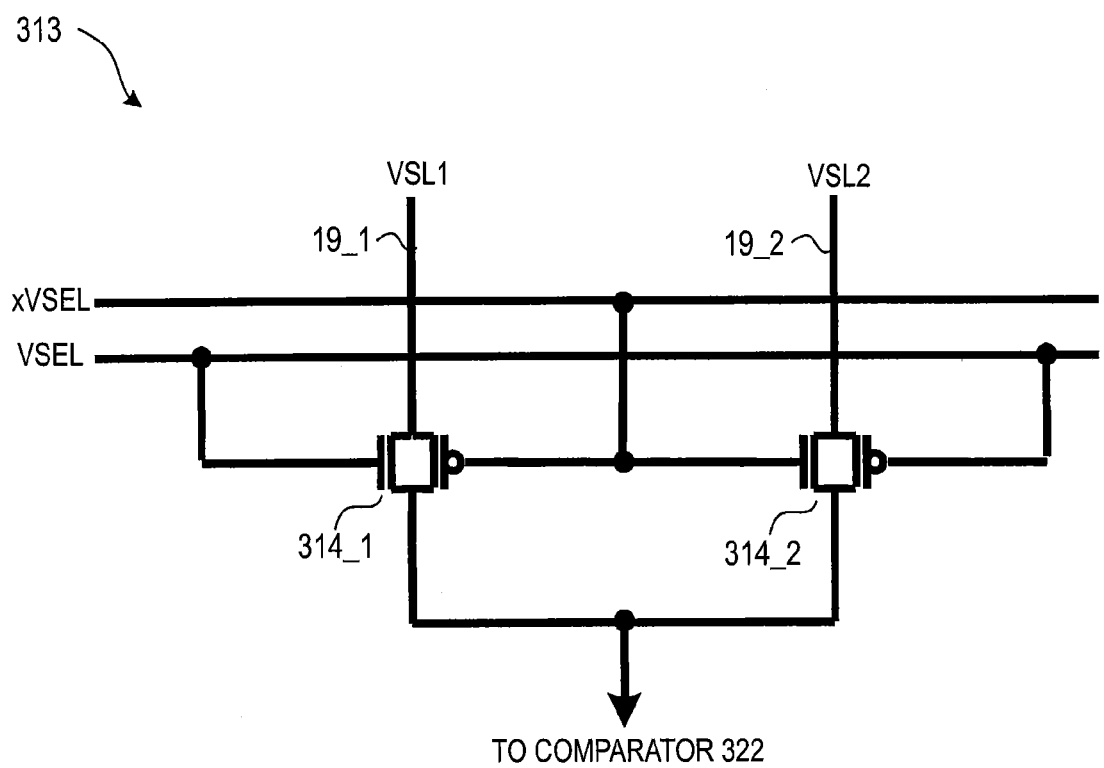
FIG. 3B is a view showing an example of the configuration of a two-input selector.

FIG. 3B is a view showing an example of the configuration of the two-input selector 313. In the two-input selector 313, two CMOS switches 314 (complementary switches) are connected in parallel to each other. In one two-input selector 313, four transistors are used. The height direction when the two-input selector 313 is disposed is usually 15 μm or less.

In the two-input selector 313, gates of pMOS and nMOS are mutually connected between the CMOS switches 314. A pair of select signals VSEL and xVSEL which are complementary to each other are input to the two-input selector 313 in common. Alternatively, one select signal may be logic-inverted to generate the other select signal.

The CMOS switch 314 is a transfer gate with a CMOS structure serving as an analog switch in which an nMOS and a pMOS are connected in parallel in the CMOS form. This transfer gate with a CMOS structure is obtained by connecting the nMOS and the pMOS in parallel to each other in the complementary connection form. Especially the transfer gate with a CMOS structure is also called a transmission gate or a transmission switch.

An input end of one CMOS switch 314_1 is connected to the vertical signal line 19_1 of an odd column, and an input end of the other CMOS switch 314_2 is connected to the vertical signal line 19_2 of an even column. Output ends of the CMOS switches 314_1 and 314_2 are mutually connected to an input end (in this example, non-inverting input end) of the comparator 322 (not shown).

The vertical signal line 19_1 of the odd column is selected at the time of select signal VSEL=H and xVSEL=L, and the vertical signal line 192 of the even column is selected at the time of select signal VSEL=L and xVSEL=H.

In addition, the configuration of the two-input selector 313 shown here is only an example, and various modifications may also be made. For example, in the CMOS switches 314_1 and 314_2, gates of nMOS and pMOS may be controlled by one pair of select signals VSEL and xVSEL which are complementary to each other.

Example of the Configuration of a Count Processor: Two Column Sharing

Figure 4B:
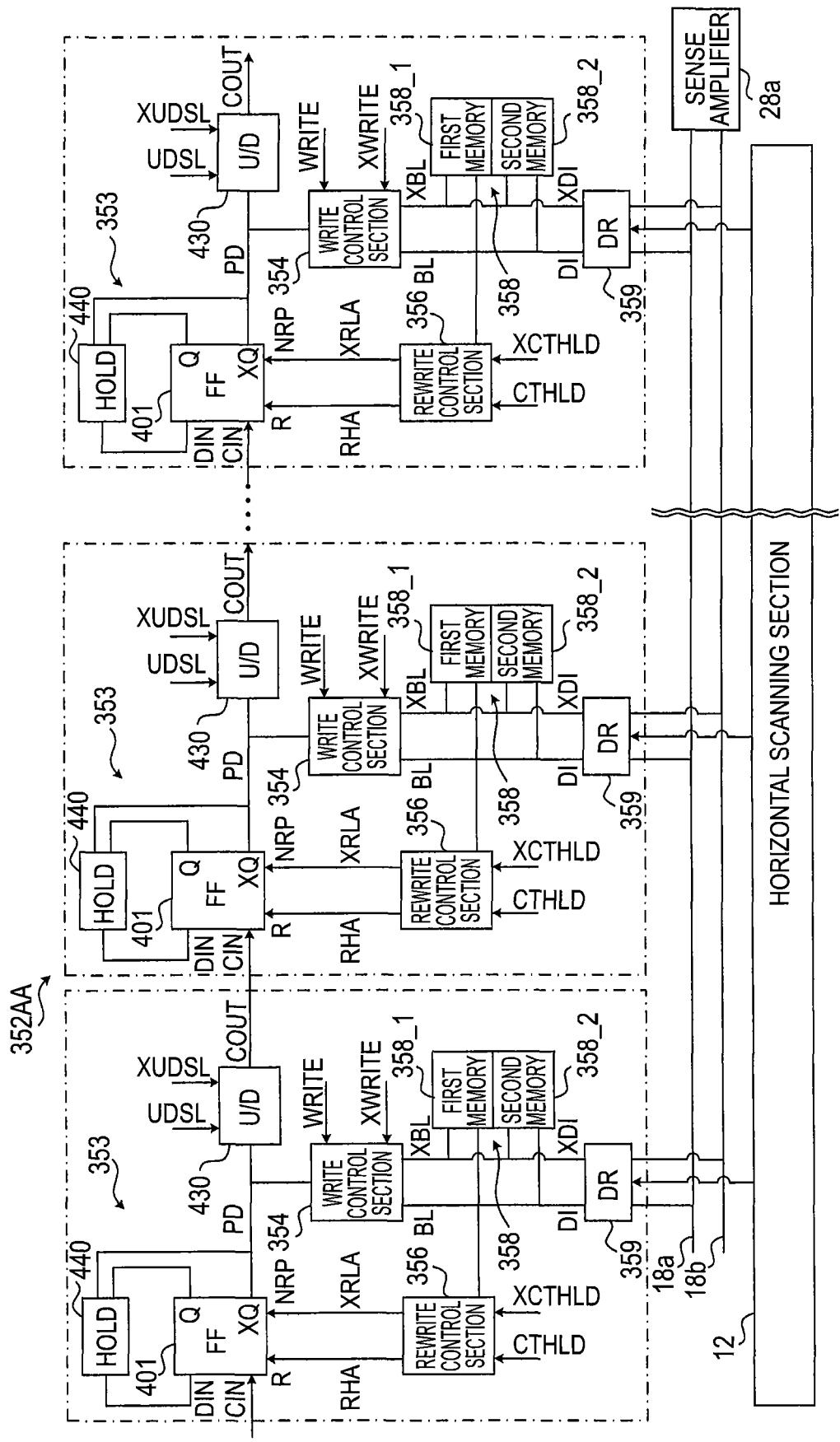
FIG. 4B is a view showing an example of the configuration of the outline around a count processor.
Figure 4C:
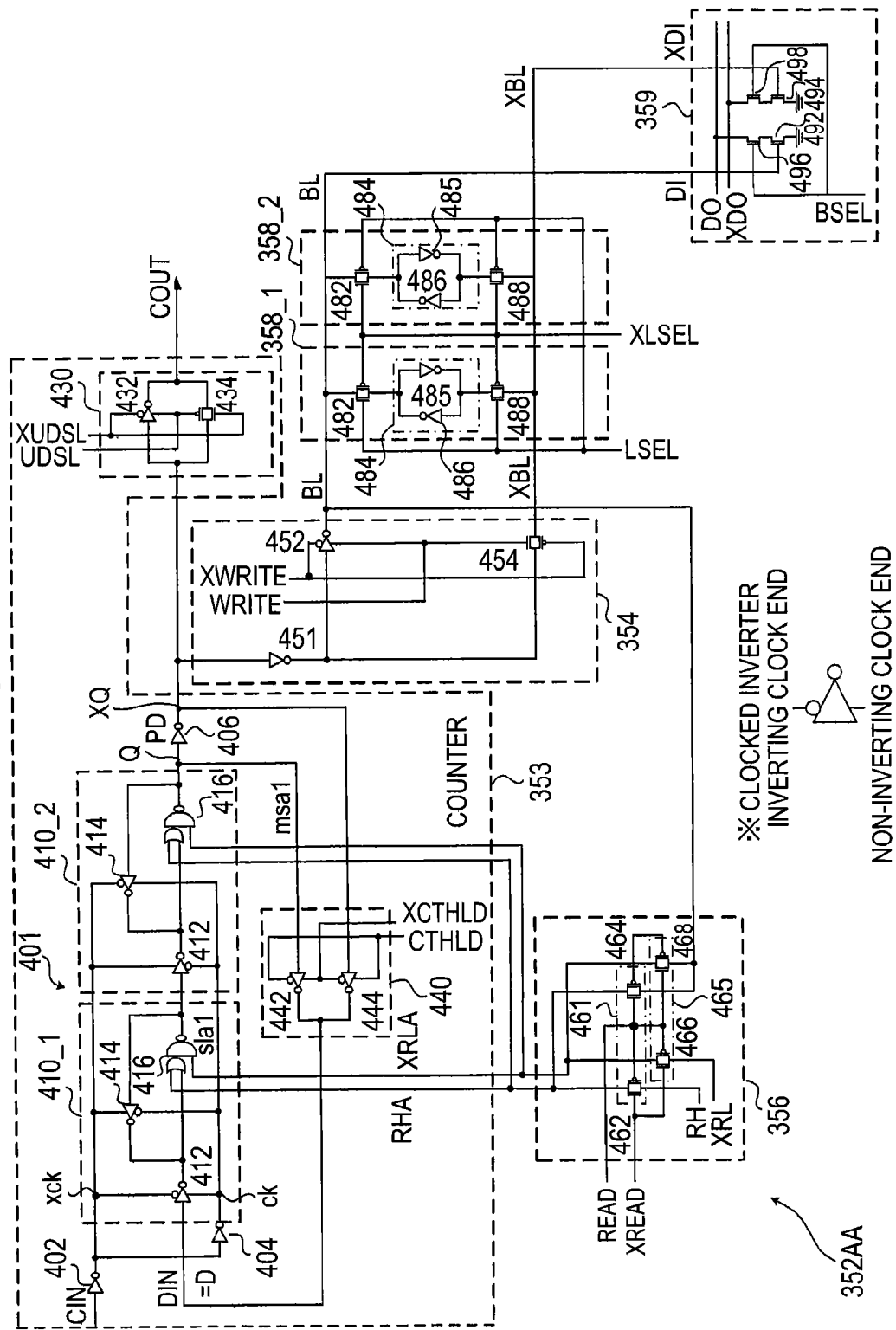
FIG. 4C is a view showing an example of the detailed circuit configuration of one digit of two columns.

FIGS. 4A to 4C are views for explaining an example of the configuration of the counter 353, the temporary storage section 358, and perimeter circuits thereof which are used for the AD conversion section 302AA in the first embodiment (first example). Here, FIG. 4A shows the outline of one digit of two columns, and FIG. 4C shows an example of the detailed circuit configuration. FIG. 4B shows an example of the configuration of the outline (equivalent to 13 bits) around a counting section.

As shown in (1) in FIG. 4A, the count processor 352AA has the counter 353, a write control section 354, a rewrite control section 356, the temporary storage section 358 (first and second memories), and a horizontal transfer driver 359 for every AD conversion section 302AA. In addition, (1) in FIG. 4A shows a schematic circuit, and it is not a layout image. A block diagram of a circuit corresponding to one digit of the count processor 352AA is shown in (2) in FIG. 4A.

As shown in FIG. 4B, as a basic configuration of the count processor 352AA corresponding to two columns (shared between two columns), a configuration of an asynchronous counter is adopted in which D flip-flops (FF) (D flip-flops 401) are cascade-connected by N (=13) bits and the count output of a preceding stage is input to a subsequent clock input end. The count clock CKcnt1 is supplied to a clock input end CIN of a D flip-flop 401_1 at the first stage. The write control section 354, the rewrite control section 356, the temporary storage sections 358_1 and 358_2, and the horizontal transfer driver 359 are provided for the D flip-flop 401 at each stage.

As a feature of the present embodiment, the counter 353 includes a separately controllable switching-time data holding section 440 (HOLD) of the D flip-flop 401, which has a hold function for an inverted output XQ of each D flip-flop 401, when returning the inverted output XQ to a data input end DIN. The inverted output XQ of the D flip-flop 401 is supplied to the write control section 354.

In addition, a count mode switching section 430 (U/D) which switches the count mode between the up-count mode and the down-count mode is provided between stages. By providing the count mode switching section 430 between stages, switching between the up-count mode and the down-count mode is possible by switching inversion/non-inversion of the count output (inverted output XQ) at the preceding stage. The output of the count mode switching section 430 becomes a digit output (bit output: a logical output COUT) and is then supplied as a clock input to the next stage.

The output of the write control section 354 is supplied to the data input/output end of the temporary storage section 358 or the rewrite control section 356 or the horizontal transfer driver 359 (DR). Although the logical output COUT is single end data, it becomes complementary data BL and XBL (differential signals) after passing through the write control section 354. As a result, the temporary storage section 358 and the horizontal transfer driver 359 treat the complementary data. Only one (for example, complementary data BL) of the complementary data BL and XBL of the rewrite control section 356 is supplied to the rewrite control section 356. The horizontal transfer driver 359 drives a complementary (differential) type horizontal transfer channel (two horizontal signal lines 18a and 18b). In this case, the sense amplifier 28a reproduces data using a differential amplifying circuit.

Specifically, the count processor 352 has 13 D flip-flops 401 so as to correspond to 13 bits. In addition, the count processor 352 has the switching-time data holding section 440 between an inverting output end XQ and a data input end DIN of the D flip-flop 401. Each switching-time data holding section 440 is controlled by separate control signals CTHLD and XCTHLD.

The switching-time data holding section 440 has a function of holding the count output of the D flip-flop 401 at the time of count mode switching of the count mode switching section 430. The specific structure will be described in detail when explaining the configuration of the switching-time data holding section 440.

To a reset end R of each D flip-flop 401, a control signal RHA from the rewrite control section 356 is input in common. To a preset end XPR of each D flip-flop 401, a control signal XRLA from the rewrite control section 356 is input in common. For example, when the control signal RHA is at active H and the control signal XRLA is at inactive H, the D flip-flop 401 initializes (resets) a non-inverting output Q to an L level and an inverting output XQ to an H level. That is, the non-inverting output Q and the inverting output XQ of the D flip-flop 401 are set to a reset level. For example, when the control signal XRLA is at active L (control signal RHA does not matter), the D flip-flop 401 initializes (presets) the non-inverting output Q to an H level and the inverting output XQ to an L level. That is, the non-inverting output Q and the inverting output XQ of the D flip-flop 401 are set to a preset level.

In addition, the count processor 352AA has the count mode switching section 430, which switches the count mode between the up-count mode and the down-count mode, after the inverting output end XQ of the each D flip-flop 401. The count mode switching section 430 performs switching regarding whether to output the data of the inverting output end XQ of the preceding D flip-flop 401 as it is or to output the data after inverting the data on the basis of control signals UDSL and XUDSL. For example, the count mode switching section 430 performs switching between inversion and non-inversion of the data of the inverting output end XQ of the D flip-flop 401 such that the count processor 352 performs an up-count operation when the control signals are UDSL=H and XUDSL=L and the count processor 352 performs a down-count operation when the control signals are UDSL=L and XUDSL=H.

An example of the configuration of each section will be described with reference to a circuit diagram shown in FIG. 4B and a detail circuit diagram shown in FIG. 4C. The counter 353 has inverters 402, 404, and 406, two-stage flip-flops 410_1 and 410_2, the count mode switching section 430, and the switching-time data holding section 440. An input of the inverter 402 is the clock input end CIN of the D flip-flop 401.

Each flip-flop 410 has clocked inverters 412 and 414 and a composite gate 416 (in the drawing, an OR gate and a NAND gate are combined). The inverters 402, 404, and 406 and the flip-flops 410_1 and 410_2 form the D flip-flop 401.

In the composite gate 416, a first input end (force_low: one input end of an OR gate shown in the drawing) functions as a reset end R of the D flip-flop 401, a second input end (other input end of the OR gate shown in the drawing) functions as a main input end, and a third input end (x_force_high: one input end of a NAND gate shown in the drawing) functions as a preset end PR of the D flip-flop 401.

When the third input end (x_force_high) of the composite gate 416 is L, an output end of the composite gate 416 is H regardless of the logic of the first input end (force_low) and the second input end (main input end). This state is a state where the D flip-flop 401 is preset. When both the third input end (x_force_high) and the first input end (force_low) of the composite gate 416 are H, the output end is L regardless of the logic of the second input end (main input end). This state is a state where the D flip-flop 401 is reset. When the third input end (x_force_high) of the composite gate 416 is H and the first input end (force_low) is L, the logic of the second input end (main input end) is inverted and output to the output end. This state is a state where the D flip-flop 401 is used for normal operation.

In the clocked inverters 412 and 414, when an H level is input to an inverting clock end and an L level is input to a non-inverting clock end, the output end has a high impedance to block data transfer. On the other hand, when an L level is input to the inverting clock end and an H level is input to the non-inverting clock end, the data input to the input end is inverted and output.

Output ends of the two clocked inverters 412 and 414 are mutually connected to the first input end of the composite gate 416. The output end of the composite gate 416 serves as an output end of the flip-flop 410 and is connected to the input end of the clocked inverter 414.

In the flip-flops 410_1 and 410_2, the non-inverting clock end of the clocked inverter 412 and the inverting clock end of the clocked inverter 414 are the non-inverting clock input end ck, and the inverting clock end of the clocked inverter 412 and the non-inverting clock end of the clocked inverter 414 are the inverting clock input end xck. Moreover, in the flip-flops 410_1 and 410_2, the input end of the clocked inverter 412 is a data input end D and the output end of the composite gate 416 is a non-inverting output end Q. In addition, the data input end D of the clocked inverter 412 of the flip-flop 410_1 also serves as the data input end DIN of the D flip-flop 401.

The control signal RHA (active H) from the rewrite control section 356 is supplied to the reset end R of the flip-flops 410_1 and 410_2, and the control signal XRLA (active L) from the rewrite control section 356 is supplied to the preset end XPR of the flip-flops 410_1 and 410_2. The control signals RHA and XRLA are used to initialize the flip-flops 410_1 and 410_2. Moreover, in the flip-flops 410_1 and 410_2, writing of data is possible by using the reset end R and the preset end XPR.

A counting result before one digit is supplied to clock input ends CK and XCK of the flip-flops 410_1 and 410_2 as clock inputs. A non-inverting output Q_1 of the first-stage flip-flop 410_1 is supplied to a data input end DIN_2 of the second-stage flip-flop 410_2. A non-inverting output Q_2 of the second-stage flip-flop 410_2 is supplied to a data input end DIN_1 of the first-stage flip-flop 410_1 after logic inversion through the switching-time data holding section 440. Thus, since a counting result before one digit is supplied to each of the clock input ends CK and XCK as a clock input, the flip-flops 410_1 and 410_2 repeat an operation of delaying the non-inverting output Q_2 of the flip-flop 410_2 (that is, the logical output COUT of the counter 353) by a half clock and then inverting it to thereby perform a frequency dividing operation.

For example, data (logical output COUT) before one digit is supplied to the clock input end CIN (input of the inverter 402), and the output is supplied to the inverting clock input end XCK of the first-stage flip-flop 410_1 and the non-inverting clock input end CK of the second-stage flip-flop 410_2. The output of the inverter 402 is supplied to the inverter 404, and the output is supplied to the non-inverting clock input end CK of the first-stage flip-flop 410_1 and the inverting clock input end XCK of the second-stage flip-flop 410_2.

That is, as shown in FIG. 4C, the output of the inverter 402 is supplied in common to an inverting clock end of the clocked inverter 412 and a non-inverting clock end of the clocked inverter 414 of the first-stage flip-flop 410_1 and a non-inverting clock end of the clocked inverter 412 and an inverting clock end of the clocked inverter 414 of the second-stage flip-flop 410_2.

In addition, the output of the inverter 402 is supplied to the inverter 404, and the output is supplied in common to a non-inverting clock end of the clocked inverter 412 and an inverting clock end of the clocked inverter 414 of the first-stage flip-flop 410_1 and an inverting clock end of the clocked inverter 412 and a non-inverting clock end of the clocked inverter 414 of the second-stage flip-flop 410_2.

An output of the composite gate 416 of the first-stage flip-flop 410_1 is input to the clocked inverter 412 of the second-stage flip-flop 410_2. An output of the composite gate 416 of the second-stage flip-flop 410_1 is input to the inverter 406 and the switching-time data holding section 440. An output of the switching-time data holding section 440 is input to the clocked inverter 412 of the first-stage flip-flop 410_1.

The count mode switching section 430 is provided after the inverter 406. The count mode switching section 430 is a functional section which performs control regarding whether to operate the counter 353 in the up-count mode or in the down-count mode. The count mode switching section 430 has a clocked inverter 432 and a CMOS switch 434 (formed by a pMOS and an nMOS) which is the same as the CMOS switch 314. Input ends of the clocked inverter 432 and the CMOS switch 314 are mutually connected, and the output (=inverted output XQ_2 of the flip-flop 410_2) of the inverter 406 is supplied.

Output ends of the clocked inverter 432 and the CMOS switch 314 are mutually connected to make the logical output COUT of the counter 353. The logical output COUT of the counter 353 of a certain digit becomes the data. CIN of the counter 353 of the next digit to the inverter 402. Such a connection is repeated. For example, it continues until the thirteenth digit.

The control signal UDSL is supplied to a non-inverting clock end of the clocked inverter 432 and a gate of the pMOS of the CMOS switch 434 in common, and the control signal xUDSL is supplied to an inverting clock end of the clocked inverter 432 and a gate of the nMOS of the CMOS switch 434 in common.

The states of the control signals UDSL and xUDSL when writing the data of the counter 353 into the temporary storage section 358 are the same as those of the control signals UDSL and xUDSL when rewriting (reading) the data held in the temporary storage section 358 (data temporarily stored is also included) into the counter 353. For example, UDSL=H and xUDSL=L are set both when writing the data from the counter 353 into the temporary storage section 358 and when reading the data from the temporary storage section 358 into the counter 353.

When the control signals are UDSL=H and xUDSL=L (up-count mode), only the clocked inverter 432 is turned on so that the data (=non-inverting output Q_2 of the flip-flop 410_2) obtained by inverting the data of the inverter 406 is clock-input to the next digit. When the control signals are UDSL=L and xUDSL=H (down-count mode), only the CMOS switch 434 is turned on so that the data (=inverting output XQ_2 of the flip-flop 410_2) is clock-input to the next digit as it is. For example, in an example of operation to be described later, the up-count mode is used at the time of D phase processing for AD conversion of a light receiving signal (signal level Vsig) and the down-count mode is used when performing AD conversion of a dark-time signal (reset level Vrst).

The switching-time data holding section 440 has two clocked inverters 442 and 444. The non-inverting output Q_2 (output of the composite gate 416) of the second-stage flip-flop 410_2 is supplied to the clocked inverter 442, and the data (=inverted output XQ_2 of the flip-flop 410_2) obtained by inverting the non-inverting output Q_2 with the inverter 406 is supplied to the clocked inverter 444. Output ends of the two clocked inverters 442 and 444 are mutually connected to the data input end DIN_1 (input end of the clocked inverter 412) of the first-stage flip-flop 410_1.

The control signal CTHLD is supplied to an inverting clock end of the clocked inverter 442 and a non-inverting clock end of the clocked inverter 444 in common, and the control signal xCTHLD is supplied to a non-inverting clock end of the clocked inverter 442 and an inverting clock end of the clocked inverter 444 in common.

When performing Switching between the up-count mode and the down-count mode using the count mode switching section 430, the control signals are set as CTHLD=H and xCTHLD=L so that the stored content of the counter 353 does not change. In other cases, the control signals are set as CTHLD=L and xCTHLD=H so that the storage state can change.

That is, by setting the control signals to CTHLD=H and xCTHLD=L at the time of count mode switching, the switching-time data holding section 440 turns on only the clocked inverter 444 to supply the non-inverting output Q2 of the flip-flop 410_2 to the data input end DIN_1 of the flip-flop 410_1 and holds the stored content of the counter 353. On the other hand, by setting the control signals to CTHLD=L and xCTHLD=H at the time of normal operation, the switching-time data holding section 440 turns on only the clocked inverter 442 to supply the inverting output XQ_2 of the flip-flop 410_2 to the data input end DIN_1 of the flip-flop 410_1 so that the frequency division operation becomes possible.

The non-inverting output XQ (output PD of the inverter 406) of the D flip-flop 401 is supplied to the count mode switching section 430 and the write control section 354. The write control section 354 is a functional section which performs control of temporarily storing the count data of the counter 353 in the temporary storage section 358. For example, the write control section 354 writes the content of the counter 353 in the selected temporary storage section 358.

Preferably, a transistor which forms the write control section 354 is made to have high driving performance so that the stored content of the temporary storage section 358 can be rewritten. In order to do so, it is preferable to make the gate length the shortest possible within the rules and to increase the gate width, for example.

The write control section 354 has an inverter 451, a clocked inverter 452, and a CMOS switch 454 (formed by a pMOS and an nMOS) which is the same as the CMOS switch 314. An output of the inverter 451 is input to the clocked inverter 452 and the CMOS switch 454 in common. A control signal WRITE is supplied to a non-inverting clock end of the clocked inverter 452 and a gate of the nMOS of the CMOS switch 454 in common, and a control signal XWRITE is supplied to an inverting clock end of the clocked inverter 452 and a gate of the pMOS of the CMOS switch 454 in common.

When the control signals are WRITE=H and xWRITE=L, the clocked inverter 452 and the CMOS switch 454 are turned on to write the count data of the counter 353 into the temporary storage section 358. In this case, the data of the inverter 451 is inverted by the clocked inverter 452 (=logical output (COUT) of the counter 353) and becomes one (non-inverted) input signal BL supplied to the selected temporary storage section 358 or the selected horizontal transfer driver 359.

At the same time, the data of the inverter 451 becomes the other (inverted) input signal XBL through the CMOS switch 454, which is supplied to the selected temporary storage section 358 or the selected horizontal transfer driver 359. As a result, the data is written from both the input and output ends of the temporary storage section 358 which has the architecture close to the SRAM, which will be described later.

On the other hand, when the control signals are WRITE=L and xWRITE=H, the clocked inverter 452 and the CMOS switch 454 are turned off to hold the count data of the counter 353 written in the temporary storage section 358. In this mode, the data held in the temporary storage section 358 may be supplied to the rewrite control section 356 or the horizontal transfer driver 359.

The rewrite control section 356 has a function of performing control such that the stored content of the counter 353 is held when performing switching between the up-count mode and the down-count mode. The rewrite control section 356 has four CMOS switches 462, 464, 466, and 468 (formed by a pMOS and an nMOS) with the same configuration as the CMOS switch 314. The CMOS switches 462 and 464 form a two-input selector 461 related to the control signal RHA, and the CMOS switches 466 and 468 form a two-input selector 465 related to the control signal XRLA.

A pair of control signals READ and xREAD which are complementary to each other are input to the two-input selectors 461 and 465 in common. Alternatively, one of the control signals READ and xREAD may be logic-inverted to generate the other control signal.

The control signal RH is supplied to an input end of the CMOS switch 462 in the two-input selector 461, and an output BL of the clocked inverter 452 of the write control section 354 is supplied to an input end of the CMOS switch 464. Output ends of the CMOS switches 462 and 464 are mutually connected to the first input end of the composite gate 416 of the flip-flop 410 at each stage.

A control signal XRL is supplied to an input end of the CMOS switch 466 in the two-input selector 465, and the output BL of the clocked inverter 452 of the write control section 354 is supplied to an input end of the CMOS switch 468. Output ends of the CMOS switches 466 and 468 are mutually connected to the third input end of the composite gate 416 of the flip-flop 410 at each stage.

The CMOS switches 464 and 468 are selected when the control signals are READ=H and xREAD=L, and the CMOS switches 462 and 466 are selected when the control signals are READ=L and xREAD=H.

The rewrite control section 356 has a function of initializing the counter 353 and a function of rewriting the data of the selected temporary storage section 358 into the counter 353 (flip-flop 410). For example, at the time of normal operation, the control signals RH=L and XRL=H are used in a state of control signals READ=L and xREAD=H. At the time of initializing operation, the control signals RH and XRL are used in a state of control signals READ=L and xREAD=H in order to reset or preset the counter 353. Moreover, when rewriting the stored data, the control signals READ=H and xREAD=L are used.

Specifically, at the time of initializing operation, the control signals are set to READ=L and xREAD=H to turn on the CMOS switches 462 and 466, so that the control signals RH and XRL are supplied to the reset end R and the preset end XPR of the flip-flops 410_1 and 410_2. Then, an H level is supplied to each of the reset end R and the preset end XPR by setting the control signals to RH=H and XRL=H in this state.

Accordingly, both a node sla1 (output of the composite gate 416 of the flip-flop 410_1=non-inverting output Q_1) and a node msa1 (output of the composite gate 416 of the flip-flop 410_2=non-inverting output Q_2) are initialized to L, and the logical output COUT of the counter 353 is reset to L. Moreover, an L level is supplied to each of the reset end R and the preset end XPR of the flip-flops 410_1 and 410_2 by setting the control signals to RH=L and XRL=L in a state of control signals READ=L and xREAD=H. Accordingly, both the node sla1 (=non-inverting output Q_1) and the node msa1 (=non-inverting output Q_2) are initialized to H, and the logical output COUT of the counter 353 is reset to H.

When rewriting the stored data, the control signals are set to WRITE=L and XWRITE=H so that the data of the selected temporary storage section 358 can be read, and the control signals are set to READ=H and xREAD=L for switching to the CMOS switches 464 and 468 of the two-input selectors 461 and 465 so that the read data is written into the counter 353. That is, the stored content (count data of P phase processing) which is temporarily stored in the selected temporary storage section 358 is rewritten into the counter 353. For example, when the control signals are set to READ=H and xREAD=L, the CMOS switches 464 and 468 are turned on so that the data read from the temporary storage section 358 is supplied to the reset end R and the preset end XPR of the flip-flops 410_1 and 410_2.

In this case, if the data read from the temporary storage section 358 is "H", the H level is supplied to the reset end R and the preset end XPR of the flip-flops 410_1 and 410_2. Then, both the node sla1 (output of the composite gate 416 of the flip-flop 410_1=non-inverting output Q_1) and the node msa1 (output of the composite gate 416 of the flip-flop 410_2=non-inverting output Q_2) are initialized to L. Accordingly, the inverted output XQ of the D flip-flop 401 is set to "H", and "H" of the data read from the temporary storage section 358 is properly written in the counter 353.

In addition, if the data read from the temporary storage section 358 is "L", the L level is supplied to the reset end R and the preset end XPR of the flip-flops 410_1 and 410_2. Then, both the node sla1 (non-inverting output Q_1) and the node msa1 (non-inverting output Q_2) are initialized to H. Accordingly, the inverted output XQ of the D flip-flop 401 is set to "L", and "L" of the data read from the temporary storage section 358 is properly written in the counter 353.

Each of the two temporary storage sections 358 includes a memory cell 484, in which inverters 485 and 486 are connected such that their opposite ends are connected to each other, and CMOS switches 482 and 488 disposed before and after the memory cell 484. The CMOS switch 482 is connected to an output of the clocked inverter 452 and one input end DI of the horizontal transfer driver 359, and the CMOS switch 488 is connected to an output of the CMOS switch 454 and the other input end xDI of the horizontal transfer driver 359. Each of the CMOS switches 482 and 488 is a transmission gate formed by an nMOS and a pMOS, similar to the CMOS switch 314.

In this example, the temporary storage section 358 has a structure close to a memory cell of the SRAM. A difference between the temporary storage section 358 and the memory cell of the general SRAM is that gates for writing two nodes (connection points of input and output ends of the inverters 485 and 486) are the CMOS switches 482 and 488 (transmission gates) formed by an nMOS and a pMOS.

Regarding the temporary storage section 358, it is preferable to weaken the driving performance of a transistor which forms a flip-flop (in this example, the memory cell 484 formed by the inverters 485 and 486) so that writing can be performed from the outside. In order to do so, it is preferable to increase the gate length and decrease the gate width, for example. Corresponding to this, regarding the write control section 354, the driving performance is strengthened as described above so that the stored content of the temporary storage section 358 having a structure close to the memory cell of the SRAM can be rewritten.

A control signal LSEL is supplied to gates of nMOSs of the CMOS switches 482 and 488 of the temporary storage section 358_1 and gates of pMOSs of the CMOS switches 482 and 488 of the temporary storage section 358_2 in common. A control signal xLSEL is supplied to gates of pMOSs of the CMOS switches 482 and 488 of the temporary storage section 358_1 and gates of nMOSs of the CMOS switches 482 and 488 of the temporary storage section 358_2 in common. The temporary storage section 358_1 is selected when the control signals are set to LSEL=H and xLSEL=L, and the temporary storage section 358_2 is selected when the control signals are set to LSEL=L and xLSEL=H.

In this way, the temporary storage section 358 has a configuration in which writing of the data from the counter 353, reading (rewriting) of the data into the counter 353, and output of the data (that is, horizontal transfer output) to the horizontal signal line 18 are possible.

The horizontal transfer driver 359 shared between the two temporary storage sections 358_1 and 358_2 selects the horizontal position (column position) of the column AD converter 300 and transmits the data of the selected column position to the output section 28. For example, the horizontal transfer driver 359 has a pair of (two) transfer transistors 492 and 494 and a pair of (two) selection transistors 496 and 498. That is, one horizontal transfer driver 359 is formed by using four transistors. All of the transistors 492, 494, 496, and 498 are nMOSs.

The output BL (equivalent to the logical output COUT of the counter 353) of the clocked inverter 452 is input to a gate of the transfer transistor 492, and the output XBL (equivalent to a logically inverted output of the logical output COUT of the counter 353) of the CMOS switch 454 is input to a gate of the transfer transistor 494.

Sources of the transfer transistors 492 and 494 are grounded. A drain of the transfer transistor 492 is connected to a source of the selection transistor 496, and a drain of the transfer transistor 494 is connected to a source of the selection transistor 498. A drain of the selection transistor 496 is connected to the horizontal signal line 18*a* for non-inverted data (DO), and a drain of the selection transistor 498 is connected to the horizontal signal line 18*b* for inverted data (XDO). As horizontal transfer, current transfer using a differential signal line pair (horizontal signal lines 18*a* and 18*b* for complementary data DO and XDO) is adopted to realize a high-speed operation. Gates of the selection transistors 496 and 498 are mutually connected, and a selection control signal BSEL from the horizontal scanning section 12 (not shown) is input to the gates.

When the selection control signal is set to BSEL=H, the horizontal transfer driver 359 drives the differential horizontal signal lines 18*a* (DO) and 18*b* (XDO) for the current read on the basis of the content of the selected temporary storage section 358.

The AD conversion section 302 of the first embodiment is characterized in that the temporary storage section 358 is provided in numbers equal to a plurality of columns to be shared while other functional sections are provided singly for the sharing unit, when viewed from the entire AD conversion section 302AA shared. In the case corresponding to pipeline processing, the latch 362 is further provided in numbers equal to a plurality of columns to be shared.

For example, the AD conversion section 302AA of the first embodiment (first example) includes one two-input selector 313, one comparator 322, one counter control signal generator 332, one counter 353, one rewrite control section 356, one rewrite control section 356, one horizontal transfer driver 359, and the temporary storage section 358 for two columns. In the case corresponding to pipeline processing, the latch 362 is further provided corresponding to two columns.

Here, regarding the relationship between the horizontal transfer driver 359 and the horizontal signal line 18 which is a bus line connected to the output side of the horizontal transfer driver 359, a horizontal transfer system Htr of the present embodiment sets "M" columns (in the first example, two columns) as one group. The number of horizontal transfer drivers 359 connected to the horizontal signal lines 18 can be reduced to 1/M (in the first example, 1/2) compared with the case where the horizontal transfer driver 359 is provided for every column. As a result, since the parasitic capacitance of a horizontal transfer channel which should be driven by the horizontal transfer driver 359 can be reduced, a high-speed operation can be realized eventually. Sharing the horizontal transfer driver 359 among a plurality of columns has merits such as a reduction in the number of transistors, an increase in the speed of horizontal transfer in all operation modes, and a speed increase at the time of thinning out. Moreover, taking the number of transistors or the number of control wiring lines (CN number) into consideration, there is almost no difference in cases where one horizontal transfer driver 359 is shared between two columns, and there is an effect if one horizontal transfer driver 359 is shared between three or more columns.

In addition, in this configuration, since the temporary storage section 358 is made to have architecture close to the SRAM, there is an additional advantage that a selector for exclusive use of the horizontal transfer driver 359 is not necessary.

In the count processor 352 of the present embodiment, the number of temporary storage sections 358 per column increases and the number of write control sections 354 or the number of selectors 312 also increases compared with the case where the column sharing method is not adopted. When compared for only one column, the area slightly increases. However, since the count processor 352 of the present embodiment adopts the column sharing method, the comparison section 320, the count operation period control section 330, the count processor 352, and the data storage section 360 are reduced in numbers equal to "N−1" columns assuming that the number of columns shared is N. Accordingly, since the layout area is significantly reduced compared with that in the method in which there is no column sharing, the slight increase in the area does not matter.

Operation of a D Flip-Flop 401

FIG. 4D is a timing chart for explaining a frequency dividing operation of the D flip-flop 401. Here, (1) in FIG. 4D is an example of operation in the configuration shown in FIG. 4C, and (2) in FIG. 4D is an example of operation in the modification. First, the case of (1) in FIG. 4D will be described below.

When making the D flip-flop 401 perform frequency dividing operation, a reset operation or a preset operation is prohibited by setting the control signals, which are supplied to the rewrite control section 356, to READ=L, xREAD=H, RH=L, and XRL=H. Moreover, the control signals supplied to the switching-time data holding section 440 are set to CTHLD=L and XCTHLD=H, such that the inverted output XQ_2 is supplied to the data input end DIN_1.

If a clock pulse (for example, the logical output COUT of a preceding digit) is supplied to the clock input end CIN in such a state, the first-stage flip-flop 410_1 receives the logic of the data input end DIN_1 by turning on the clocked inverter 412 when the clock input end CIN is in the H period, and keeps holding the logic received in the H period by turning off the clocked inverter 412 and turning on the clocked inverter 414 when the clock input end CIN is in the L period. On the other hand, the second-stage flip-flop 410_1 receives the logic of the data input end DIN_2 by turning on the clocked inverter 412 when the clock input end CIN is in the L period, and keeps holding the logic received in the L period by turning off the clocked inverter 412 and turning on the clocked inverter 414 when the clock input end CIN is in the H period.

Accordingly, for example, when a clock pulse (=CIN) changes to H in a state where the inverting output XQ_2 of the flip-flop 410 is L (t11), the flip-flop 410_1 receives an L state of the non-inverting output Q_2. As a result, the non-inverting output Q_1 changes to L. In this case, the non-inverting output Q_2 maintains the L state. Then, the non-inverting output Q_1 maintains the L state even if the clock pulse (=CIN) changes to L (t12).

On the other hand, when the clock pulse (=CIN) changes to L (t12), the flip-flop 410_2 receives the L state of the non-inverting output Q_1. Accordingly, the non-inverting output Q_2 changes to L and the output (=inverting output XQ_2) of the inverter 406 changes to H. In this case, the non-inverting output Q_1 maintains the L state. Then, the non-inverting output Q_2 maintains the H state even if the clock pulse (=CIN) changes to H (t13).

On the other hand, when the clock pulse (=CIN) changes to H (t13), the flip-flop 410_1 receives the H state of the inverting output Q_2. Accordingly, the non-inverting output Q_1 changes to H. In this case, the inverting output Q_2 maintains the H state. Then, the non-inverting output Q_1 maintains the H state even if the clock pulse (=CIN) changes to L (t14).

On the other hand, when the clock pulse (=CIN) changes to L (t14), the flip-flop 410_2 receives the H state of the non-inverting output Q_1. Accordingly, the non-inverting output Q_2 changes to H and the output (=inverting output XQ_2) of the inverter 406 changes to L. In this case, the non-inverting output Q_1 maintains the H state. Then, the inverting output Q_2 maintains the L state even if the clock pulse (=CIN) changes to H (t15).

The state (t15) where the clock pulse (=CIN) changes to H is the same as a state where the clock pulse (=CIN) changes to H at the timing t11. Such an operation is repeated thereafter.

By such an operation, the D flip-flop 401 divides the clock pulse (=CIN) to clocks with a half of the frequency. From the relationship with the clock pulse (=CIN), the basic operation of the D flip-flop 401 is an up-count operation. In the case of forming the counter 353 for each digit using the D flip-flop 401, an operation of the entire counter 353 is equal to that of an SDR (Single Data Rate) counter which changes the least significant digit by "1" (counts by 1) in one period of a reference clock (count clock CKcnt1).

The example of the detailed configuration shown in FIG. 4C is only an example, and the present invention is not limited to this example. Various examples of the circuit configuration which shows the same function may be considered, and they may also be adopted as the count processor 352 of the present embodiment.

For example, the D flip-flop 401 may be configured to perform a down-count operation as a basic operation when dividing a clock pulse (=CIN) into a clock with a half of the frequency like the example of operation shown in (2) in FIG. 4D, when considered from the relationship with the clock pulse (=CIN). In this case, the counter 353 can be set as an up-counter by controlling so that the non-inverting output Q_2 becomes a data input of the next digit by the count mode switching section 430, and the counter 353 can be set as a down-counter by controlling so that the inverting output Q_2 becomes a data input of the next digit by the count mode switching section 430.

Moreover, although the same D flip-flop 401 is used for all digits of the counter 353 in the above configuration example, the configuration of the least significant digit may be changed differently from those of the remaining high-order digits, for example. For example, it is possible to use a DDR (Double Data Rate) counter which changes the least significant digit by "1" (counts by "1") at periods of 1/2 of a reference clock. Using the DDR counter for the least significant digit is advantageous in that AD conversion processing of P and D phases can be completed in the same period even if the reference clock is set to a speed of 1/2 of the case where an SDR counter is used. In other words, the same AD conversion speed is realized with a half of the clock speed in the case of the SDR counter by using the DDR counter.

Operation Diagram

FIGS. 5A to 6C are views for explaining operations of AD conversion and CDS processing at the time of all pixel readout in the column AD converter 300AA of the first embodiment (first example) which has a two column sharing configuration.

Figure 5B:
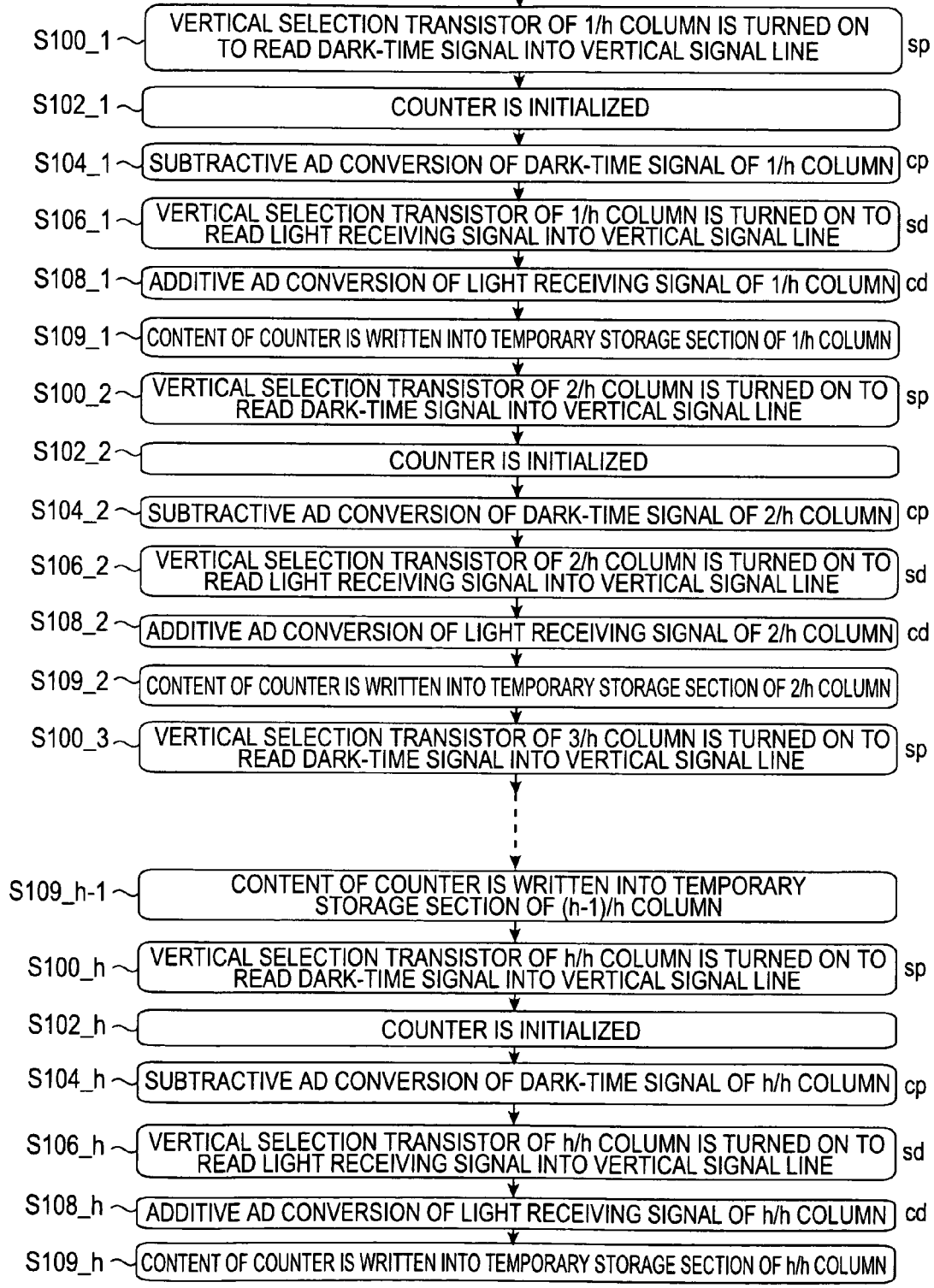
FIG. 5B is a flow chart for explaining the operations of AD conversion and CDS processing at the time of all pixel readout in a column AD converter of the comparative example (when h columns are shared)

Here, FIGS. 5A to 5C are views for explaining a comparative example in which the structure (shared pixel simultaneous driving method) of the first embodiment is not adopted. The comparative example means a form of adopting a shared pixel separate driving method in which a pixel reset (settling according to the pixel reset) is separately performed for the vertical signal line 19 corresponding to n columns shared. As a typical example, two column sharing is applied to a pixel shift arrangement in which the charge generators 32 of the pixel array section 10 are arrayed so as to be shifted from each other by a half pitch in row and column directions. For example, the two column sharing configuration adopted in JP-A-20007-243265 corresponds to this.

FIG. 5A is a view showing an example of the configuration of the column AD converter 300X assumed to be adopted in the solid state imaging device 1X of the comparative example. Here, the case of two column sharing is shown as an example. FIG. 5B is a flow chart for explaining the operations of AD conversion and CDS processing at the time of all pixel readout in a column AD converter 300X of the comparative example (when h columns are shared). FIG. 5C is a view for explaining a comparison result of the processing time for one row at the time of all pixel readout in a case where two column sharing is applied and a case where two column sharing is not applied, in the solid state imaging device 1X of the comparative example.

Figure 6A:
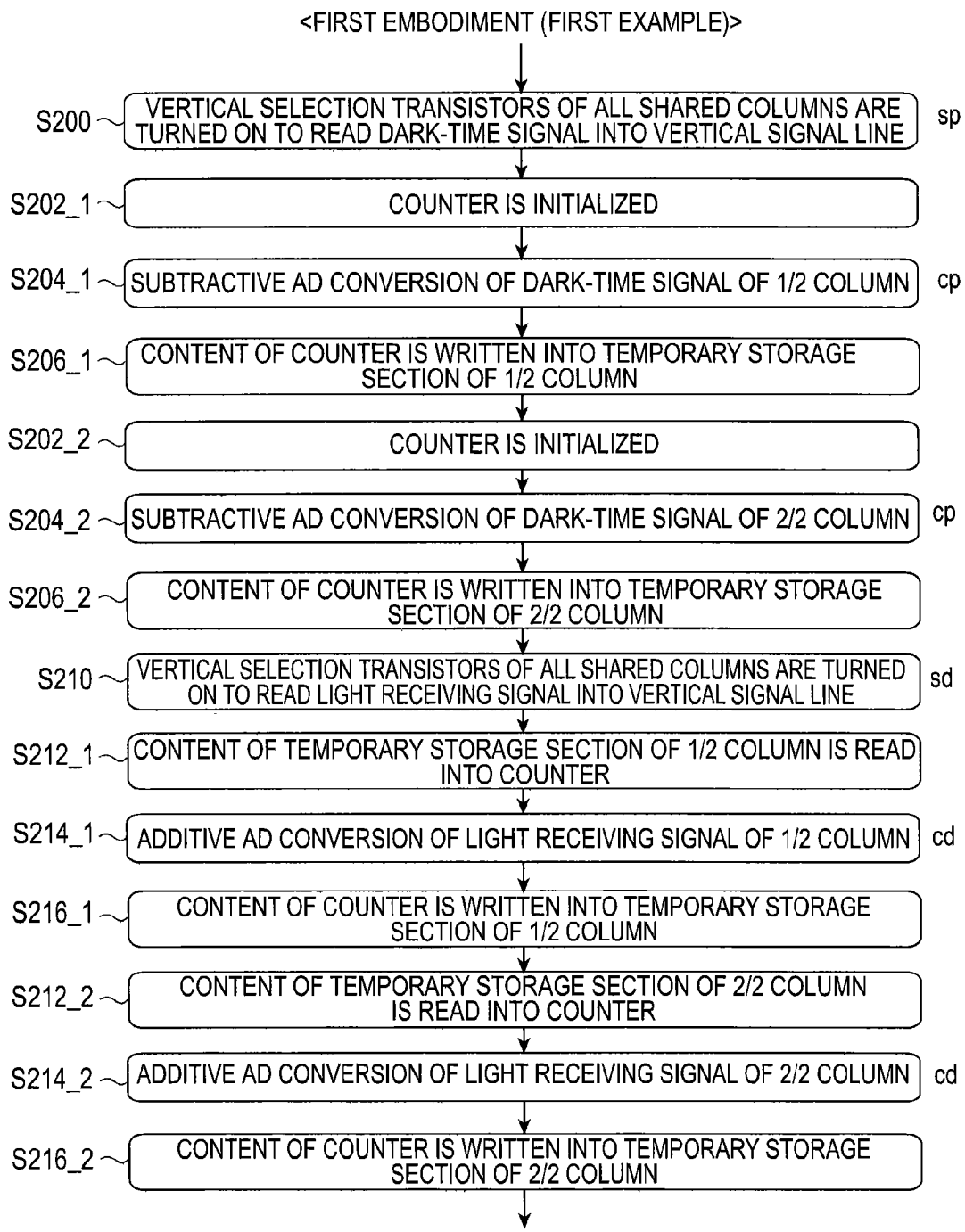
FIG. 6A is a flow chart for explaining the operations of AD conversion and CDS processing at the time of all pixel readout in a column AD converter of the first embodiment (first example)

FIG. 6A is a flow chart for explaining the operations of AD conversion and CDS processing at the time of all pixel readout in the column AD converter 300AA of the first embodiment (first example).

FIGS. 6B and 6C are views for explaining the effects of an all pixel readout in the column AD converter 300AA of the first embodiment (first example). In particular, FIG. 6B is a view for explaining a comparison result of processing time for one row at the time of all pixel readout in two column sharing of the comparative example and two column sharing of the first embodiment (first example). FIG. 6C is a view for explaining a difference between the comparative example and the first embodiment (first example) through the relationship with a settling period.

In the technique disclosed in JP-A-2007-243265, pixels are shifted from each other by a half pitch in the horizontal and vertical directions so that AD conversion of two adjacent columns is performed by one comparator 13 or one counter 14. Two pixels shared are vertically driven by separate row signal lines.

In the case of such a configuration, from a common sense point of view, it is thought that the outline of the layout of a column parallel ADC block 15 (equivalent to the column AD converter 300 of the present embodiment) is like (1) or (2) in FIG. 5A. (1) in FIG. 5A is the same as the configuration of the present embodiment. Here, a counter 14 (equivalent to the count processor 352 of the present embodiment) is configured such that one counter 353 is shared between two columns and the temporary storage section 358 is provided for each of (2n−1)-th and (2n)-th columns. In the case of general expansion to h column sharing, it is preferable to set the number of temporary storage sections 358 to h. On the other hand, (2) in FIG. 5A is a configuration having one temporary storage section 358 per digit in a plurality of columns.

In a comparative example adopting the shared pixel separate driving method at the time of h column sharing, the procedure based on common sense when performing AD conversion processing by all pixel readout is shown in FIG. 5B. In addition, FIG. 5B shows the case where the layout configuration shown in (1) in FIG. 5A is generally expanded to h column sharing.

Since h pixels (in FIG. 5A, two pixels) shared are vertically driven by separate row signal lines, "performing AD conversion processing of h pixels to be shared in the row order" is assumed to be a "procedure based on common sense". Regarding vertical signal lines related with the AD conversion section 302X in the h column sharing, a vertical signal line 19_1 of the first column, a vertical signal line 19_2 of the second column, . . . , a vertical signal line 19_h−1 of the (h−1)-th column, and a vertical signal line 19_h of the h-th column are denoted as a i/h column, a 2/h column, . . . , a (h−1)/h column, and a h/h column, respectively.

First, the vertical selection transistor 40 of the unit pixel 3 (first pixel) of the 1/h column is turned on to read a dark-time signal into the vertical signal line 19 (S100_1). The counter 353 is initialized (S102_1), and AD conversion (subtractive AD conversion) of the dark-time signal of the 1/h column is performed in the down-count mode to acquire an AD conversion result of the dark-time signal (S104_1). Then, the read selection transistor 34 (transfer gate) of the unit pixel 3 of the 1/h column is turned on to read a light receiving signal into the vertical signal line 19 (S106_1). An AD conversion result of the light receiving signal is acquired by performing AD conversion (additive AD conversion) of the light receiving signal of the 1/h column in the up-count mode with the AD conversion result of the dark-time signal as a start point (S108_1). Since the AD conversion result subjected to CDS processing for the 1/h column is obtained as the content of the counter, the counting result is written into the temporary storage section (S109_1).

Similarly, the vertical selection transistor 40 of the unit pixel 3 (second pixel) of the 2/h column is turned on to read a dark-time signal into the vertical signal line 19 (S100_2). The counter 353 is initialized (S102_2), and AD conversion (subtractive AD conversion) of the dark-time signal of the 2/h column is performed in a down-count mode to acquire an AD conversion result of the dark-time signal (S104_2). Then, the read selection transistor 34 (transfer gate) of the unit pixel 3 of the 2/h column is turned on to read a light receiving signal into the vertical signal line 19 (S106_2). An AD conversion result of the light receiving signal is acquired by performing AD conversion (additive AD conversion) of the light receiving signal of the 2/h column in the up-count mode with the AD conversion result of the dark-time signal as a start point (S108_2). Since the AD conversion result subjected to CDS processing for the 2/h column is obtained as the content of the counter, the counting result is written into the temporary storage section (S109_2).

Subsequently, AD conversion processing is performed for the 3/h column, . . . , and the h/h column in the same manner as described above.

Thus, in the case of performing AD conversion processing by all pixel readout in the comparative example adopting the shared pixel separate driving method at the time of h column sharing, it is assumed the AD conversion and the CDS processing are performed in the order in which the light receiving signal of the first pixel is performed after AD conversion of the dark-time signal of the first pixel and then the light receiving signal of the second pixel is performed after AD conversion of the dark-time signal of the second pixel.

An example of operation in the case of the layout shown in (2) in FIG. 5A is shown in FIG. 5C. (1) in FIG. 5C shows an operation timing when it is assumed that column sharing is not performed, and (2) in FIG. 5C shows an operation timing in the case of two column sharing. In FIG. 5C, an auto zero period az is a period of processing for adjusting the reference, that is, the zero point of the comparator 322. As described in FIG. 2B, a dark-time settling period sp and a light receiving signal settling period sd are times of settling until the electric potential (pixel signal voltage Vx) of the vertical signal line 19 is stabilized after a dark-time signal and a light receiving signal are read from the unit pixel 3 into the vertical signal line 19. A shutter period sh is a period of electronic shutter which determines an exposure time, and is a period for which an electric charge read into the floating diffusion 38 is swept away to the power source Vdd by turning on the reset transistor 36.

In the layout shown in (2) in FIG. 5A, one temporary storage section 358 is provided for a plurality of columns to be shared. Accordingly, the layout area is decreased. However, the horizontal transfer time is slightly restricted. This is because if horizontal transfer of the processing result is not performed after AD conversion of, for example, a 1/2 column is completed, it is difficult to proceed to processing of the next 2/2 column.

As can be seen from FIG. 2B or (2) in FIG. 5C, if all pixel readout is performed on the basis of two column sharing in the layout shown in (2) in FIG. 5A, the dark-time signal settling period sp and the light receiving signal settling period sd exist in each of the processing of the 1/2 column and the processing of the 2/2 column. As a structure of the present embodiment, a structure capable of suppressing the influence of these settling periods is adopted. Hereinafter, this point will be described with reference to FIGS. 6A to 6C.

FIG. 6A shows the procedure when performing AD conversion processing on the basis of an all pixel readout in the AD conversion section 302AA of the first embodiment (first example) which has a two column sharing configuration.

First, the shared pixel simultaneous driving method is adopted to simultaneously perform vertical driving of pixels of two columns to be shared even when pixels are shifted from each other. For example, each vertical selection transistor 40 of the unit pixels 3 (first and second pixels) of 1/2 and 2/2 columns is turned on to read a dark-time signal into vertical signal lines 19_2n−1 and 19_2n (S200). As a result, the reset level Srst of each unit pixel 3 of 1/2 and 2/2 columns appears in the vertical signal lines 19_2n−1 and 19_2n.

The counter 353 is initialized (S202_1), and a dark-time signal of the 1/2 column is selected by the two-input selector 313 and AD conversion (subtractive AD conversion) of the dark-time signal of the 1/2 column is performed in the down-count mode, thereby acquiring an AD conversion result of the dark-time signal (S204_1). Since an AD conversion result of P phase of the 1/2 column is obtained as the content of the counter, the counting result is stored in the temporary storage section 358_1 of the 1/2 column (S206_1).

The counter 353 is initialized (S202_2), and a dark-time signal of the 2/2 column is selected by the two-input selector 313 and AD conversion (subtractive AD conversion) of the dark-time signal of the 2/2 column is performed in the down-count mode, thereby acquiring an AD conversion result of the dark-time signal (S204_2). Since an AD conversion result of P phase of the 2/2 column is obtained as the content of the counter, the counting result is stored in the temporary storage section 358_2 of the 2/2 column (S206_2).

Then, each read selection transistor 34 (transfer gate) of the unit pixels 3 (first and second pixels) of the 1/2 and 2/2 columns is turned on to read a light receiving signal into the vertical signal lines 19_2n−1 and 19_2n (S210). As a result, the signal level Ssig of each unit pixel 3 of the 1/2 and 2/2 columns appears in the vertical signal lines 19_2n−1 and 19_2n.

In the present embodiment, in order to complete CDS processing within columns, an AD conversion result of the light receiving signal is acquired by performing AD conversion (additive AD conversion) of the light receiving signal of each column in the up-count mode with the AD conversion result of the dark-time signal as a start point. In order to do so, in the present embodiment, it is necessary to read (rewrite) the AD conversion result of the dark-time signal into the counter 353 because the AD conversion result of the dark-time signal is temporarily stored in the temporary storage sections 358_1 and 358_2.

For example, the AD conversion result of the P phase of the 1/2 column temporarily stored in the temporary storage section 358_1 is first read into the counter 353 (S212_1). Then, an AD conversion result of the light receiving signal is acquired by selecting the light receiving signal of the 1/2 column with the two-input selector 313 and performing AD conversion (additive AD conversion) in the up-count mode with the AD conversion result of the dark-time signal as a start point (S214_1). Since an AD conversion result subjected to CDS processing for the 1/2 column is obtained as the content of the counter, the counting result is written into the temporary storage section 358_1 of the 1/2 column (S216_1).

Similarly, the AD conversion result of the P phase of the 2/2 column temporarily stored in the temporary storage section 358_2 is read into the counter 353 (S212_2). Then, an AD conversion result of the light receiving signal is acquired by selecting the light receiving signal of the 2/2 column with the two-input selector 313 and performing AD conversion (additive AD conversion) in the up-count mode with the AD conversion result of the dark-time signal as a start point (S214_2). Since an AD conversion result subjected to CDS processing for the 2/2 column is obtained as the content of the counter, the counting result is written into the temporary storage section 358_2 of the 2/2 column (S216_2).

Here, the example has been described in which the processing is performed in the order of P phase processing of the 1/2 column->P phase processing of the 2/2 column->D phase processing of the 1/2 column->D phase processing of the 2/2 column. However, it may be changed on the basis of a combination of levels with the same meaning. In this example, the processing may be performed in another order as long as P phase processing of two columns->D phase processing of two columns are satisfied. For each of the P phase processing and the D phase processing, the order of processing of 1/2 and 2/2 columns may be set reversely. For example, the processing may be performed in the order of P phase processing of the 1/2 column->P phase processing of the 2/2 column->D phase processing of the 2/2 column->D phase processing of the 1/2 column.

Thus, according to the structure of the first embodiment (first example), vertical driving is simultaneously performed for two columns to be shared. Accordingly, settling is simultaneously performed for two columns to be shared. In other words, a dark-time signal settling period sp_1 of the 1/2 column and a dark-time signal settling period sp_2 of the 2/2 column are at the same timing, and a light receiving signal settling period sd_1 of the 1/2 column and a light receiving signal settling period sd_2 of the 2/2 column are at the same timing. Accordingly, logically, processing time can be shortened by "sp(sp_1 or sp_2)+sd (sd_1 or sd_2)" of one column compared with the case where the present embodiment is not adopted.

In the present embodiment, an AD conversion result of a dark-time signal is temporarily stored in the temporary storage section 358 in a period until a light receiving signal of a pixel to be processed is AD-converted after a dark-time signal of the pixel to be processed is AD-converted. Accordingly, even when D phase processing is performed after P phase processing is completed for all pixels to be shared, settling can be simultaneously performed in all pixels to be shared and CDS processing can be performed at the time of all pixel readout.

FIGS. 6B and 6C show the effect of processing time reduction obtained by adopting the shared pixel simultaneous driving method to perform settling simultaneously in all pixels to be shared (called a settling simultaneous execution type). (1) in FIG. 6B shows a comparative example and is the same as (2) in FIG. 5C. (2) in FIG. 6B shows the case of the first embodiment (first example).

Processing of one row in the first embodiment (first example) shown in (2) in FIG. 6B includes an auto zero period az, a dark-time signal settling period sp, a settling period after dark-time signal switching sp2, a dark-time signal countable period cp, a light receiving signal settling period sd, a settling period after light receiving signal switching sd2, a light receiving signal countable period cd, and a shutter period sh.

The settling period after dark-time signal switching sp2 is a period for switching between 1/2 and 2/2 columns by the two-input selector 313 in P phase processing for two columns. The settling period after light receiving signal switching sd2 is a period for switching between 1/2 and 2/2 columns by the two-input selector 313 in D phase processing for two columns. Both the periods are times when the point that even at the time of switching some time is needed for settling is taken into consideration, since a slight parasitic capacitance also exists at the comparator 322 side due to the two-input selector 313. However, the time taken for switching is very short compared with the time taken for settling of the entire vertical signal line 19 (dark-time signal settling period sp or light receiving signal settling period sd). For example, the time taken for switching is 1/5 or less of the time taken for settling of the entire vertical signal line 19. In the settling simultaneous execution method, even if the switching takes time, AD conversion processing can be performed in a short time since the dark-time signal settling period sp and the light receiving signal settling period sd for two columns can be executed at the same timing.

As is understood from the explanation in FIG. 2B, the dark-time signal countable period cp and the light receiving signal countable period cd are processing periods for which AD conversion is performed. In the dark-time signal countable period cp and the light receiving signal countable period cd, the reference signal SLP_ADC changes in an inclined manner and is compared with the pixel signal voltage Vx, which appears in the vertical signal line 19 of a selected column, by the comparator 322. On the basis of the comparison result, the counter 353 performs counting or stops it.

FIG. 6C is a conceptual view of the settling time reduction. (1) in FIG. 6C shows the waveform (pixel signal voltage Vx) of the shared pixel separate driving type (vertical signal line separate settling type) column shared vertical signal line 19. (2) in FIG. 6C shows the waveform (pixel signal voltage Vx) of a vertical signal line simultaneous settling type shared vertical signal line 19 which adopts the shared pixel simultaneous driving method of the present embodiment. In the vertical signal line simultaneous settling type column sharing in (2) in FIG. 6C, pixel signal voltages Vx_2n−1 and Vx_2n of two vertical signal lines 19_2n−1 and 19_2n to be shared and a pixel signal voltage Vx_sw of a wiring line shared at the comparator 322 side by the two-input selector 313 are shown.

Since one dark-time signal settling period sp and one light receiving signal settling period sd in the vertical signal line separate settling type column sharing shown in (1) in FIG. 6C ends only in a time for parasitic capacitor charging of a part of the pixel signal voltage Vx_sw, which is caused by switching between the two vertical signal lines 19_2n−1 and 19_2n, in the vertical signal line simultaneous settling type column sharing shown in (2) in FIG. 6C, it can be seen that the time taken for the entire AD conversion processing is shortened.

Accordingly, in the settling simultaneous execution method adopting the shared pixel simultaneous driving method, the time necessary for completing AD conversion processing for two columns to be shared becomes shorter than that in the case where the shared pixel simultaneous driving method is not adopted. As a result, since AD conversion processing can be performed at higher speed than in the case where the present embodiment is not applied, the frame rate is improved.

For example, compared with the method disclosed in JP-A-2007-243265 in which pixel shift is applied, a normal processing time for two rows can be shortened. Accordingly, the total frame rate is improved by shortening one horizontal period. Moreover, in the case where pixel sharing is originally applied for two columns on one row, double-speed processing is performed in order to complete all pixel readout within the normal processing time for one row. Also in this case, it is possible to shorten the time necessary for completing AD conversion processing for two columns. Accordingly, the total frame rate can be improved by shortening one horizontal period.

Second Example

Three Column Sharing & Monochrome

FIG. 7A is a view for explaining the first embodiment (second example) of column signal processing.

A column AD converter 300AB of the first embodiment (second example) is an example of the configuration, in which one AD conversion section 302AB is shared between three columns (three vertical signal lines 19), when the solid state imaging device 1 is for monochrome imaging. Moreover, as signal processing, a case where all pixel readout is performed is shown. The case where three columns to be shared are a group of (3n−2)-th column, (3n−1)-th column, and (3n)-th column (n is a positive integer of 1 or more) will be described below.

The column AD converter 300AB of the first embodiment (second example) is different from the column AD converter 300AA of the first embodiment (first example) in that the comparison section 320, the count operation period control section 330, the count processor 352, and the data storage section 360 are shared between three columns and one of the vertical signal lines 19 of the three columns is connected to the comparison section 320. Only a different point from the column AD converter 300AA of the first embodiment (first example) will be described.

As shown in (1) in FIG. 7A, each AD conversion section 302AB has a "3 input-1 output" type selector 312 (called a three-input selector 316) which selects one from the vertical signal lines 19 of three columns ((3n−2)-th column, (3n−1)-th column, and (3n)-th column). After the three-input selector 316, the comparator 322, the counter control signal generator 332, the counter 353, and the temporary storage section 358 are disposed in order.

Here, (1) in FIG. 7A shows a configuration capable of completing CDS processing by the AD conversion section 302AB for every column, similar to (1) in FIG. 3A. For example, one counter 353 is shared between three columns, but the temporary storage section 358 is provided corresponding to each of (3n−2)-th, (3n−1)-th, and (3n)-th columns. For example, the count data of the (3n−2)-th column is stored in the temporary storage section 358_1, the count data of the (3n−1)-th column is stored in the temporary storage section 358_2, and the count data of the (3n)-th column is stored in the temporary storage section 358_3.

On the other hand, (2) in FIG. 7A shows an example of the configuration corresponding to pipeline horizontal transfer similar to (2) in FIG. 3A. Here, the latch 362 is further provided after the count processor 352 (counter 353) for every column. The latch 362 is provided corresponding to each of (3n−2)-th, (3n−1)-th, and (3n)-th columns. For example, the count data of the (3n−2)-th column is stored in the latch 362_1, the count data of the (3n−1)-th column is stored in the latch 362_2, and the count data of the (3n)-th column is stored in the latch 362_3.

Example of the Configuration of a Three-Input Selector

Figure 7B:
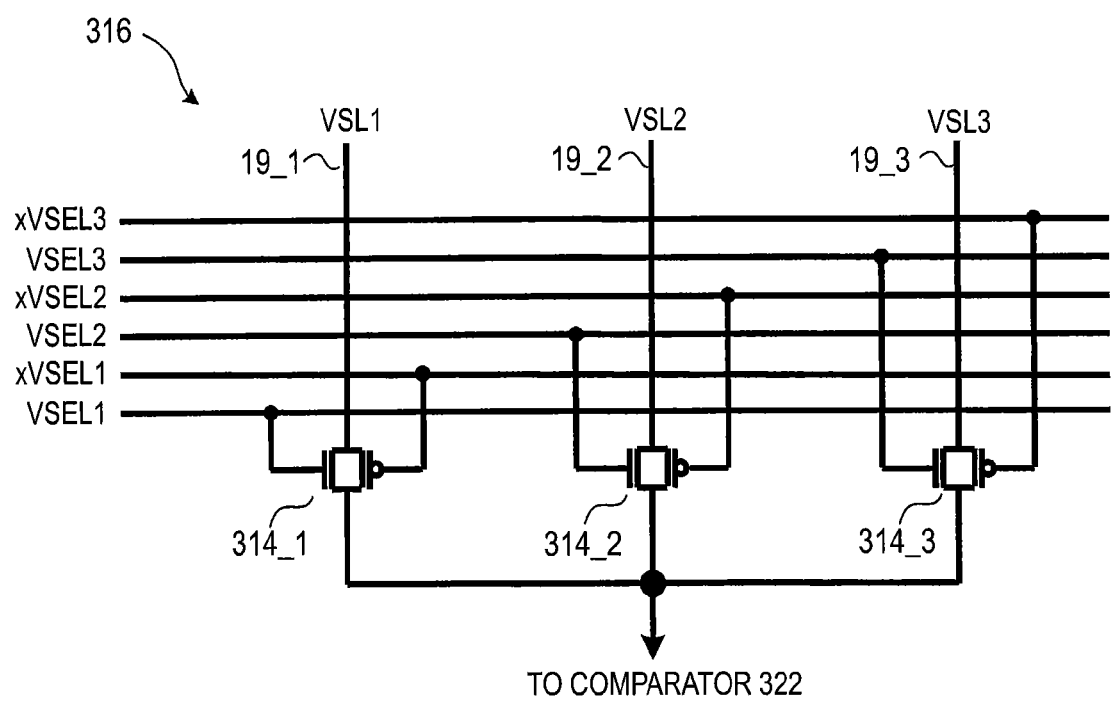
FIG. 7B is a view showing an example of the configuration of a three-input selector.

FIG. 7B is a view showing an example of the configuration of the three-input selector 316. In the three-input selector 316, three CMOS switches 314 are connected in parallel to each other. In one three-input selector 316, six transistors are used. Input sides of the CMOS switches 314_1, 314_2, and 314_3 are connected to the corresponding vertical signal lines 19_1 ((3n−2)-th column), 19_2 ((3n−1)-th column), and 193 ((3n)-th column), respectively, and outputs sides thereof are mutually connected to an inverting input end of the comparison section 320 (not shown).

Unlike the two-input selector 313, in the CMOS switches 314_1, 314_2, and 314_3 of the three-input selector 316, gates of nMOS and pMOS are controlled by one pair of select signals VSEL and xVSEL which are complementary to each other. For example, control signals VSEL1, VSEL2, and VSEL3 are input to nMOS_1, nMOS_2, and nMOS_3, respectively, and control signals XVSEL1, XVSEL2, and XVSEL3 are input to pMOS_1, pMOS_2, and pMOS3, respectively.

The vertical signal line 191 ((3n−2)-th column) is selected when VSEL1=H, xVSEL1=L, VSEL2=L, xVSEL2=H, VSEL3=L, and xVSEL3=H. The vertical signal line 192 ((3n−1)-th column) is selected when VSEL1=L, xVSEL1=H, VSEL2=H, xVSEL2=L, VSEL3=L, and xVSEL3=H. The vertical signal line 19_3 ((3n)-th column) is selected when VSEL1=L, xVSEL1=H, VSEL2=L, xVSEL2=H, VSEL3=H, and xVSEL3=L.

In addition, the configuration of the three-input selector 316 shown here is only an example, and various modifications may also be made. For example, other configurations may also be adopted including a configuration of making the two-input selector 313 with a two-stage configuration and of selecting one of the (3n−2)-th and (3n−1)-th columns in the first stage and selecting one of the output and the (3n)-th column in the second stage.

Example of the Configuration of a Count Processor: Three Column Sharing

Figure 8B:
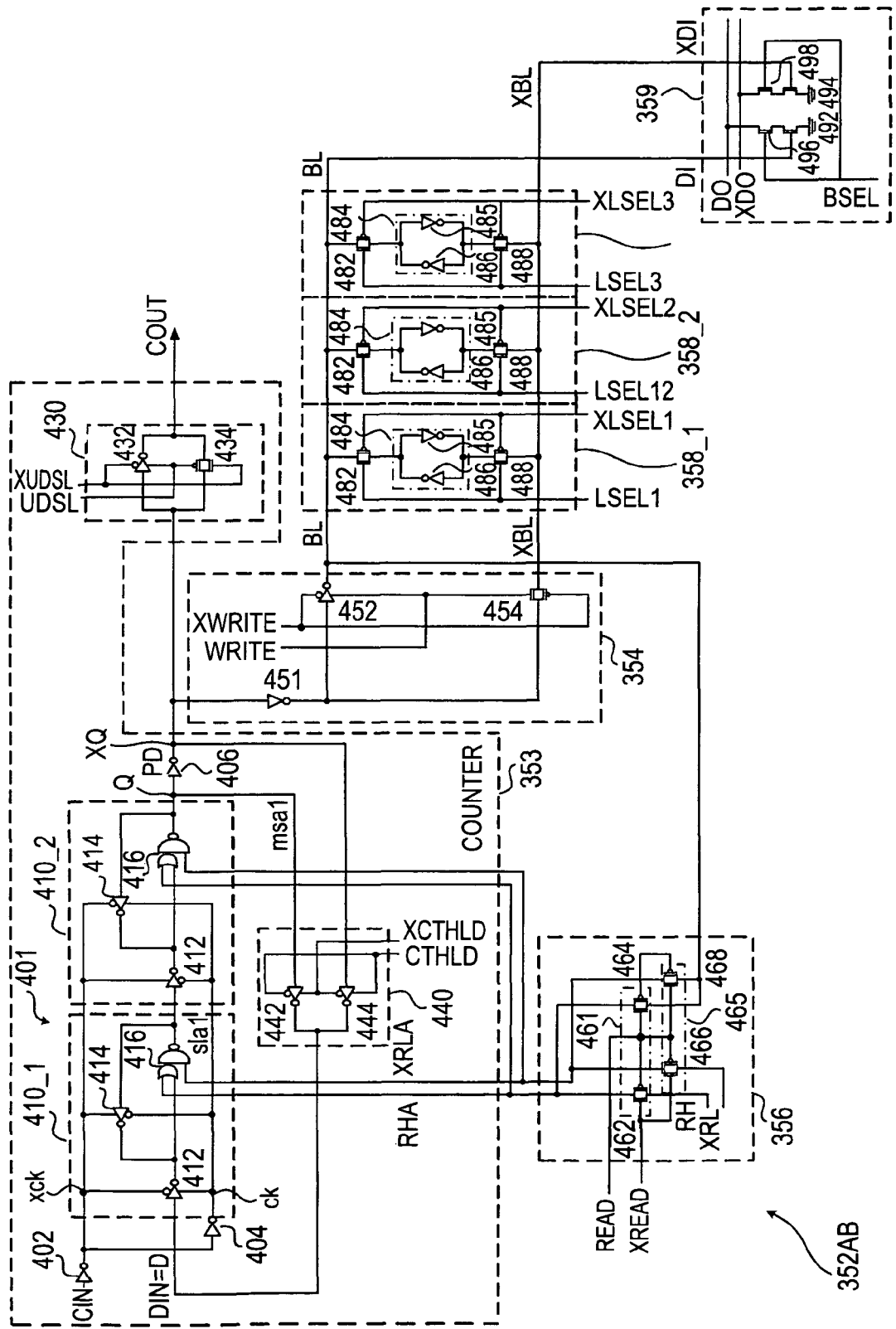
FIG. 8B is a view showing an example of the detailed circuit configuration of one digit of three columns of the count processor.

FIGS. 8A and 8B are views for explaining an example of the configuration of the count processor 352 used in the AD conversion section 302AB of the first embodiment (second example). Here, FIG. 8A shows the outline (circuit outline and circuit block diagram) of one digit of three columns, and FIG. 8B shows an example of the detailed circuit configuration. Although not shown, the entire configuration (corresponding to 13 bits) around the counting section is the same as that shown in FIG. 4B except for a part of the temporary storage section 358. Only points of difference from the AD conversion section 302AA of the first embodiment (first example) will be described below.

First, in the outline of one digit of three columns shown in FIG. 8A, the write control section 354, the rewrite control section 356, three temporary storage sections 358_1, 358_2, and 358_3 (first to third memories), and the horizontal transfer driver 359 are provided for the D flip-flop 401 at each stage. That is, the AD conversion section 302AB is only different from the AD conversion section 302AA in that the temporary storage section 358_3 (third memory) is added to the AD conversion section 302AA as a base in the circuit block diagram.

Accordingly, also in the example of the detailed circuit configuration shown in FIG. 8B, three temporary storage sections 358_1, 358_2, and 358_3 are provided. Unlike the AD conversion section 302AA, in CMOS switches 482_1, 482_2, and 482_3 and CMOS switches 488_1, 488_2, and 488_3 of the three temporary storage sections 358_1, 358_2, and 358_3, gates of nMOS and pMOS are controlled by one pair of select signals LSEL and xLSEL which are complementary to each other.

Operation Diagram

FIGS. 9A and 9B are views for explaining operations of AD conversion and CDS processing at the time of all pixel readout in the column AD converter 300AB of the first embodiment (second example) which has a three column sharing configuration. FIG. 9A is a flow chart for explaining the operations of AD conversion and CDS processing at the time of all pixel readout in the column AD converter 300AB of the first embodiment (second example). FIG. 9B is a view for explaining the effects of an all pixel readout in the column AD converter 300AB of the first embodiment (second example). In particular, FIG. 9B is, a view for explaining a comparison result of processing time for one row at the time of all pixel readout in three column sharing of the comparative example and three column sharing of the first embodiment (second example). The comparative example means a form of adopting a shared pixel separate driving method in which a pixel reset (settling according to the pixel reset) is separately performed for the vertical signal line 19 corresponding to three columns shared. As a typical example, three column sharing is applied to a pixel shift arrangement in which the charge generators 32 of the pixel array section 10 are arrayed so as to be shifted from each other by a 1/3 pitch in row and column directions.

First, the shared pixel simultaneous driving method is adopted to simultaneously perform vertical driving of pixels of three columns to be shared even when pixels are shifted from each other. For example, each vertical selection transistor 40 of the unit pixels 3 (first to third pixels) of 1/3, 2/3, and 3/3 columns is turned on to read a dark-time signal into vertical signal lines 19_3n−2, 19_3n−1, and 19_3n (S300). As a result, the reset level Srst of each unit pixel 3 of 1/3, 2/3, and 3/3 columns appears in the vertical signal lines 19_3n−2, 19_3n−1, and 19_3n.

The counter 353 is initialized (S302_1), and a dark-time signal of the 1/3 column is selected by the three-input selector 316 and AD conversion (subtractive AD conversion) of the dark-time signal of the 1/3 column is performed in the down-count mode, thereby acquiring an AD conversion result of the dark-time signal (S304_1). Since an AD conversion result of P phase of the 1/3 column is obtained as the content of the counter, the counting result is stored in the temporary storage section 358_1 of the 1/3 column (S306_1).

The counter 353 is initialized (S302_2), and a dark-time signal of the 2/3 column is selected by the three-input selector 316 and AD conversion (subtractive AD conversion) of the dark-time signal of the 2/3 column is performed in the down-count mode, thereby acquiring an AD conversion result of the dark-time signal (S304_2). Since an AD conversion result of P phase of the 2/3 column is obtained as the content of the counter, the counting result is stored in the temporary storage section 358_2 of the 2/3 column (S306_2).

The counter 353 is initialized (S302_3), and a dark-time signal of the 3/3 column is selected by the three-input selector 316 and AD conversion (subtractive AD conversion) of the dark-time signal of the 3/3 column is performed in the down-count mode, thereby acquiring an AD conversion result of the dark-time signal (S3043). Since an AD conversion result of P phase of the 3/3 column is obtained as the content of the counter, the counting result is stored in the temporary storage section 358_3 of the 3/3 column (S306_2).

Then, each read selection transistor 34 (transfer gate) of the unit pixels 3 (first to third pixels) of the 1/3, 2/3, and 3/3 columns is turned on to read a receiving signal into the vertical signal lines 19_3n−2, 19_3n−1, and 19_3n (S310). As a result, the signal level Ssig of each unit pixel 3 of the 1/3, 2/3, and 3/3 columns appears in the vertical signal lines 19_3n−2, 19_3n−1, and 19_3n.

In the present embodiment, in order to complete CDS processing within columns, an AD conversion result of the light receiving signal is acquired by performing AD conversion (additive AD conversion) of the light receiving signal of each column in the up-count mode with the AD conversion result of the dark-time signal as a start point. In order to do so, in the present embodiment, it is necessary to read (rewrite) the AD conversion result of the dark-time signal into the counter 353 because the AD conversion result of the dark-time signal is temporarily stored in the temporary storage sections 358_1, 358_2, and 358_3.

For example, the AD conversion result of the P phase of the 1/3 column temporarily stored in the temporary storage section 358_1 is first read into the counter 353 (S312_1). Then, an AD conversion result of the light receiving signal is acquired by selecting the light receiving signal of the 1/3 column with the three-input selector 316 and performing AD conversion (additive AD conversion) in the up-count mode with the AD conversion result of the dark-time signal as a start point (S314_1). Since an AD conversion result subjected to CDS processing for the 1/3 column is obtained as the content of the counter, the counting result is written into the temporary storage section 358_1 of the 1/3 column (S3161).

Similarly, the AD conversion result of the P phase of the 2/3 column temporarily stored in the temporary storage section 358_2 is read into the counter 353 (S312_2). Then, an AD conversion result of the light receiving signal is acquired by selecting the light receiving signal of the 2/3 column with the three-input selector 316 and performing AD conversion (additive AD conversion) in the up-count mode with the AD conversion result of the dark-time signal as a start point (S314_2). Since an AD conversion result subjected to CDS processing for the 2/3 column is obtained as the content of the counter, the counting result is written into the temporary storage section 358_2 of the 2/3 column (S316_2).

Similarly, the AD conversion result of the P phase of the 3/3 column temporarily stored in the temporary storage section 358_3 is read into the counter 353 (S312_3). Then, an AD conversion result of the light receiving signal is acquired by selecting the light receiving signal of the 3/3 column with the three-input selector 316 and performing AD conversion (additive AD conversion) in the up-count mode with the AD conversion result of the dark-time signal as a start point (S314_3). Since an AD conversion result subjected to CDS processing for the 3/3 column is obtained as the content of the counter, the counting result is written into the temporary storage section 358_3 of the 3/3 column (S3163).

Here, the example has been described in which the processing is performed in the order of P phase processing of the 1/3 column->P phase processing of the 2/3 column->P phase processing of the 3/3 column->D phase processing of the 3/1 column->D phase processing of the 2/3 column->D phase processing of the 3/3 column. However, the processing may be performed in another order as long as P phase processing of three columns->D phase processing of three columns are satisfied. For each of the P phase processing and the D phase processing, the order of processing of 1/3, 2/3, and 3/3 columns may be set reversely. For example, the processing may be performed in the order of P phase processing of the 1/3 column->P phase processing of the 3/3 column->P phase processing of the 2/3 column->D phase processing of the 3/3 column->D phase processing of the 2/3 column->D phase processing of the 1/3 column.

Thus, according to the structure of the first embodiment (second example), vertical driving is simultaneously performed for three columns to be shared. Accordingly, settling is simultaneously performed for three columns to be shared. In other words, a dark-time signal settling period sp_1 of the 1/3 column, a dark-time signal settling period sp_2 of the 2/3 column, and a dark-time signal settling period sp_3 of the 3/3 column are at the same timing. A light receiving signal settling period sd_1 of the 1/3 column, a light receiving signal settling period sd_2 of the 2/3 column, and a light receiving signal settling period sd_3 of the 3/3 column are at the same timing. Accordingly, logically, the processing time can be shortened by "sp+sd" of two columns compared with the case where the present embodiment is not adopted.

In the first embodiment (second example), similar to the first embodiment (first example), even when D phase processing is performed after P phase processing is completed for all pixels to be shared, settling can be simultaneously performed in all pixels to be shared and CDS processing can be performed at the time of all pixel readout. Accordingly, the same effects as in the first embodiment (first example) can be obtained.

FIG. 9B shows the effect of processing time reduction obtained by adopting the shared pixel simultaneous driving method to perform settling simultaneously in all pixels to be shared (called a settling simultaneous execution type). (1) in FIG. 9B shows a comparative example. (2) in FIG. 9B shows the case of the first embodiment (second example). The meaning of each reference numeral is the same as that in the first embodiment (first example).

The settling period after dark-time signal switching sp2 is a period for switching among 1/3, 2/3, and 3/3 columns by the three-input selector 316 in P phase processing for three columns. The settling period after light receiving signal switching sd2 is a period for switching among 1/3 and 2/3 columns by the three-input selector 316 in D phase processing for three columns. Both the periods are times when the point that even at the time of switching some time is needed for settling is taken into consideration, since a slight parasitic capacitance also exists at the comparator 322 side due to the three-input selector 316.

However, the time taken for switching is very short compared with the time taken for settling of the entire vertical signal line 19 (dark-time signal settling period sp or light receiving signal settling period sd). For example, the time taken for switching is 1/5 or less of the time taken for settling of the entire vertical signal line 19. In the settling simultaneous execution method, even if the switching takes time, AD conversion processing can be performed in a short time since the dark-time signal settling period sp and the light receiving signal settling period sd for three columns can be executed at the same timing. Accordingly, in the settling simultaneous execution method adopting the shared pixel simultaneous driving method, the time necessary for completing AD conversion processing for three columns to be shared becomes shorter than that in the case where the shared pixel simultaneous driving method is not adopted.

Third Example

Three Column Sharing & Monochrome

FIG. 10A is a view for explaining the first embodiment (third example) of column signal processing.

A column AD converter 300AC of the first embodiment (third example) is an example of the configuration, in which one AD conversion section 302AC is shared between M columns (M vertical signal lines 19; M is an integer of 4 or more), when the solid state imaging device 1 is for monochrome imaging. Moreover, as signal processing, a case where all pixel readout is performed is shown. That is, although two column sharing and three column sharing have been described in the first and second examples, respectively, general expansion of the concept is made in the third example. Hereinafter, the case of a group of (Mn−(M−1))-th column, (Mn−(M−2))-th column, (Mn−(M−3))-th column, . . . , (M−1)-th column, and (Mn)-th column (n is a positive integer of 1 or more) will be described.

The third example is different from the first or second example of the first embodiment in that the comparison section 320, the count operation period control section 330, the count processor 352, and the data storage section 360 are shared between M columns and one of the vertical signal lines 19 of the M columns is connected to the comparison section 320.

From the first or second example, it is possible to infer a method of sharing a number of columns other than two columns or three columns, such as a six column sharing method in which the comparator 322, the counter 353, and the like are shared between six columns. Hereinafter, only a different point from the first and second examples will be described.

As shown in FIG. 10A, each AD conversion section 302AC has an "M input-1 output" type selector 312 (called an M-input selector 317) which selects one from the vertical signal lines 19 of M columns. After the M-input selector 317, the comparator 322, the counter control signal generator 332, the counter 353, and the temporary storage section 358 are disposed in order.

Similar to (1) in FIG. 3A, in order to complete CDS processing with the AD conversion section 302AC for every column, one counter 353 is shared between M columns but the temporary storage section 358 is provided corresponding to each of the M columns. For example, the count data of an (Mn−(M−1))-th column is stored in the temporary storage section 358_1, the count data of an (Mn−(M−2))-th column is stored in the temporary storage section 358_2, the count data of an (Mn−(M−3))-th column is stored in the temporary storage section 358_3, . . . , the count data of an (Mn−1)-th column is stored in the temporary storage section 358_Mn−1, and the count data of an (Mn)-th column is stored in the temporary storage section 358_Mn. Although not shown, the latch 362 may be provided for every column similar to (2) in FIG. 7A in order to realize an example of the configuration corresponding to pipeline horizontal transfer.

An example of the configuration of the counter 353, the temporary storage section 358, and peripheral circuits thereof used in the AD conversion section 302AC of the first embodiment (third example) is not shown. However, as can be seen from the explanation in the second example, it is preferable to provide M temporary storage sections for one digit of M columns. That is, the AD conversion section 302AC preferably has a configuration in which M temporary storage sections 358 are provided in addition to the AD conversion section 302AA as a base, in the circuit block diagram or the detailed block diagram.

Operation

FIG. 10B is a view for explaining operations of AD conversion and CDS processing at the time of all pixel readout in the column AD converter 300AC of the first embodiment (third example) which has an M column sharing configuration. Here, FIG. 10B is a flow chart for explaining the operations of AD conversion and CDS processing at the time of all pixel readout in the column AD converter 300AC of the first embodiment (third example). In short, FIG. 10B is a flow chart for explaining AD conversion and CDS processing after general expansion to M column sharing in FIG. 6A, which shows an all pixel read operation in the case of two column sharing (first example), or FIG. 9A, which shows an all pixel read operation in the case of three column sharing (second example).

First, the shared pixel simultaneous driving method is adopted to simultaneously perform vertical driving of pixels of M columns to be shared even when pixels are shifted from each other. For example, each vertical selection transistor 40 of the unit pixels 3 of 1/M, 2/M, . . . , M/M columns is turned on to read a dark-time signal of each pixel into the vertical signal line 19 (S400). As a result, the reset level Srst of each unit pixel 3 of 1/M, 2/M, . . . , M/M columns appears in each vertical signal line 19.

The counter 353 is initialized (S402_1), and a dark-time signal of the 1/M column is selected by the M-input selector 317 and AD conversion (subtractive AD conversion) of the dark-time signal of the 1/M column is performed in the down-count mode, thereby acquiring an AD conversion result of the dark-time signal (S404_1). Since an AD conversion result of P phase of the 1/M column is obtained as the content of the counter, the counting result is stored in the temporary storage section 358_1 of the 1/M column (S406_1).

The counter 353 is initialized (S402_2), and a dark-time signal of the 2/M column is selected by the M-input selector 317 and AD conversion (subtractive AD conversion) of the dark-time signal of the 2/M column is performed in the down-count mode, thereby acquiring an AD conversion result of the dark-time signal (S404_2). Since an AD conversion result of P phase of the 2/M column is obtained as the content of the counter, the counting result is stored in the temporary storage section 358_2 of the 2/M column (S406_2).

Subsequently, P phase processing until the M/M column is completed in the same manner as described above. For example, for the last M/M column, the counter 353 is initialized (S402_M), and a dark-time signal of the M/M column is selected by the M-input selector 317 and AD conversion (subtractive AD conversion) of the dark-time signal of the M/M column is performed in the down-count mode, thereby acquiring an AD conversion result of the dark-time signal (S404_M). Since an AD conversion result of P phase of the M/M column is obtained as the content of the counter, the counting result is stored in the temporary storage section 358_M of the M/M column (S406_M).

Then, each read selection transistor 34 (transfer gate) of the unit pixels 3 of 1/M, 2/M, . . . , M/M columns is turned on to read a dark-time signal of each pixel into the vertical signal line 19 (S410). As a result, the signal level Ssig of each unit pixel 3 of 1/M, 2/M, . . . , M/M columns appears in each vertical signal line 19.

In the present embodiment, in order to complete CDS processing within columns, an AD conversion result of the light receiving signal is acquired by performing AD conversion (additive AD conversion) of the light receiving signal of each column in the up-count mode with the AD conversion result of the dark-time signal as a start point. In order to do so, in the present embodiment, it is necessary to read (rewrite) the AD conversion result of the dark-time signal into the counter 353 because the AD conversion result of the dark-time signal is temporarily stored in the temporary storage sections 358_1, 358_2, . . . , and 358_M.

For example, the AD conversion result of the P phase of the 1/M column temporarily stored in the temporary storage section 358_1 is first read into the counter 353 (S412_1). Then, an AD conversion result of the light receiving signal is acquired by selecting the light receiving signal of the 1/M column with the M-input selector 317 and performing AD conversion (additive AD conversion) in the up-count mode with the AD conversion result of the dark-time signal as a start point (S414_1). Since an AD conversion result subjected to CDS processing for the 1/M column is obtained as the content of the counter, the counting result is written into the temporary storage section 358_1 of the 1/M column (S416_1).

Similarly, the AD conversion result of the P phase of the 2/M column temporarily stored in the temporary storage section 358_2 is read into the counter 353 (S412_2). Then, an AD conversion result of the light receiving signal is acquired by selecting the light receiving signal of the 2/M column with the M-input selector 317 and performing AD conversion (additive AD conversion) in the up-count mode with the AD conversion result of the dark-time signal as a start point (S414_2). Since an AD conversion result subjected to CDS processing for the 2/M column is obtained as the content of the counter, the counting result is written into the temporary storage section 358_2 of the 2/M column (S416_2).

Subsequently, D phase processing until the M/M column is completed in the same manner as described above. For example, for the last M/M column, the AD conversion result of the P phase of the M/M column temporarily stored in the temporary storage section 358_M is read into the counter 353 (S412_M). Then, an AD conversion result of the light receiving signal is acquired by selecting the light receiving signal of the M/M column with the M-input selector 317 and performing AD conversion (additive AD conversion) in the up-count mode with the AD conversion result of the dark-time signal as a start point (S414_M). Since an AD conversion result subjected to CDS processing for the M/M column is obtained as the content of the counter, the counting result is written into the temporary storage section 358_M of the M/M column (S416_M).

As can be seen from the first or second example of the first embodiment, the processing order shown herein is an example, and the processing may be performed in another order as long as P phase processing of M columns->D phase processing of M columns are satisfied.

Thus, according to the structure of the first embodiment (third example), vertical driving is simultaneously performed for M columns to be shared. Accordingly, settling is simultaneously performed for M columns to be shared. In other words, dark-time signal settling periods sp_1, sp_2, . . . , and sp_M of each column are at the same timing, and light receiving signal settling periods sd_1, sp_2, . . . , and sp_M of each column are at the same timing. Accordingly, logically, the processing time can be shortened by "sp+sd" of (M−1) columns compared with the case where the present embodiment is not adopted.

In the first embodiment (third example), similar to the first or second example of the first embodiment, even when D phase processing is performed after P phase processing is completed for all pixels to be shared, settling can be simultaneously performed in all pixels to be shared and CDS processing can be performed at the time of all pixel readout. Accordingly, the same effects as in the first or second example of the first embodiment can be obtained.

Although a drawing corresponding to FIG. 6B or 9B is not shown, the settling period after dark-time signal switching sp2 occurs in order to change a column to be processed in P phase processing of M columns by the M input selector 317, and the settling period after light receiving signal switching sd2 occurs in order to change a column to be processed in D phase processing of M columns by the M input selector 317. However, the time taken for switching is very short compared with the time taken for settling of the entire vertical signal line 19 (dark-time signal settling period sp or light receiving signal settling period sd). For example, the time taken for switching is 1/5 or less of the time taken for settling of the entire vertical signal line 19. In the settling simultaneous execution method, even if the switching takes time, AD conversion processing can be performed in a short time since the dark-time signal settling period sp and the light receiving signal settling period sd for M columns can be executed at the same timing. Accordingly, in the settling simultaneous execution method adopting the shared pixel simultaneous driving method, the time necessary for completing AD conversion processing for M columns to be shared becomes shorter than that in the case where the shared pixel simultaneous driving method is not adopted.

Moreover, among AD conversion methods within columns, a method of improving the speed by performing AD conversion in two steps is proposed. For example, a technique disclosed in [M. F. Snoeij, P. Donegan, A. J. P. Theuwissen, K. A. A. Makinwa and J. H. Huijsing, "A CMOS image sensor with a column-level multiple-ramp single-slope ADC", Digest ISSCC, pp. 506-618, February 2007] corresponds to it. If such a technique is used, the period of AD conversion becomes short. That is, the dark-time signal countable period cp and the light receiving signal countable period cd in FIG. 6B or 9B becomes short. As a result, in the case where the present embodiment is not applied, the rate of the time taken for settling (dark-time signal settling period sp and light receiving signal settling period sd) relatively increases. For this reason, the effects obtained by the technique of the present embodiment become much larger if the technique disclosed in [M. F. Snoeij, P. Donegan, A. J. P. Theuwissen, K. A. A. Makinwa and J. H. Huijsing, "A CMOS image sensor with a column-level multiple-ramp single-slope ADC", Digest ISSCC, pp. 506-618, February 2007] is used together.

Column Signal Processing

Second Embodiment—All Column Horizontal Additive Readout of a Sharing Unit

First Example

Two Column Sharing & Monochrome

Figure 11A:
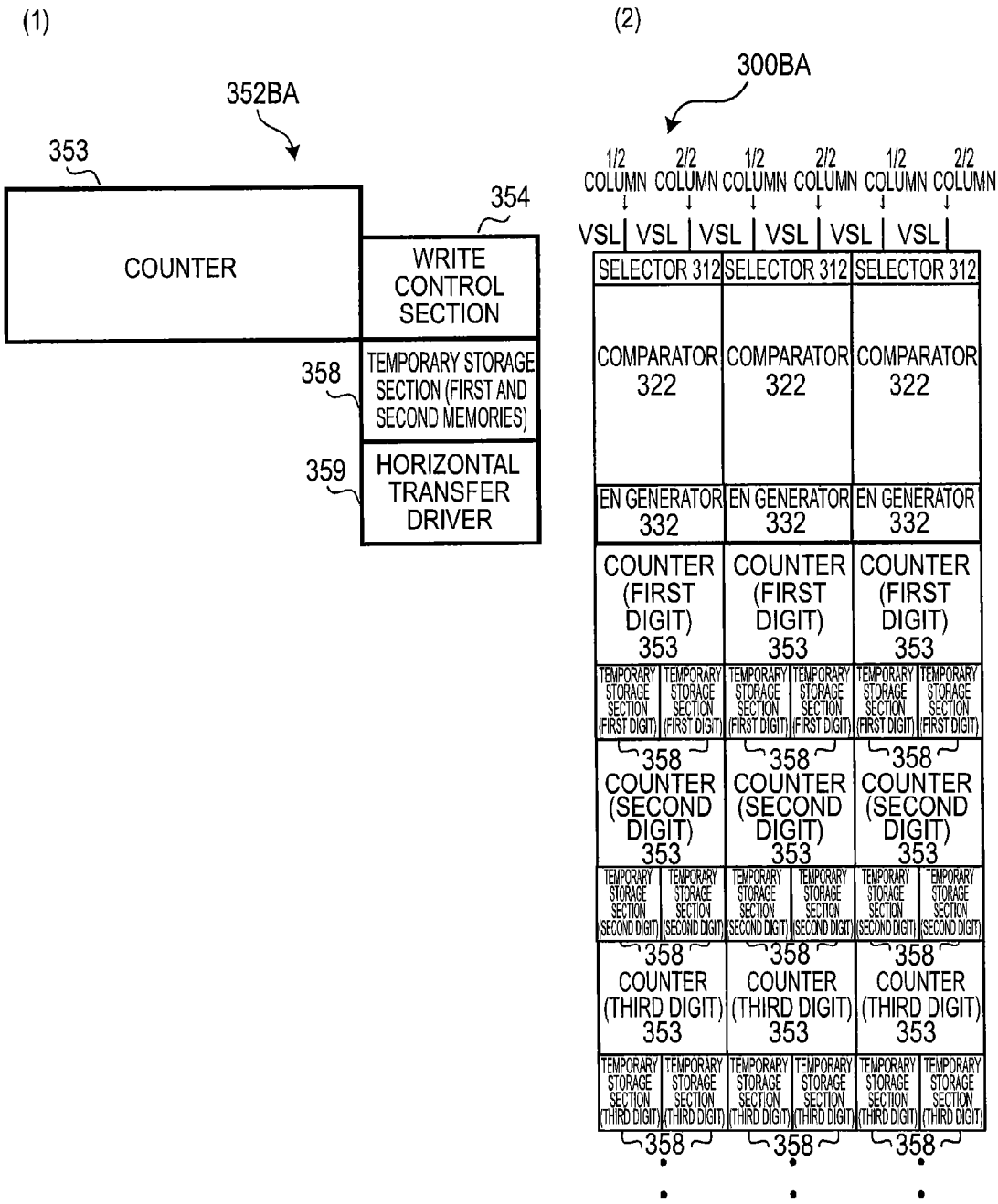
FIG. 11A is a view for explaining a second embodiment (first example) of column signal processing.

FIG. 11A is a view for explaining a second embodiment (first example) of column signal processing. The second embodiment is different from the first embodiment in that additive readout is performed in the horizontal direction in a sharing unit instead of an all pixel readout. Although the second embodiment is similar to a third embodiment, which will be described later, in that additive readout is performed in the horizontal direction, the second embodiment is characterized in that horizontal addition and reading are performed in units of column sharing equally for all columns. This method is called all column horizontal additive readout of a sharing unit.

Here, a column AD converter 300BA of the second embodiment (first example) is an example of the configuration, in which one AD conversion section 302BA is shared between two columns (two vertical signal lines 19), when the solid state imaging device 1 is for monochrome imaging. Moreover, as signal processing, a case where all column horizontal additive readout of a sharing unit is performed is shown.

FIG. 11A shows a simple configuration of the column AD converter 300BA of the second embodiment (first example) in order to make the operation easily understood. As shown in FIG. 11A, in the count processor 352BA of the column AD converter 300BA, the counter 353 and the temporary storage section 358 are disposed in order for the vertical signal lines 19 of two columns ((2n−1)-th column and (2n)-th column). Moreover, in order to complete CDS processing with the count processor 352BA for every column, one counter 353 is shared between two columns but the temporary storage section 358 (first and second memories) is provided corresponding to each of the two columns. Although not shown in (1) in FIG. 11A, the two-input selector 313 (switch) which selects one from two vertical signal lines 19, the comparator 322, and the counter control signal generator 332 are provided before the counter 353 as shown in (2) in FIG. 11A. Moreover, although not shown in the drawing, the latch 362 may be provided for every column in order to realize an example of the configuration corresponding to pipeline horizontal transfer.

The count processor 352BA is slightly different from that in the first embodiment (first example). Here, as a configuration corresponding to only the all column horizontal additive readout of a sharing unit, the count processor 352BA does not include the rewrite control section 356 (described as "not necessary" in the drawing). In addition, the complementary data is preferably supplied to the horizontal transfer driver 359 after AD conversion processing, and the write control section 354 or the temporary storage section 358 does not have to be the same as that in the first embodiment (first example). Moreover, since P phase processing for a plurality of columns and D phase processing for a plurality of rows can be continuously performed, a configuration may also be adopted in which neither the write control section 354 nor the temporary storage section 358 is provided. In practice, it is preferable to be able to meet all pixel readout of the first embodiment (first example), and it is also preferable to use the count processor 352BA having the same configuration as in the first embodiment (first example).

That is, it is preferable that the configuration itself of the count processor 352BA of the second embodiment (first example) is the same as that of the count processor 352AA of the first embodiment (first example). Although the configuration of the count processor 352AA of the second embodiment (first example) in this case is not shown specifically, it is preferably the same configuration as the count processor 352AA of the first embodiment (first example) shown in FIGS. 3A, 4B, and 4C, for example.

Operation

Figure 11B:
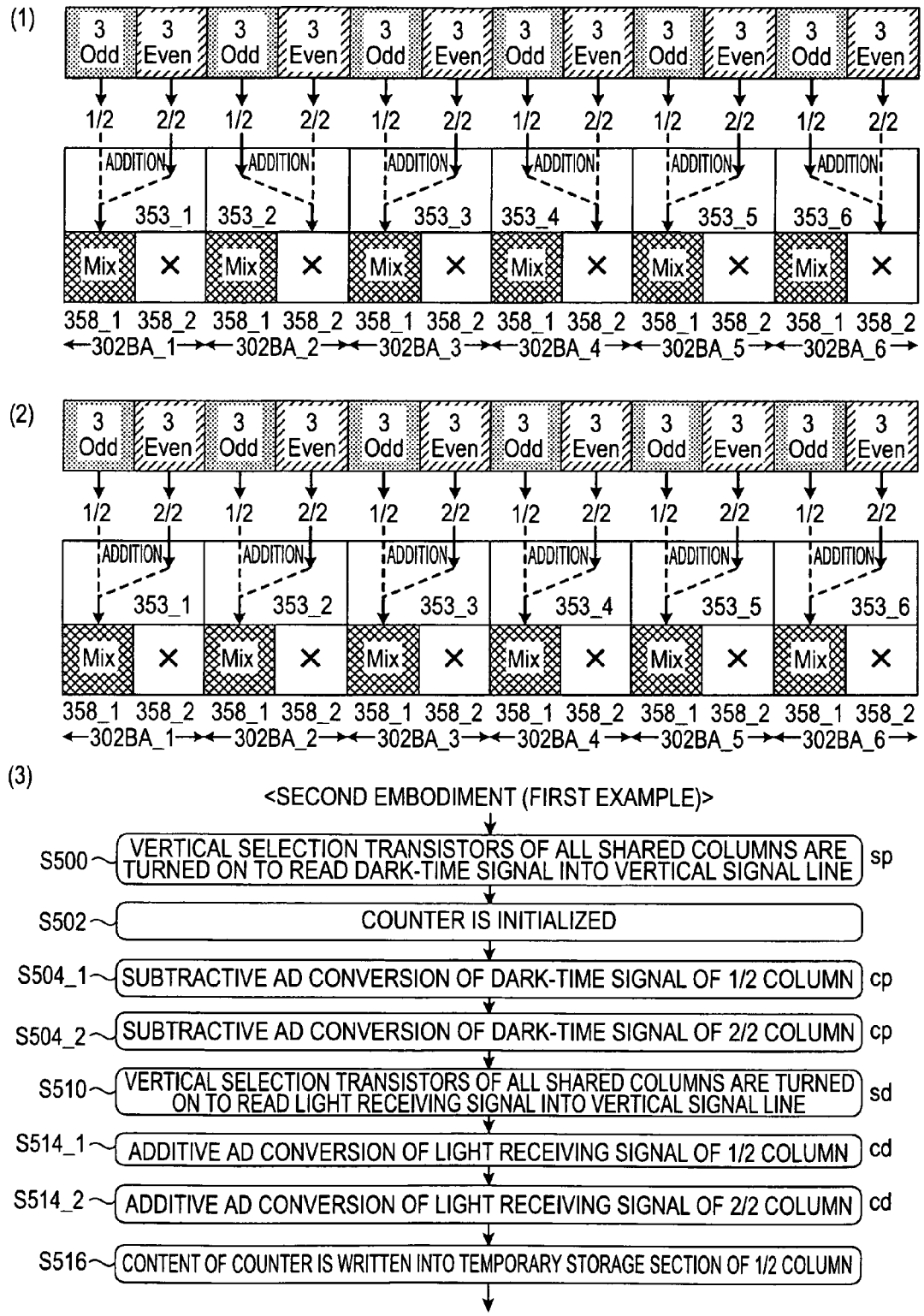
FIG. 11B is a flow chart for explaining the operations of AD conversion and CDS processing at the time of all pixel readout in a column AD converter of the second embodiment (first example)

FIG. 11B is a view for explaining operations of AD conversion and CDS processing at the time of all column horizontal additive readout of a sharing unit (called two-column horizontal additive processing) in the column AD converter 300BA of the second embodiment (first example) which has a two column sharing configuration. (1) and (2) in FIG. 11B show the outline of the flow of a signal. (3) in FIG. 11B is a flow chart showing an example of the operation procedure.

The second embodiment (first example) is a case of two column sharing, and procedures of AD conversion and CDS processing when adding two pixels arrayed in the horizontal direction are shown. Most of the operation in the second embodiment (first example) is the same as that in the first embodiment (first example) in which all pixel readout is performed. The difference from the first embodiment (first example) in which all pixel readout is performed is due to adding the processing result of a (2n)-th column to a processing result of a (2n−1)-th column. The second embodiment (first example) is largely different from the first embodiment (first example) in that the processing of temporarily storing a P phase processing result in the temporary storage sections 358_1 and 358_2 and of reading the temporarily stored data at the time of D phase processing is not necessary because addition processing is performed. In addition, the second embodiment (first example) is different from the first embodiment (first example) in that processing for resetting of the counter at the time of P phase processing of the (2n)-th column is not necessary.

Basically, two kinds of methods for two-column horizontal additive processing may be considered. The difference is based on in which of the temporary storage section 358_1 for a (2n−1)-th column and the temporary storage section 358_2 for a (2n)-th column the addition result of horizontal two columns is to be stored. In this case, each AD conversion section 302BA can use any one of them substantially.

For example, as shown in (1) in FIG. 11B, the case may be considered in which an AD conversion section 302BA_o (o is an odd number) (302BA_1, 302BA_3, ...) stores an addition result in the temporary storage section 358_1 and an AD conversion section 302BA_e (e is an even number) (302BA_2, 302BA_4, ...) stores an addition result in the temporary storage section 358_2. Moreover, as shown in (2) in FIG. 11B, the case may also be considered in which all AD conversion sections 302BA store addition results only in the temporary storage section 358_1 or only in the temporary storage section 358_2 (in the drawing, the temporary storage section 358_1). Moreover, although not shown in the drawing, the case may also be considered in which storage sections that store addition results are divided into pieces.

An operation of the second embodiment (first example) will be described with reference to (3) in FIG. 11B.

First, similar to the first embodiment, the shared pixel simultaneous driving method is adopted to simultaneously perform vertical driving of pixels of two columns to be shared even when pixels are shifted from each other. For example, each vertical selection transistor 40 of the unit pixels 3 (first and second pixels) of 1/2 and 2/2 columns is turned on to read a dark-time signal into vertical signal lines 19_2n−1 and 19_2n (S500). As a result, the reset level Srst of each unit pixel 3 of 1/2 and 2/2 columns appears in the vertical signal lines 19_2n−1 and 19_2n.

The counter 353 is initialized (S502), and a dark-time signal of the 1/2 column is selected by the two-input selector 313 and AD conversion (subtractive AD conversion) of the dark-time signal of the 1/2 column is performed in the down-count mode, thereby acquiring an AD conversion result of the dark-time signal (S504_1).

Then, a dark-time signal of the 2/2 column is selected by the two-input selector 313 without initializing the counter 353 and AD conversion (subtractive AD conversion) of the dark-time signal of the 2/2 column is performed in the down-count mode with the AD conversion result of the dark-time signal of the 1/2 column as a start point, thereby acquiring an AD conversion result of the dark-time signal (S504_2). As the content of the counter, an AD conversion result based on the sum of P phases of the 1/2 and 2/2 columns is obtained.

Then, each read selection transistor 34 (transfer gate) of the unit pixels 3 (first and second pixels) of the 1/2 and 2/2 columns is turned on to read a light receiving signal into the vertical signal lines 19_2n−1 and 19_2n (S510). As a result, the signal level Ssig of each unit pixel 3 of the 1/2 and 2/2 columns appears in the vertical signal lines 19_2n−1 and 19_2n.

Then, a light receiving signal of the 1/2 column is selected by the two-input selector 313 without initializing the counter 353 and AD conversion (additive AD conversion) of the light receiving signal of the 1/2 column is performed in the up-count mode with the AD conversion result of the dark-time signal based on the sum of P phases of the 1/2 and 2/2 columns as a start point, thereby acquiring an AD conversion result of the dark-time signal (S514_1). As the content of the counter, an AD conversion result based on the sum of the P phases of the 1/2 and 2/2 columns and the D phase of the 1/2 column is obtained.

Then, a light receiving signal of the 2/2 column is selected by the two-input selector 313 without initializing the counter 353 and AD conversion (additive AD conversion) of the light receiving signal of the 2/2 column is performed in the up-count mode with the AD conversion result, which is based on the sum of the P phases of the 1/2 and 2/2 columns and the D phase of the 1/2 column, as a start point, thereby acquiring an AD conversion result of the light receiving signal (S514_2). Since the AD conversion result subjected to CDS processing for the 1/2 and 2/2 columns is obtained as the content of the counter, the count result is written into one (for example, the temporary storage section 358_1 for a 1/2 column) of the temporary storage sections 358_1 and 358_2 (S516).

As can be seen from the first embodiment, the processing order shown herein is an example, and the processing may be performed in another order as long as P phase processing of two columns->D phase processing of two columns are satisfied.

Thus, according to the structure of the second embodiment (first example), vertical driving is simultaneously performed for two columns to be shared. Accordingly, settling is simultaneously performed for two columns to be shared. In other words, a dark-time signal settling period sp_1 of the 1/2 column and a dark-time signal settling period sp_2 of the 2/2 column are at the same timing, and a light receiving signal settling period sd_1 of the 1/2 column and a light receiving signal settling period sd_2 of the 2/2 column are at the same timing. Accordingly, logically, the processing time can be shortened by "sp+sd" of one column compared with the case where the present embodiment is not adopted.

In the present embodiment, addition of two pixels arrayed in the horizontal direction is performed. Accordingly, it is not necessary to temporarily store the AD conversion result of the dark-time signal in the temporary storage section 358 or to rewrite the temporarily stored data into the counter 353 during a period for which AD conversion of a light receiving signal of a pixel to be processed is performed after AD conversion of a dark-time signal of the pixel to be processed is performed. Initialization or reading the temporary storage section 358 is not performed in the course of processing, and P phase processing and D phase processing for two columns are continued in a state where the content of the counter 353 is held. Accordingly, even when D phase processing is performed after P phase processing is completed for all pixels to be shared, settling can be simultaneously performed in all pixels to be shared and CDS processing can be performed at the time of horizontal additive readout in a sharing unit.

Thus, in the structure of the second embodiment (first example), the column AD converter 300BA can perform addition processing of two columns, which are arrayed in the horizontal direction, in the horizontal addition mode. Accordingly, for example, the amount of information which is output in the horizontal direction can be reduced to 1/2 while maintaining the sensitivity. As a result, it is possible to improve the frame rate or to reduce the power consumption.

Moreover, although the structure for pixel addition in the vertical direction is known in the column AD conversion processing, two-pixel addition (four-pixel addition in total) in both the horizontal and vertical directions may be realized, for example, if two-column vertical addition processing is performed together within the column AD converter 300BA by applying the technique. In this case, the frame rate can be further improved. In the case where the two-column vertical addition processing is performed together, for example, the temporary storage sections 358_1 and 358_2 which store addition results may be switched in units of two rows so that the addition center is even in a two-dimensional space (also in the vertical direction).

Second Example

Three Column Sharing & Monochrome

Figure 12A:
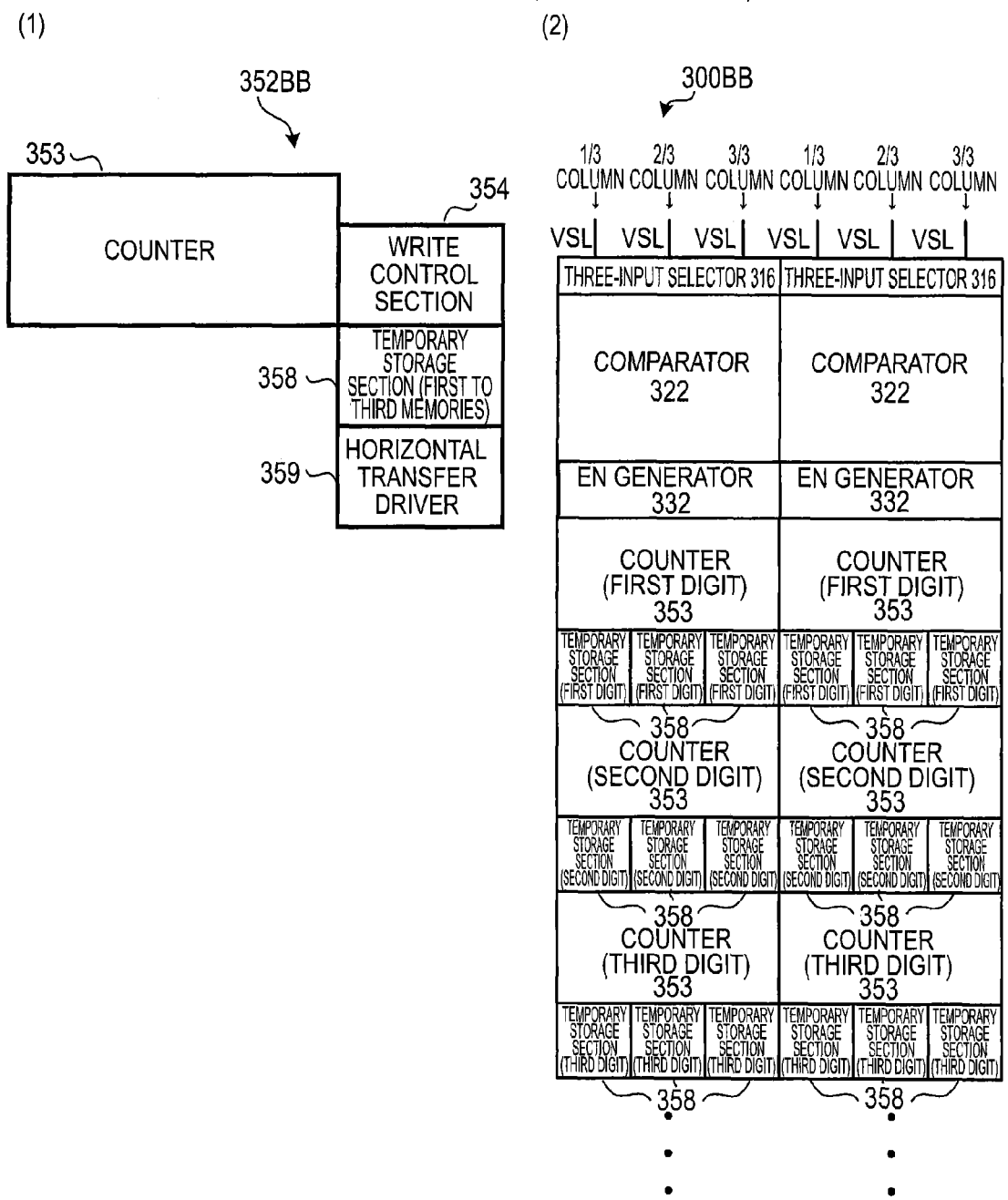
FIG. 12A is a view for explaining the second embodiment (second example) of column signal processing.

FIG. 12A is a view for explaining the second embodiment (second example) of column signal processing.

A column AD converter 300BB of the second embodiment (second example) is an example of the configuration, in which one AD conversion section 302BB is shared between three columns (three vertical signal lines 19), when the solid state imaging device 1 is for monochrome imaging. Moreover, as signal processing, a case where all column horizontal additive readout of a sharing unit is performed is shown.

FIG. 12A shows a simple configuration of the column AD converter 300BB of the second embodiment (second example) in order to make the operation easily understood. As shown in FIG. 12A, in a count processor 352BB of the column AD converter 300BB, the counter 353 and the temporary storage section 358 are disposed in order for the vertical signal lines 19 of three columns ((3n−2)-th column, (3n−1)-th column, and (3n)-th column). Moreover, in order to complete CDS processing with the AD conversion section 302BB for every column, one counter 353 is shared between three columns but the temporary storage section 358 (first to third memories) is provided corresponding to each of the three columns. Although not shown in (1) in FIG. 12A, the three-input selector 316 which selects one from three vertical signal lines 19, the comparator 322, and the counter control signal generator 332 are provided before the counter 353 as shown in (2) in FIG. 12A. Moreover, although not shown in the drawing, the latch 362 may be provided for every column in order to realize an example of the configuration corresponding to pipeline horizontal transfer.

Similar to the second embodiment (first example), the count processor 352BB does not include the rewrite control section 356 (described as "not necessary" in the drawing). For example, the count processor 352BB may be configured not to include the write control section 354 or the temporary storage section 358. In practice, it is preferable to be able to meet all pixel readout of the first embodiment (second example), and it is also preferable to use the count processor 352BB having the same configuration as in the first embodiment (second example).

That is, it is preferable that the configuration itself of the count processor 352BB of the second embodiment (second example) is the same as that of the count processor 352AB of the first embodiment (second example). Although the configuration of the count processor 352BB used in the AD conversion section 302BB of the second embodiment (second example) is not shown specifically, it is preferably the same configuration as the count processor 352AB of the first embodiment (second example) shown in FIGS. 8A and 8B, for example.

Operation

FIG. 12B is a view for explaining operations of AD conversion and CDS processing at the time of all column horizontal additive readout of a sharing unit (called three-column horizontal additive processing) in the column AD converter 300BB of the second embodiment (second example) which has a three column sharing configuration. FIG. 12B is a flow chart showing an example of the operation procedure.

The second embodiment (second example) is a case of three column sharing, and procedures of AD conversion and CDS processing when adding three pixels arrayed in the horizontal direction are shown. Most of the operation in the second embodiment (second example) is the same as that in the first embodiment (second example) in which all pixel readout is performed. The difference from the first embodiment (second example) in which all pixel readout is performed is due to adding the processing result of a (3n−2)-th column, a processing result of a (3n−1)-th column, and a processing result of a (3n)-th column. The second embodiment (second example) is largely different from the first embodiment (second example) in that the processing of temporarily storing a P phase processing result in the temporary storage sections 358_1, 358_2, and 358_3 and of reading the temporarily stored data at the time of D phase processing is not necessary because addition processing is performed. In addition, the second embodiment (second example) is different from the first embodiment (second example) in that processing for resetting of the counter at the time of P phase processing of the (3n−1)-th or (3n)-th column is not necessary.

Basically, three kinds of methods for three-column horizontal additive processing may be considered. The difference is based on in which of the temporary storage section 358_1 for a (3n−2)-th column, the temporary storage section 358_2 for a (3n−1)-th column, and the temporary storage section 358_3 for a (3n)-th column the addition result of horizontal three columns is to be stored. In this case, each AD conversion section 302BB can use any one of them substantially.

For example, although not shown in the drawing, the case may be considered in which an AD conversion section 302BA a (α=3k−2; k is a positive integer of 1 or more) (302BA_1, 302BA_4, . . . ) stores an addition result in the temporary storage section 358_1, an AD conversion section 302BA_β (β=3k−1) (302BA_2, 302BA_5, . . . ) stores an addition result in the temporary storage section 358_2, and an AD conversion section 302BA_γ (γ=3k) (302BA_3, 302BA_6, . . . ) stores an addition result in the temporary storage section 358_3. This is the case where storage sections, which store addition results, are shifted sequentially. In addition, the case may also be considered in which all AD conversion sections 302BA store addition results only in the temporary storage section 358_1 or only in the temporary storage section 358_2 or only in the temporary storage section 358_3. Moreover, although not shown in the drawing, the case may also be considered in which storage sections that store addition results are divided into pieces.

An operation of the second embodiment (second example) will be described with reference to FIG. 12B.

First, similar to the first embodiment, the shared pixel simultaneous driving method is adopted to simultaneously perform vertical driving of pixels of three columns to be shared even when pixels are shifted from each other. For example, each vertical selection transistor 40 of the unit pixels 3 of 1/3, 2/3, and 3/3 columns is turned on to read a dark-time signal of each pixel into the vertical signal line 19 (S600). As a result, the reset level Srst of each unit pixel 3 of 1/3, 2/3, and 3/3 columns appears in each vertical signal line 19.

The counter 353 is initialized (S602), and a dark-time signal of the 1/3 column is selected by the three-input selector 316 and AD conversion (subtractive AD conversion) of the dark-time signal of the 1/3 column is performed in the down-count mode, thereby acquiring an AD conversion result of the dark-time signal (S604_1).

Then, a dark-time signal of the 2/3 column is selected by the three-input selector 316 without initializing the counter 353 and AD conversion (subtractive AD conversion) of the dark-time signal of the 2/3 column is performed in the down-count mode with the AD conversion result of the dark-time signal of the 1/3 column as a start point, thereby acquiring an AD conversion result of the dark-time signal (S604_2). As the content of the counter, an AD conversion result based on the sum of P phases of the 1/3 and 2/3 columns is obtained.

Then, a dark-time signal of the 3/3 column is selected by the three-input selector 316 without initializing the counter 353 and AD conversion (subtractive AD conversion) of the dark-time signal of the 3/3 column is performed in the down-count mode with the AD conversion result of the dark-time signal based on the sum of P phases of the 1/3 and 2/3 columns as a start point, thereby acquiring an AD conversion result of the dark-time signal (S6043). As the content of the counter, an AD conversion result based on the sum of P phases of all columns to be shared is obtained.

Then, each read selection transistor 34 (transfer gate) of the unit pixels 3 of 1/3, 2/3, and 3/3 columns is turned on to read a light receiving signal into each vertical signal line 19 (S610). As a result, the signal level Ssig of each unit pixel 3 of 1/3, 2/3, and 3/3 columns appears in each vertical signal line 19.

Then, a light receiving signal of the 1/3 column is selected by the three-input selector 316 without initializing the counter 353 and AD conversion (additive AD conversion) of the light receiving signal of the 1/3 column is performed in the up-count mode with the AD conversion result of the dark-time signal based on the sum of P phases of all columns to be shared as a start point, thereby acquiring an AD conversion result of the dark-time signal (S614_1). As the content of the counter, an AD conversion result based on the sum of the P phases of all columns to be shared and the D phase of the 1/3 column is obtained.

Then, a light receiving signal of the 2/3 column is selected by the three-input selector 316 without initializing the counter 353 and AD conversion (additive AD conversion) of the light receiving signal of the 2/3 column is performed in the up-count mode with the AD conversion result, which is based on the sum of the P phases of all columns and the D phase of the 1/3 column, as a start point, thereby acquiring an AD conversion result of the light receiving signal (S614_2). As the content of the counter, an AD conversion result, which is based on the sum of the P phases of all columns to be shared and the D phases of the 1/3 and 2/3 columns, is obtained.

Then, a light receiving signal of the 3/3 column is selected by the three-input selector 316 without initializing the counter 353 and AD conversion (additive AD conversion) of the light receiving signal of the 3/3 column is performed in the up-count mode with the AD conversion result, which is based on the sum of the P phases of all columns and the D phases of the 1/3 and 2/3 columns, as a start point, thereby acquiring an AD conversion result of the light receiving signal (S614_3). Since the sum of P phases of all columns to be shared and D phases of all columns to be shared is obtained as the content of the counter and the AD conversion result subjected to CDS processing for all columns to be shared is obtained, the count result is written into one (for example, the temporary storage section 358_1 for a 1/3 column) of the temporary storage sections 358_1, 358_2, and 358_3 (S616).

As can be seen from the first embodiment, the processing order shown herein is an example, and the processing may be performed in another order as long as P phase processing of three columns->D phase processing of three columns are satisfied.

Thus, according to the structure of the second embodiment (second example), vertical driving is simultaneously performed for three columns to be shared. Accordingly, settling is simultaneously performed for three columns to be shared. In other words, dark-time signal settling periods sp_1, sp_2, and sp_3 of three columns to be shared are at the same timing, and light receiving signal settling periods sd_1, sd_2, and sd_3 of the three columns to be shared are at the same timing. Accordingly, logically, the processing time can be shortened by "sp+sd" of two columns compared with the case where the present embodiment is not adopted.

In the present embodiment, addition of three pixels arrayed in the horizontal direction is performed. Accordingly, it is not necessary to temporarily store the AD conversion result of the dark-time signal in the temporary storage section 358 or to rewrite the temporarily stored data into the counter 353 during a period for which AD conversion of a light receiving signal of a pixel to be processed is performed after AD conversion of a dark-time signal of the pixel to be processed is performed. Initialization or reading the temporary storage section 358 is not performed in the course of processing, and P phase processing and D phase processing for three columns are continued in a state where the content of the counter 353 is held. Accordingly, even when D phase processing is performed after P phase processing is completed for all pixels to be shared, settling can be simultaneously performed in all pixels to be shared and CDS processing can be performed at the time of horizontal additive readout in a sharing unit.

Thus, in the structure of the second embodiment (second example), the column AD converter 300BB can perform addition processing of three columns, which are arrayed in the horizontal direction, in the horizontal addition mode. Accordingly, for example, the amount of information which is output in the horizontal direction can be reduced to 1/3 while maintaining the sensitivity. As a result, it is possible to improve the frame rate or to reduce the power consumption. The effect is better than the second embodiment (first example).

Moreover, if three-column vertical addition processing is performed together within the column AD converter 300BB, three-pixel addition (nine-pixel addition in total) in both the horizontal and vertical directions can be realized. In this case, the frame rate can be further improved. The effect is better than the second embodiment (first example). In the case where the three-column vertical addition processing is performed together, for example, the temporary storage sections 358_1, 358_2, and 358_3 which store addition results may be switched in units of three rows so that the addition center is even in a two-dimensional space (also in the vertical direction).

Third Example

M Column Sharing & Monochrome

FIG. 13A is a view for explaining the second embodiment (third example) of column signal processing.

A column AD converter 300BC of the second embodiment (third example) is an example of the configuration, in which one AD conversion section 302BC is shared between M columns (M vertical signal lines 19; M is an integer of 4 or more), when the solid state imaging device 1 is for monochrome imaging. That is, although two column sharing and three column sharing have been described in the first and second examples, respectively, general expansion of the concept is made in the third example. Moreover, as signal processing, a case where all column horizontal additive readout of a sharing unit is performed is shown.

FIG. 13A shows a simple configuration of the column AD converter 300BC of the second embodiment (third example) in order to make the operation easily understood. As shown in FIG. 13A, in a count processor 352BC of the column AD converter 300BC, the counter 353 and the temporary storage section 358 are disposed in order for the vertical signal lines 19 of M columns ((Mn−(M−1))-th column, (Mn−(M−2))-th column, (Mn−(M−3))-th column, . . . , (Mn−1)-th column, and (Mn)-th column; n is a positive integer of 1 or more). Moreover, in order to complete CDS processing with the count processor 352BC for every column, one counter 353 is shared between M columns but the temporary storage section 358 is provided corresponding to each of the M columns. Although not shown in the drawing, the M-input selector 317 which selects one from M vertical signal lines 19, the comparator 322, and the counter control signal generator 332 are provided before the counter 353. Moreover, although not shown in the drawing, the latch 362 may be provided for every column in order to realize an example of the configuration corresponding to pipeline horizontal transfer.

Similar to the second embodiment (first and second examples), the count processor 352BC does not include the rewrite control section 356 (described as "not necessary" in the drawing). For example, the count processor 352BC may be configured not to include the write control section 354 or the temporary storage section 358. In practice, it is preferable to be able to meet all pixel readout of the first embodiment (third example), and it is also preferable to use the count processor 352BC having the same configuration as in the first embodiment (third example).

That is, it is preferable that the configuration itself of the count processor 352BC of the second embodiment (third example) is the same as that of the count processor 352AC of the first embodiment (third example). It is preferable to provide M temporary storage sections 358 in addition to the AD conversion section 302AA as a base, in the circuit block diagram or the detailed block diagram of the count processor 352BC used in the AD conversion section 302BC of the second embodiment (third example).

Operation

FIG. 13B is a view for explaining operations of AD conversion and CDS processing at the time of all column horizontal additive readout of a sharing unit (called M-column horizontal additive processing) in the column AD converter 300BC of the second embodiment (third example) which has an M column sharing configuration. The second embodiment (third example) is a case of M column sharing, and procedures of AD conversion and CDS processing when adding M pixels arrayed in the horizontal direction are shown.

First, similar to the first embodiment, the shared pixel simultaneous driving method is adopted to simultaneously perform vertical driving of pixels of M columns to be shared even when pixels are shifted from each other. For example, each vertical selection transistor 40 of the unit pixels 3 of 1/M, 2/M, . . . , M/M columns is turned on to read a dark-time signal into the vertical signal line 19 (S700). As a result, the reset level Srst of the unit pixel 3 of each column appears in each vertical signal line 19.

The counter 353 is initialized (S702), and a dark-time signal of the 1/M column is selected by the M-input selector 317 and AD conversion (subtractive AD conversion) of the dark-time signal of the 1/M column is performed in the down-count mode, thereby acquiring an AD conversion result of the dark-time signal (S704_1).

Then, a dark-time signal of the 2/M column is selected by the M-input selector 317 without initializing the counter 353 and AD conversion (subtractive AD conversion) of the dark-time signal of the 2/M column is performed in the down-count mode with the AD conversion result of the dark-time signal of the 1/M column as a start point, thereby acquiring an AD conversion result of the dark-time signal (S704_2). As the content of the counter, an AD conversion result based on the sum of P phases of the 1/M and 2/M columns is obtained.

Subsequently, P phase processing until the M/M column is completed in the same manner as described above. For example, for the last M/M column, a dark-time signal of the M/M column is selected by the M-input selector 317 without initializing the counter 353 and AD conversion (subtractive AD conversion) of the dark-time signal of the M/M column is performed in the down-count mode with the AD conversion result of the dark-time signal based on the sum of P phases of all columns excluding the M/M column as a start point, thereby acquiring an AD conversion result of the dark-time signal (S704_M). As the content of the counter, an AD conversion result based on the sum of P phases of all columns to be shared is obtained.

Then, each read selection transistor 34 (transfer gate) of the unit pixels 3 of 1/M, 2/M, ..., M/M columns is turned on to read a dark-time signal into the vertical signal line 19 (S710). As a result, the signal level Ssig of the unit pixel 3 of each column appears in each vertical signal line 19.

Then, a light receiving signal of the 1/M column is selected by the M-input selector 317 without initializing the counter 353 and AD conversion (additive AD conversion) of the light receiving signal of the 1/M column is performed in the up-count mode with the AD conversion result of the dark-time signal based on the sum of P phases of all columns to be shared as a start point, thereby acquiring an AD conversion result of the dark-time signal (S714_1). As the content of the counter, an AD conversion result based on the sum of the P phases of all columns to be shared and the D phase of the 1/M column is obtained.

Then, a light receiving signal of the 2/M column is selected by the M-input selector 317 without initializing the counter 353 and AD conversion (additive AD conversion) of the light receiving signal of the 2/M column is performed in the up-count mode with the AD conversion result, which is based on the sum of the P phases of all columns and the D phase of the 1/M column, as a start point, thereby acquiring an AD conversion result of the light receiving signal (S714_2). As the content of the counter, an AD conversion result, which is based on the sum of the P phases of all columns to be shared and the D phases of the 1/M and 2/M columns, is obtained.

Subsequently, D phase processing until the M/M column is completed in the same manner as described above. For example, for the last M/M column, a light receiving signal of the M/M column is selected by the M-input selector 317 without initializing the counter 353 and AD conversion (additive AD conversion) of the light receiving signal of the M/M column is performed in the up-count mode with the AD conversion result, which is based on the sum of the P phases of all columns and the D phase of each column excluding the M/M column, as a start point, thereby acquiring an AD conversion result of the light receiving signal (S714_M). Since the sum of P phases of all columns to be shared and D phases of all columns to be shared is obtained as the content of the counter and the AD conversion result subjected to CDS processing for all columns to be shared is obtained, the count result is written into one (for example, the temporary storage section 358_1 for a 1/M column) of the temporary storage sections 358_1, 358_2, ..., and 358_3 (S716).

As can be seen from the first embodiment, the processing order shown herein is an example, and the processing may be performed in another order as long as P phase processing of M columns->D phase processing of M columns are satisfied.

Thus, according to the structure of the second embodiment (third example), vertical driving is simultaneously performed for M columns to be shared. Accordingly, settling is simultaneously performed for M columns to be shared. In other words, dark-time signal settling periods sp_1, sp_2, ..., and sp_M of M columns to be shared are at the same timing, and light receiving signal settling periods sd_1, sd_2, ..., and sd_M of the M columns to be shared are at the same timing. Accordingly, logically, the processing time can be shortened by "sp+sd" of (M−1) columns compared with the case where the present embodiment is not adopted.

In the present embodiment, addition of M pixels arrayed in the horizontal direction is performed. Accordingly, it is not necessary to temporarily store the AD conversion result of the dark-time signal in the temporary storage section 358 or to rewrite the temporarily stored data into the counter 353 during a period for which AD conversion of a light receiving signal of a pixel to be processed is performed after AD conversion of a dark-time signal of the pixel to be processed is performed. Initialization or reading the temporary storage section 358 is not performed in the course of processing, and P phase processing and D phase processing for M columns are continued in a state where the content of the counter 353 is held. Accordingly, even when D phase processing is performed after P phase processing is completed for all pixels to be shared, settling can be simultaneously performed in all pixels to be shared and CDS processing can be performed at the time of horizontal additive readout in a sharing unit.

In the structure of the second embodiment (third example), the column AD converter 300BC can perform addition processing of M columns, which are arrayed in the horizontal direction, in the horizontal addition mode. Accordingly, for example, the amount of information which is output in the horizontal direction can be reduced to 1/M while maintaining the sensitivity. As a result, it is possible to improve the frame rate or to reduce the power consumption. The effect is better than the second embodiment (second example).

Moreover, if M-column vertical addition processing is performed together within the column AD converter 300BC, M-pixel addition ("M×M" pixel addition in total) in both the horizontal and vertical directions can be realized. In this case, the frame rate can be further improved. The effect is better than the second embodiment (second example). In the case where the M-column vertical addition processing is performed together, for example, the temporary storage sections 358_1, 358_2, ..., and 358_M which store addition results may be switched in units of M rows so that the addition center is even in a two-dimensional space (also in the vertical direction).

Fourth Example

Two Column Sharing & Color

FIG. 14A is a view for explaining the second embodiment (fourth example) of column signal processing.

A column AD converter 300BD of the first embodiment (fourth example) is an example of the configuration, in which one AD conversion section 302BD is shared between two columns (two vertical signal lines 19), when the solid state imaging device 1 is for color imaging. Moreover, as signal processing, a case where all column horizontal additive readout of a sharing unit is performed is shown.

On the light receiving surface on which an electromagnetic wave (in this example, light) of each charge generator in the pixel array section 10 is incident, one color filter of a color separation filter, which is formed by the combination of color filters corresponding to a plurality of colors for imaging a color image, is provided. Various color arrangements are known as the color arrangement of a color separation filter used for color imaging. Here, a basic form of the Bayer arrangement will be representatively described.

In the example shown in FIG. 14A, a basic color filter based on the Bayer arrangement is used. Repeated units of a color separation filter are arrayed in "2×2" pixels so that unit pixels 3 arrayed in the shape of a square lattice correspond to color filters of three colors of R (red), G (green), and B (blue), thereby forming the pixel array section 10. In the row direction, G adjacent to R is denoted as Gr and G adjacent to B is denoted as Gb.

First color pixels for sensing a first color (red; R) are arrayed on odd-row and odd-column positions, and second color pixels for sensing a second color (green; Gr) are arrayed on odd-row and even-column positions. In addition, third color pixels for sensing a third color (green; Gb) are arrayed on even-row and odd-column positions, and fourth color pixels for sensing a fourth color (blue; B) are arrayed on even-row and even-column positions. Both the second colors (green; Gr) and the third color (green; Gb) are the same as G color. In this manner, since color pixels of two colors of R/Gr or Gb/B, which are different for every rows, are arrayed in the checker shape, the pixel array section 10 in a solid state imaging device 1AD of the first embodiment (fourth example) can be made to meet color imaging. In such a color arrangement of the basic color filter based on the Bayer arrangement, two colors of R/Gr or Gb/B are repeated every two units in both the row and column directions.

Here, if an odd column and an even column adjacent thereto are simply shared like the monochrome case when a column sharing method is applied to the column AD converter 300 for such color imaging, a problem of color mixture occurs when performing pixel addition in the horizontal direction.

Therefore, in the second embodiment (fourth example), the unit pixels 3 with the same color are shared in order to avoid the color mixture problem at the time of pixel addition in the case of color imaging. Specifically, as shown in FIG. 14A, the vertical signal line 19 and the two-input selector 313 of the vertical line selecting section 310 are wired so that nearest odd columns ((2n−1)-th column and (2n+1)-th column), in which R pixels or Gb pixels are arrayed, or nearest even columns ((2n)-th column and (2n+2)-th column), in which Gr pixels or B pixels are arrayed, are shared. The two-input selector 313 selects columns (odd columns or even columns) in which two of the unit pixels 3 with the same color are connected to each other.

Also in the second embodiment (fourth example), similar to the second embodiment (first example), addition processing of two columns arrayed in the horizontal direction can be performed in the horizontal addition mode. As a result, since the amount of information which is output in the horizontal direction can be reduced to 1/2 while maintaining the sensitivity, it is possible to improve the frame rate or to reduce the power consumption. Moreover, if two-column vertical addition processing is performed together, two-pixel addition (four-pixel addition in total) in both the horizontal and vertical directions can be realized. In this case, the frame rate can be further improved.

Moreover, regarding in which temporary storage section 358 the addition results are to be stored, there are a method of changing temporary storage sections alternately, a method of dividing temporary storage sections into pieces, and a method of storing the addition results in only one temporary storage section, as can be seen from the explanation in the first example.

In the case of color imaging, originally, it is preferable that colors of pixels after addition are in the same state as the arrangement state in the original color separation filter, regarding the spatial distance (spatial position) relationship. That is, colors of the representative coordinate points of a final image are made equal to colors of the original filter arrangement. At least in the case of the basic form of the Bayer arrangement, however, this is not guaranteed in the two column sharing. This is, in and of itself, not preferable.

For example, a pixel signal voltage of an R pixel of the first column and a pixel signal voltage of an R pixel of the third column are converted into digital data by processing of the counter 353 of the AD conversion section 302_1 or the like, and the addition result is stored in the temporary storage section 358_1 of the AD conversion section 302_1. A pixel signal voltage of a Gr pixel of the second column and a pixel signal voltage of a Gr pixel of the fourth column are converted into digital data by processing of the counter 353 of the AD conversion section 302_2 or the like, and the addition result is stored in the temporary storage section 358_1 of the AD conversion section 302_2. Subsequently, two-pixel addition is performed in the horizontal direction for pixels with the same color belonging to the same row and the addition result is stored in the temporary storage section 358_1 in the same manner as described above.

As can also be seen from the drawing, the spatial position of the pixel center after addition is even at distances of two pixels. However, in the Bayer arrangement, if the addition centers are set at equal distances at the time of two-column sharing, the color of the representative coordinate point of a final image is not equal to the original color.

In addition, if two unit pixels 3 with the same color are wired to each other so as to be shared, parts of wiring lines between the vertical signal line 19 and the two-input selector 313 cross each other as shown in the drawing. In order to make wiring lines cross each other, typically, it is necessary to provide the target vertical signal lines 19 with another wiring layer therebetween using a via hole. In this case, if a via hole is disposed only at a part of the vertical signal line 19 crossing the vertical signal line 19, pattern dependency may occur. Accordingly, it may be necessary to intentionally dispose a via hole even at the vertical signal line 19 for which a via hole is not necessary.

Fifth Example

Three Column Sharing & Color

FIG. 15A is a view for explaining the second embodiment (fifth example) of column signal processing.

A column AD converter 300BE of the first embodiment (fifth example) is an example of the configuration, in which one AD conversion section 302BE is shared between three columns (three vertical signal lines 19), when the solid state imaging device 1 is for color imaging. Moreover, as signal processing, a case where all column horizontal additive readout of a sharing unit is performed is shown.

Similar to the second embodiment (fourth example), a basic form of the Bayer arrangement will be described as the color arrangement of a color separation filter used for color imaging. Similar to the fourth example, the unit pixels 3 with the same color are shared in order to avoid the color mixture problem at the time of pixel addition in the case of color imaging.

Specifically, as shown in FIG. 15A, the vertical signal line 19 and the three-input selector 316 of the vertical line selecting section 310 are wired so that nearest odd columns ((2n−3)-th, (2n−1)-th, and (2n+1)-th columns), in which R pixels or Gb pixels are arrayed, or nearest even columns ((2n−2)-th, (2n)-th, and (2n+2)-th columns), in which Gr pixels or B pixels are arrayed, are shared. The three-input selector 316 selects columns (three odd columns or three even columns) in which three of the unit pixels 3 with the same color are connected to each other.

Also in the second embodiment (fifth example), similar to the second embodiment (second example), addition processing of three columns arrayed in the horizontal direction can be performed in the horizontal addition mode. As a result, since the amount of information which is output in the horizontal direction can be reduced to 1/2 while maintaining the sensitivity, it is possible to improve the frame rate or to reduce the power consumption. Moreover, if three-column vertical addition processing is performed together, three-pixel addition (nine-pixel addition in total) in both the horizontal and vertical directions can be realized. In this case, the frame rate can be further improved.

Moreover, regarding in which temporary storage section 358 the addition results are to be stored, there are a method of shifting the temporary storage section in a sequential manner, a method of dividing the temporary storage sections into pieces, and a method of storing the addition results in only one temporary storage section, as can be seen from the explanation in the second example. Here, the addition results are stored in only one of the temporary storage sections 358_1, 358_2, and 358_3 so that the spatial position of the pixel center after addition is even.

Moreover, in the case of color imaging, colors of the representative coordinate points of a final image are made equal to colors of the original filter arrangement, regarding the spatial distance (spatial position) relationship. At least in the case of the basic form of the Bayer arrangement, this is guaranteed in the three column sharing.

For example, a pixel signal voltage of a Gb pixel of the second column, a pixel signal voltage of a Gb pixel of the fourth column, and a pixel signal voltage of a Gb pixel of the sixth column are converted into digital data by processing of the counter 353 of the AD conversion section 302_2 or the like, and the addition result is stored in the temporary storage section 358_1 of the AD conversion section 302_2. A pixel signal voltage of an R pixel of the fifth column, a pixel signal voltage of an R pixel of the seventh column, and a pixel signal voltage of an R pixel of the ninth column are converted into digital data by processing of the counter 353 of the AD conversion section 302_3 or the like, and the addition result is stored in the temporary storage section 358_1 of the AD conversion section 302_3. Subsequently, three-pixel addition is performed in the horizontal direction for pixels with the same color belonging to the same row and the addition result is stored in the temporary storage section 358_1 in the same manner as described above.

As can also be seen from the drawing, the spatial position of the pixel center after addition is even at distances of three pixels. Moreover, in the Bayer arrangement, if the addition centers are set at equal distances at the time of three-column sharing, the color of the representative coordinate point of a final image is equal to the original color.

In addition, if three unit pixels 3 with the same color are wired to each other so as to be shared, parts of wiring lines between the vertical signal line 19 and the three-input selector 316 cross each other as shown in the drawing. Accordingly, the same measures as in the fourth example are taken in this case.

In the fourth and fifth examples, three color components of R, G, and B are arrayed according to the basic form of the Bayer arrangement for the unit pixels 3 arrayed in the shape of a square lattice, filter colors or the arrangement order is not limited to the basic form of the Bayer arrangement. For example, a modification of the Bayer arrangement may be applied, and a complementary color filter or other filter colors may be used. For example, the case may be considered in which one of two G pixels in the Bayer arrangement is set as a W (white) pixel (equivalent to a state with no color filter) and the W pixel is used as a brightness signal in order to obtain the high sensitivity.

Moreover, complementary color filters (cyan (Cy), magenta (Mg), and yellow (Ye)) may be arrayed in the Bayer arrangement. Generally, a primary color system is advantageous in color reproducibility compared with a complementary color system, and the complementary color system is advantageous in sensitivity since the light transmittance of a color filter is high. That is, since the sensitivity of a complementary color filter is higher than that of a primary color filter, the sensitivity of an imaging apparatus can be increased by using a color filter based on the complementary color system in which transmitted light beams of a visible region are complementary colors of three primary colors. On the contrary, by using a color filter based on the primary color system, color signals corresponding to primary colors can be acquired even if differential processing is not performed. This is advantageous in that signal processing becomes simple. When reproducing an image, signal processing is performed on color signals (for example, primary color signals of R, G, and B) acquired using color filters based on the primary color system or the complementary color system, and a brightness signal and a color difference signal are mixed.

In addition, the case may be considered in which one of two G pixels in the Bayer arrangement is set as an E (emerald) pixel and signal processing corresponding to color filters of four colors is performed. Although a detailed explanation regarding the color signal processing is omitted, an image processor which performs a matrix operation for making three colors of RGB, which are suitable for the human eye, from image signals of respective colors obtained by four-color photographing is provided corresponding to the filters of four colors. For example, this image processor may be provided in the digital operation section 29 or may be provided in a digital processor existing outside the device. If the emerald filter is provided in addition to red, green, and blue filters, the difference of color reproduction can be reduced compared with the case where only the color filters of three colors are provided. In this case, the reproducibility of a blue-green color or a red color is improved.

Also in these various kinds of modifications, when performing all column horizontal additive readout of a sharing unit under the conditions of column sharing, the unit pixels with the same color are shared as described above. Accordingly, the same effects as described in the fourth or fifth example of the second embodiment can be obtained.

As described above, in each example of the first embodiment or in each example of the second embodiment, pixel driving is first performed simultaneously for the plurality of unit pixels 3 which are objects of column sharing. Accordingly, simultaneous settling of all columns (all unit pixels 3) to be shared can be performed. Then, at the time of column AD conversion processing on the plurality of unit pixels 3 to be shared, D phase processing is started after P phase processing on all columns to be shared ends. In particular, this solves a problem in that the start of D phase processing should be waited for each time until the pixel signal voltage Vx are stabilized when shifting from P phase processing to D phase processing. As a result, since AD conversion processing can be performed at higher speed than in the case where the present embodiment is not applied, the frame rate is improved.

Also in the case where D phase processing is started after P phase processing on all columns to be shared ends, CDS processing can be performed within columns even at the time of all column reading by temporarily storing a P phase processing result of each column in the temporary storage section 358 and rewriting it into the counter 353 at the start of D phase processing of a corresponding column.

Moreover, even if all columns to be shared are driven simultaneously and the D phase processing is started after the P phase processing on all columns to be shared ends, not only all pixel readout but also horizontal pixel addition processing can be performed. In addition, the value obtained as an addition result may be subjected to CDS processing. In addition, when performing the horizontal pixel addition processing, processing of temporarily storing a P phase processing result in the temporary storage section 358 and of rewriting it into the counter 353 at the start of D phase processing of a corresponding column is not necessary. As a result, the processing time of the horizontal rate becomes shorter than that at the time of all pixel readout.

Column Signal Processing

Third Embodiment—Horizontal Additive Readout of a Sharing Unit

First Example

Two Column Sharing & Horizontal Three-Pixel Addition & Monochrome

FIG. 16A is a view for explaining a third embodiment (first example) of column signal processing.

Figure 16B:
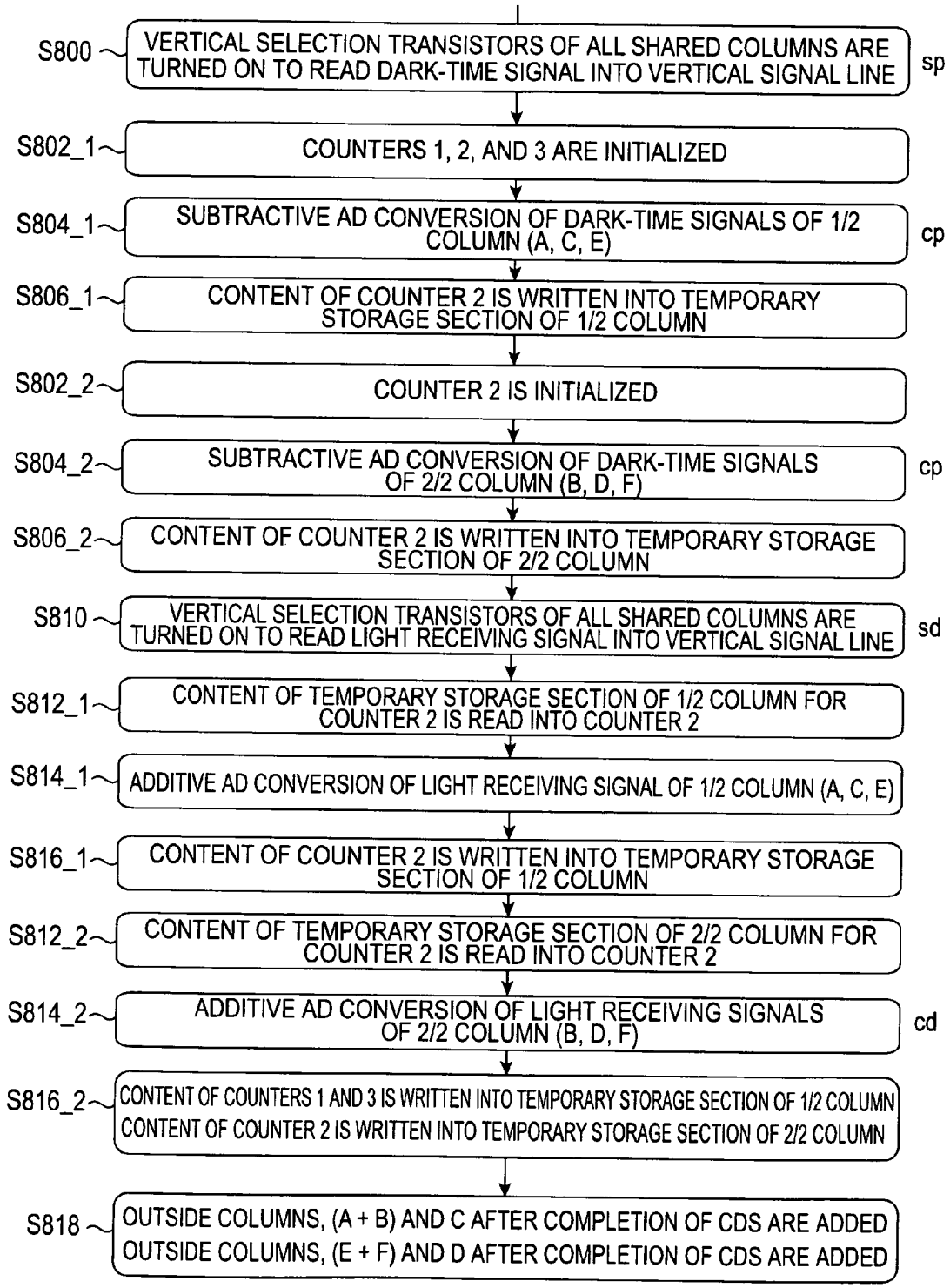
FIG. 16B is a flow chart showing an example of the procedures of AD conversion and CDS processing at the time of horizontal additive readout of a sharing unit in a column AD converter of the third embodiment (first example)

FIG. 16B is a view for explaining operations of AD conversion and CDS processing at the time of horizontal additive readout of a sharing unit (called two column sharing & horizontal three-pixel addition processing) in a column AD converter 300CA of the third embodiment (first example) which has a two column sharing configuration. (1) in FIG. 16A shows the outline of the flow of a signal, and FIG. 16B is a flow chart showing an example of the operation procedure.

The third embodiment is different from the first embodiment in that additive readout is performed in the horizontal direction in a sharing unit instead of an all pixel readout. The third embodiment is similar to the second embodiment described above in that additive readout is performed in the horizontal direction. However, the third embodiment is characterized in that, instead of performing horizontal addition and reading in units of column sharing equally for all columns, horizontal pixel addition within columns is performed only for a portion in which pixel addition in the horizontal direction in units of column sharing is possible but the addition is performed outside the columns when it is difficult. This method is called horizontal additive readout of a sharing unit.

Here, a column AD converter 300CA of the third embodiment (first example) is an example of the configuration, in which one AD conversion section 302CA is shared between two columns (two vertical signal lines 19), when the solid state imaging device 1 is for monochrome imaging. Moreover, as signal processing, a case where pixel addition of three pixels is performed in the horizontal direction is shown. In this case, since the number of columns is different between the sharing unit (two columns) and the horizontal pixel addition (addition of three columns), it is difficult to say that horizontal addition and reading are performed in units of column sharing equally for all columns like the second embodiment. The structure of horizontal additive readout of a sharing unit can cope with this problem.

(1) in FIG. 16A shows a simple configuration of the column AD converter 300CA of the third embodiment (first example) in order to make the operation easily understood. The count processor 352CA used in the AD conversion section 302CA is configured such that the same portion as in the first embodiment (first example), in which horizontal pixel addition is not performed, and the same portion as in the second embodiment (first example), in which horizontal pixel addition is performed, are mixed.

In practice, it is preferable to be able to meet all pixel readout of the first embodiment (first example) or all column horizontal additive readout of a sharing unit of the second embodiment (first example). Actually, it is preferable that all count processors 352CA have the same configuration as in the first embodiment (first example).

In addition, the configuration of the count processor 352CA corresponding to the horizontal pixel addition applied in the third embodiment is not limited to that used in the first embodiment or the second embodiment. It is also possible to use an adder or an adder-subtractor and a data holding section (latch), which holds the result at reference clock periods, in order to form a cyclic count processor 352CA and to set the variation value of each time to a fixed rate (here, 1 or 2).

For example, referring to (2) in FIG. 16A, it is configured such that a variation of Δ per one clock occurs by using an adder 522 and a latch 524. Since it changes by Δ per one clock, Δ-times counting is realized. A variation width controller 510 specifies the variation width Δ per one clock. A comparator 322 which compares the electric potential of each vertical signal line 19 with the reference signal SLP_ADC is provided for each column, and the variation width controller 510 is disposed after the comparator 322. When the electric potential of the reference signal SLP_ADC is higher than the pixel signal voltage Vx, an output of the comparator 322 is set to H.

The variation width controller 510 has a selector 512 and a variation width determining section 514. The selector 512 switches the output of each comparator 322 according to whether or not horizontal pixel addition is performed. The variation width determining section 514 controls the variation width Δ on the basis of a comparison result of each comparator 322 input through the selector 512.

Specifically, in a normal mode in which the horizontal pixel addition is not performed, comparison outputs of M columns to be shared are transmitted in order to the variation width determining section 514. In this case, the variation width determining section 514 sets the variation width Δ to "1". For each of the M vertical signal lines 19 to be shared, counting processing is performed with the variation width Δ=1.

On the other hand, in a horizontal pixel addition mode, the selector 512 transmits comparison outputs of M columns to be shared simultaneously to the variation width determining section 514. On the basis of the comparison result regarding each column to be shared, the variation width determining section 514 stops M-times count by setting Δ=M when all comparison results are H, stops (M−1)-times count by setting Δ=M−1 when a comparison result of (M−1) columns is H-regardless of the combination, . . . , stops (M−2)-times count by setting Δ=when a comparison result of (M−2) columns is H regardless of the combination, . . . , stops 2-times count by setting Δ=2 when a comparison result of two columns is H regardless of the combination, stops one-time count by setting Δ=1 when a comparison result of only one column is H regardless of a column, and stops count by setting Δ=0 when all comparison results are L.

That is, for a period in which the number of times of comparison results (H) of M columns is H, the count operation is performed X times. Accordingly, as can be understood from (3) in FIG. 16A, an addition result of M columns to be shared is obtained when the count processing is completed.

This is based on the following. As shown in the drawing, it is assumed that the pixel signal voltage Vx until the first comparison output is inverted (in this example, changes to L: the same hereinbelow) is V1, a voltage difference between the voltage V1 and the pixel signal voltage Vx until the next comparison output is inverted is V2, . . . , a voltage difference until two remaining comparison outputs are inverted is Vm−1, and a voltage difference from the pixel signal voltage Vm−1 until the remaining one comparison output is inverted is Vm. In this case, in order to acquire the addition result of M columns to be shared, AD conversion results of Vx_1, Vx_2, Vx_m−1, and Vx_m are added. This is equivalent to an operation of "M×D1+(M−1)×D2+ . . . +2×Dm−1+Dm", as seen from the drawing.

In addition, in order to meet CDS processing within columns, mode switching sections 530 and 532 for switching between inversion and non-inversion are provided in a path through which an output of the latch 524 is supplied to the adder 522 and a path through which an output of the adder 522 is supplied to a data input end of the latch 524. Since each function of the mode switching sections 530 and 532 is the same as that of the count mode switching section 430, non-inversion is selected at the time of up-count and inversion is selected at the time of down-count. In addition, the latch 524 and the mode switching sections 530 and 532 are provided corresponding to the number of bits.

In addition, this applicant proposed a structure of realizing the function shown in (2) and (3) in FIG. 16A using a counter and an addition controller in Japanese Patent Application No. 2008-260302 (corresponding to JP-A-2010-028781), and this may also be used as the count processor 352 in the third embodiment. Basically, the function of the addition controller disclosed in Japanese Patent Application No. 2008-260302 is to specify a digit, the value of which is to be changed, on the basis of the current value and the variation width Δ from the relationship between the current value and the operation value, which is obtained by changing the current value by the variation width Δ, and giving a change n instruction for the digit. Moreover, Japanese Patent Application No. 2008-260302 discloses the case where the basic operation of a counter of each digit is assumed to be an up-count operation, as shown in (1) in FIG. 4D.

Here, in the horizontal two-pixel addition at the time of two column sharing, it is preferable to perform processing up to double count since the maximum value of the variation width is 2. Moreover, even if the least significant digit of the current value is any of "0" and "1", it is possible to meet double count by changing the second digit. In Japanese Patent Application No. 2008-260302, a change instruction is output to the clock input end of the second digit in units of one clock. In addition, it is possible to meet one-time count by outputting a change instruction to the clock input end of the first digit in units of one clock.

On the other hand, in the horizontal three-pixel addition at the time of three column sharing, it is preferable to perform processing up to triple count since the maximum value of the variation width is 3. In any of the one-time count, double count, and triple count, first to third digits which should be changed are different according to the current values of the first and second digits. Accordingly, in Japanese Patent Application No. 2008-260302, in order to set them to operation values obtained by changing the current values by the variation width Δ from the relationship between the variation width Δ and the current values of the first and second digits, decode processing for specifying the first to third digits to be changed from the current values is performed (refer to Table 10 in Japanese Patent Application No. 2008-260302).

If the basic operation of a counter of each digit is a down-count operation as shown in (2) in FIG. 4D, decode processing suitable for this situation is performed. When the number of columns shared (that is, the horizontal pixel addition number) is 4 or more, a digit of the current value which is to be monitored or the relationship of digits which are to be changed from the current values from the relationship of the current value and the variation width Δ should also be changed. Also in such a case, any kind of structure may be adopted as long as it is a configuration where a digit, the value of which is to be changed, is specified on the basis of the current value and the variation width Δ from the relationship between the current value and the operation value, which is obtained by changing the current value by the variation width Δ, and a change instruction for the digit is output.

Next, a structure of performing horizontal three-pixel addition when the AD conversion section 302CA of the column AD converter 300CA has a two column sharing configuration will be described. When the AD conversion section 302CA has a two column sharing configuration, processing is performed in the horizontal direction with six columns as a unit in order to execute horizontal three-pixel addition. Six columns are calculated from the least common multiple of "2" of two column sharing and "3" of horizontal three-pixel addition. For a portion in which horizontal addition in units of column sharing within a range of six columns is possible, horizontal transfer is performed by performing addition processing using the count processor 352CA. For a portion in which horizontal addition in units of column sharing is difficult, a count result of each column is horizontally transferred without addition. Then, supplementary addition processing is performed outside the columns.

In this example, the horizontal pixel addition number (=3) is larger than the number of shared columns (=2). Therefore, the processing unit (in this example, six columns) is divided into groups (in this example, 6/3=2 groups) corresponding to (processing unit)/(horizontal pixel addition number). Then, in the group (within the horizontal pixel addition number), horizontal pixel addition is performed on the basis of the second embodiment (first example) regarding a portion which suits the number of shared columns, and the remaining portion (one column) which does not suit the number of shared columns is separately read by all pixel readout on the basis of the first embodiment (first example).

For example, in FIG. 16A, reference numerals of the vertical signal lines 19 within six columns are denoted as _1, _2, _3, _4, _5, and _6 from the left. The data of each AD conversion result is assumed to be A, B, C, D, E, and F. The count processor 352_1 is shared between two columns of vertical signal lines 19_1 and 19_2, the count processor 352_3 is shared between two columns of vertical signal lines 19_3 and 19_4, and the count processor 352_3 is shared between two columns of vertical signal lines 19_5 and 19_6.

As can be seen from the drawing, in such a configuration, if horizontal three-pixel addition is performed like horizontal three-pixel addition regarding the vertical signal lines 19_1, 19_2, and 19_3 and horizontal three-pixel addition regarding the vertical signal lines 19_4, 19_5, and 19_6, it is difficult for any count processor 352CA (count processors 352_1, 350_2, and 350_3) to cope with the situation. However, the addition (A+B) of the vertical signal lines 19_1 and 19_2 in the horizontal three-pixel addition (A+B+C) regarding the vertical signal lines 19_1, 19_2, and 19_3 is possible by the count processor 352_1. However, the addition (E+F) of the vertical signal lines 19_5 and 19_6 in the horizontal three-pixel addition (D+E+F) regarding the vertical signal lines 19_4, 19_5, and 19_6 is possible by the count processor 352_3.

Therefore, with six columns as a unit, the count processors 352_1 and 352_3 performs horizontal addition in units of column sharing and reads it by applying the second embodiment (first example), and the count processor 352_2 performs all pixel readout by applying the first embodiment (first example). That is, in the horizontal three-pixel addition, with six columns as a unit, pixel addition (A+B) is performed within columns regarding the vertical signal lines 19_1 and 19_2, and (E+F) is performed within columns also regarding the vertical signal lines 19_5 and 19_6. However, regarding the vertical signal lines 193 and 194, pixel addition is not performed within columns (C and D are horizontally transferred in a separate way). Regarding a portion for which pixel addition is not performed within columns, the addition processing is performed by the digital operation section 29 provided outside columns.

Specifically, first, the vertical selection transistor 40 of each unit pixel 3 of six columns is turned on to read a dark-time signal into the vertical signal line 19 (S800). Each counter 353 of the counting sections 350_1, 350_2, and 350_3 is initialized (S802_1), and a dark-time signal of the 1/2 column (A, C, and E) is selected by the two-input selector 313 and AD conversion (subtractive AD conversion) of the dark-time signal of the 1/2 column (A, C, and E) is performed in the down-count mode, thereby acquiring an AD conversion result of the dark-time signal (S804_1). Since C is not an object for addition, the counting section 350_2 temporarily stores the count result in the temporary storage section 358_1 (S806_1) and the counter 353 is initialized (S802_2).

Then, a dark-time signal of the 2/2 column (B, D, and F) is selected by the two-input selector 313 and AD conversion (subtractive AD conversion) of the dark-time signal of the 2/2 column (B, D, and F) is performed in the down-count mode, thereby acquiring an AD conversion result of the dark-time signal (S804_2). Since D is not an object for addition, the counting section 350_2 temporarily stores the count result in the temporary storage section 358_2 (S806_2) and the counter 353 is initialized (S802_2).

Then, each read selection transistor 34 (transfer gate) of the unit pixels 3 of all columns is turned on to read a light receiving signal into the vertical signal line 19 (S810). As a result, the signal level Ssig of each unit pixel 3 of all columns appears in each vertical signal line 19.

Since the AD conversion result of the dark-time signal regarding C is temporarily stored in the temporary storage section 358_1, the counting section 350_2 reads it into the counter 353 (S812_1). A light receiving signal of the 1/2 column (A, C, and E) is selected by the two-input selector 313 and AD conversion (additive AD conversion) of the light receiving signal of the 1/2 column (A, C, and E) is performed in the up-count mode, thereby acquiring an AD conversion result of the light receiving signal (S814_1). Since C is not an object for addition, the counting section 350_2 writes the count result into the temporary storage section 358_1 (S816_1).

Since the AD conversion result of the dark-time signal regarding D is temporarily stored in the temporary storage section 358_2, the counting section 350_2 reads it into the counter 353 (S812_2). A light receiving signal of the 2/2 column (B, D, and F) is selected by the two-input selector 313 and AD conversion (additive AD conversion) of the light receiving signal of the 2/2 column (B, D, and F) is performed in the up-count mode, thereby acquiring an AD conversion result of the light receiving signal (S814_2). The counting sections 350_1 and 350_3 write the count results into the temporary storage section 358_1, and the counting section 350_2 writes the count result into the temporary storage section 358_2 (S816_2).

Then, after horizontal transfer thereof, the digital operation section 29 provided outside columns adds the AD conversion result (A+B), which is an AD conversion result after CDS processing and addition processing are completed, and the AD conversion result (C), which is an AD conversion result after CDS processing is completed, and also adds the AD conversion result (E+F), which is an AD conversion result after CDS processing and addition processing are completed, and the AD conversion result (D), which is an AD conversion result after CDS processing is completed (S818).

That is, the count processor 352_1 performs horizontal transfer of the addition result (A+B) obtained by horizontal two-pixel addition regarding the vertical signal lines 19_1 and 19_2, and the count processor 352_3 performs horizontal transfer of the addition result (E+F) obtained by horizontal two-pixel addition regarding the vertical signal lines 19_5 and 19_6. The count processor 352_2 performs horizontal transfer of the AD conversion results (C and D) of the vertical signal lines 19_3 and 19_4.

Then, the digital operation section 29 provided outside the column AD converter 300 adds the horizontal two-pixel addition result (A+B added within columns) regarding the vertical signal lines 19_1 and 19_2 and the data C of the vertical signal line 19_3 in order to acquire a horizontal three-pixel addition result (A+B+C) regarding the vertical signal lines 19_1, 19_2, and 19_3. Moreover, the digital operation section 29 adds the horizontal two-pixel addition result (E+F added within columns) regarding the vertical signal lines 19_5 and 19_6 and the data D of the vertical signal line 19_4 in order to acquire a horizontal three-pixel addition result (D+E+F) regarding the vertical signal lines 19_4, 19_5, and 19_6.

By adopting the structure of the third embodiment (first example), in the case of performing horizontal three-pixel addition in the two column sharing configuration, the amount of information horizontally transferred can be reduced to 2/3 of that in the case of all pixel transfer without increasing the time for AD conversion processing or CDS processing. As a result, a horizontal transfer time and the power consumption at the time of horizontal transfer can be reduced.

Second Example

Three Column Sharing & Horizontal Two-Pixel Addition & Monochrome

Figure 17A:
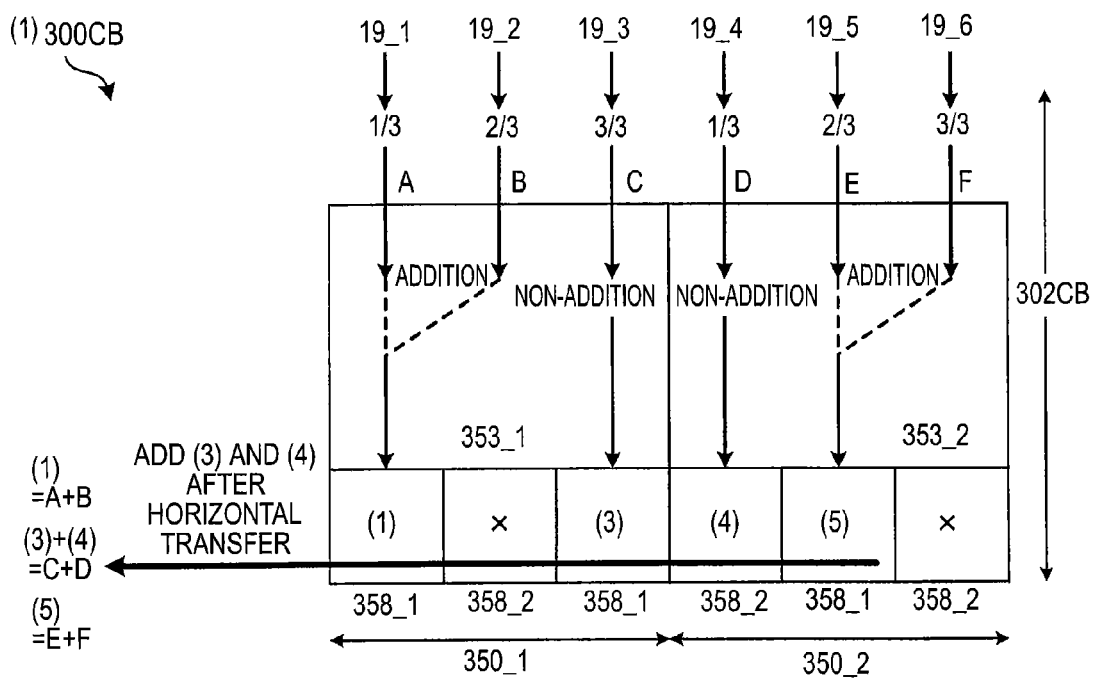
FIG. 17A is a view for explaining the third embodiment (second example) of column signal processing.

FIG. 17A is a view for explaining the third embodiment (second example) of column signal processing. FIG. 17B is a view for explaining operations of AD conversion and CDS processing at the time of horizontal additive readout of a sharing unit (called three column sharing & horizontal two-pixel addition processing) in a column AD converter 300CB of the third embodiment (second example) which has a three column sharing configuration. FIG. 17A shows the outline of the flow of a signal, and FIG. 17B is a flow chart showing an example of the operation procedure.

A column AD converter 300CB of the third embodiment (first example) is an example of the configuration, in which one AD conversion section 302CB is shared between three columns (three vertical signal lines 19), when the solid state imaging device 1 is for monochrome imaging. Moreover, as signal processing, a case where pixel addition of two pixels is performed in the horizontal direction is shown. In this case, since the number of columns is different between the sharing unit (three columns) and the horizontal pixel addition (addition of two columns), it is difficult to say that horizontal addition and reading are performed in units of column sharing equally for all columns like the second embodiment. The structure of horizontal additive readout of a sharing unit can cope with this problem.

FIG. 17A shows a simple configuration of the column AD converter 300CB of the third embodiment (second example) in order to make the operation easily understood. The count processor 352CB used in the AD conversion section 302CB is configured such that the same portion as in the first embodiment (second example), in which horizontal pixel addition is not performed, and the same portion as in the second embodiment (second example), in which horizontal pixel addition is performed, are mixed.

In practice, it is preferable to be able to meet all pixel readout of the first embodiment (second example) or all column horizontal additive readout of a sharing unit of the second embodiment (second example). Actually, it is preferable that all count processors 352CB have the same configuration as in the first embodiment (second example). The count processor 352CB is not limited to having the configuration shown in FIG. 17A, and the configuration proposed in (2) in FIG. 16A or Japanese Patent Application No. 2008-260302 may also be adopted.

When the AD conversion section 302CB of the column AD converter 300CB has a three column sharing configuration, processing is performed in the horizontal direction with six columns as a unit in order to execute horizontal two-pixel addition. Six columns are calculated from the least common multiple of "3" of three column sharing and "2" of horizontal two-pixel addition. For a portion in which horizontal addition in units of column sharing within a range of six columns is possible, horizontal transfer is performed by performing addition processing using the count processor 352CB. For a portion in which horizontal addition in units of column sharing is difficult, a count result of each column is horizontally transferred without addition. Then, supplementary addition processing is performed outside the columns.

In this example, the horizontal pixel addition number (=2) is smaller than the number of shared columns (=3). Therefore, the processing unit (in this example, six columns) is divided into groups (in this example, 6/3=2 groups) corresponding to (processing unit)/(number of shared columns). Then, in the group (within the number of shared columns), horizontal pixel addition is performed on the basis of the second embodiment (second example) until a portion which suits the horizontal pixel addition number, and the remaining portion (one column) for which addition is not necessary is separately read by all pixel readout on the basis of the first embodiment (first example).

For example, in FIG. 17A, reference numerals of the vertical signal lines 19 within six columns are denoted as _1, _2, _3, _4, _5, and _6 from the left. The data of each AD conversion result is assumed to be A, B, C, D, E, and F. The count processor 352_1 is shared between three columns of the vertical signal lines 19_1, 19_2, and 19_3, and the count processor 352_2 is shared between three columns of the vertical signal lines 19_4, 19_5, and 19_6.

As can be seen from the drawing, in such a configuration, if horizontal two-pixel addition is performed like horizontal two-pixel addition regarding the vertical signal lines 19_1 and 19_2, horizontal two-pixel addition regarding the vertical signal lines 19_3 and 19_4, and horizontal two-pixel addition regarding the vertical signal lines 19_5 and 19_6, it is difficult for any count processor 352CA (count processors 352_1 and 350_2) to cope with the situation. However, since the count processor 352_1 has a capability to perform horizontal addition regarding the three columns (A, B, and C), horizontal two-pixel addition (A+B) regarding the vertical signal lines 19_1 and 19_2 is possible. Since the count processor 352_2 has a capability to perform horizontal addition regarding the three columns (D, E, and F), horizontal two-pixel addition (E+F) regarding the vertical signal lines 19_5 and 19_6 is possible.

Therefore, with six columns as a unit, the count processor 352CB (count processors 352_1 and 350_2) performs all pixel readout by applying one column (C and D) or the first embodiment (first example) while performing horizontal addition of two columns (A and B or E and F) and reading it by applying the second embodiment (first example). That is, in the horizontal two-pixel addition, with six columns as a unit, pixel addition (A+B) is performed within columns regarding the vertical signal lines 19_1 and 192, and (E+F) is performed within columns also regarding the vertical signal lines 19_5 and 19_6. However, regarding the vertical signal lines 19_3 and 19_4, pixel addition is not performed within columns (C and D are horizontally transferred in a separate way).

Specifically, first, the vertical selection transistor 40 of each unit pixel 3 of six columns is turned on to read a dark-time signal into the vertical signal line 19 (S900). Each counter 353 of the counting sections 350_1 and 350_2 is initialized (S902_1), and a dark-time signal of the 1/3 column (A and D) is selected by the three-input selector 316 and AD conversion (subtractive AD conversion) of the dark-time signal of the 1/3 column (A and D) is performed in the down-count mode, thereby acquiring an AD conversion result of the dark-time signal (S904_1). Since D is not an object for addition, the counting section 350_2 temporarily stores the count result in the temporary storage section 358_1 (S906_1) and the counter 353 is initialized (S902_2).

Then, a dark-time signal of the 2/3 column (B and E) is selected by the three-input selector 316 and AD conversion (subtractive AD conversion) of the dark-time signal of the 2/3 column (B and E) is performed in the down-count mode, thereby acquiring an AD conversion result of the dark-time signal (S904_2). Moreover, since C is not an object for addition, the counting section 350_1 temporarily stores a P-phase subtraction result, which is obtained by adding A and B, in the temporary storage section 358_1 (S906_2) and the counter 353 is initialized (S902_3).

Then, a dark-time signal of the 3/3 column (C and F) is selected by the three-input selector 316 and AD conversion (subtractive AD conversion) of the dark-time signal of the 3/3 column (C and F) is performed in the down-count mode, thereby acquiring an AD conversion result of the dark-time signal (S904_3). Since C is not an object for addition, the counting section 350_1 temporarily stores the count result in the temporary storage section 358_3 (S906_3). In addition, since D is not an object for addition, the counting section 350_2 temporarily stores a P-phase subtraction result, which is obtained by adding E and F, in the temporary storage section 358_2 (S906_3).

Then, each read selection transistor 34 (transfer gate) of the unit pixels 3 of all columns is turned on to read a light receiving signal into the vertical signal line 19 (S910). As a result, the signal level Ssig of each unit pixel 3 of all columns appears in each vertical signal line 19.

Since the AD conversion result of the dark-time signal based on the addition of A and B is temporarily stored in the temporary storage section 358_1, the counting section 350_1 reads it into the counter 353. In addition, since the AD conversion result of the dark-time signal regarding D is temporarily stored in the temporary storage section 358_1, the counting section 350_2 reads it into the counter 353 (S912_1). Each light receiving signal of the 1/3 column (A and D) is selected by the three-input selector 316 and AD conversion (additive AD conversion) of the light receiving signal of the 1/3 column (A and D) is performed in the up-count mode, thereby acquiring an AD conversion result of the light receiving signal (S914_1). Since D is not an object for addition, the counting section 350_2 writes the count result into the temporary storage section 358_1 (S916_1).

Since the AD conversion result of the dark-time signal based on the addition of E and F is temporarily stored in the temporary storage section 358_2, the counting section 350_2 reads it into the counter 353 (S912_2). Each light receiving signal of the 2/3 column (B and E) is selected by the three-input selector 316 and AD conversion (additive AD conversion) of the light receiving signal of the 2/3 column (B and E) is performed in the up-count mode, thereby acquiring an AD conversion result of the light receiving signal (S914_2). Since C is not an object for addition, the counting section 350_1 writes the count result up to now into the temporary storage section 358_1 (S916_1).

Since the AD conversion result of the dark-time signal regarding C is temporarily stored in the temporary-storage section 358_3, the counting section 350_1 reads it into the counter 353 (S912_3). Each light receiving signal of the 3/3 column (C and F) is selected by the three-input selector 316 and AD conversion (additive AD conversion) of the light receiving signal of the 3/3 column (C and F) is performed in the up-count mode, thereby acquiring an AD conversion result of the light receiving signal (S914_3). The counting section 350_1 writes the count result into the temporary storage section 358_3, and the counting section 350_2 writes the count result into the temporary storage section 358_2 (S916_2).

After the horizontal transfer thereof, the digital operation section 29 provided outside columns adds the AD conversion result (C) after completion of CDS processing and the AD conversion result (D) after completion of CDS processing (S918).

That is, the count processor 352_1 separately performs horizontal transfer of the addition result (A+B), which is obtained by performing horizontal two-pixel addition regarding the vertical signal lines 19_1 and 19_2, and the addition result (C) of the vertical signal line 19_3. The count processor 352_2 separately performs horizontal transfer of the addition result (E+F), which is obtained by performing horizontal two-pixel addition regarding the vertical signal lines 19_5 and 19_6, and the AD conversion result (D) of the vertical signal line 19_4.

Then, the digital operation section 29 provided outside the column AD converter 300 adds the horizontal two-pixel addition result (A+B added within columns) regarding the vertical signal lines 19_1 and 19_2 and the data C of the vertical signal line 19_3 in order to acquire a horizontal three-pixel addition result (A+B+C) regarding the vertical signal lines 19_1, 19_2, and 19_3. Moreover, the digital operation section 29 adds the horizontal two-pixel addition result (E+F added within columns) regarding the vertical signal lines 19_5 and 19_6 and the data D of the vertical signal line 19_4 in order to acquire a horizontal three-pixel addition result (D+E+F) regarding the vertical signal lines 19_4, 19_5, and 19_6.

By adopting the structure of the third embodiment (second example), in the case of performing horizontal two-pixel addition in the three column sharing configuration, the amount of information horizontally transferred can be reduced to 2/3 of that in the case of all pixel transfer without increasing the time for AD conversion processing or CDS processing. As a result, a horizontal transfer time and the power consumption at the time of horizontal transfer can be reduced.

Third Example

X Column Sharing & Horizontal Y-Pixel Addition & Monochrome

FIG. 18 is a view for explaining the third embodiment (third example) of column signal processing.

A column AD converter 300CC of the third embodiment (third example) is an example of the configuration, in which one AD conversion section 302CC is shared between X columns (X vertical signal lines 19), when the solid state imaging device 1 is for monochrome imaging. Moreover, as signal processing, a case where pixel addition of Y (Y≠X) pixels is performed in the horizontal direction is shown. That is, although the horizontal three-pixel addition based on two column sharing and the horizontal two-pixel addition based on three column sharing have been described in the first and second examples, respectively, general expansion of the concept is made in the third example. In this case, since the number of columns is different between the sharing unit (X columns) and the horizontal pixel addition (addition of Y columns), it is difficult to say that horizontal addition and reading are performed in units of column sharing equally for all columns like the second embodiment. The structure of horizontal additive readout of a sharing unit can cope with this problem.

FIG. 18 shows a simple configuration of the column AD converter 300CC of the third embodiment (third example) in order to make the operation easily understood. The count processor 352CC used in the AD conversion section 302CC is configured such that the same portion as in the first embodiment (third example) and the same portion as in the third embodiment (third example) are mixed.

In practice, it is preferable to be able to meet all pixel readout of the first embodiment (third example) or all column horizontal additive readout of a sharing unit of the second embodiment (third example). Actually, it is preferable that all count processors 352CC have the same configuration as in the first embodiment (third example). The count processor 352CC is not limited to having the configuration shown in FIG. 17A, and the configuration proposed in (2) in FIG. 16A or Japanese Patent Application No. 2008-260302 may also be adopted.

(1) in FIG. 18 shows an AD conversion section 302CC_1 of the third embodiment (third example: case 1). This is the case where the horizontal pixel addition number (=Y) is larger than the number of shared columns (=X) and is also the case based on general expansion of the first example. In this case, first, in order to perform horizontal Y-pixel addition, the least common multiple of the number of shared columns (=X) and the horizontal pixel addition number (=Y) is set as a processing unit in the horizontal direction. For a portion in which horizontal addition in units of column sharing within a range of processing unit is possible, horizontal transfer is performed by performing addition processing using the count processor 352CC. For a portion in which horizontal addition in units of column sharing is difficult, a count result of each column is horizontally transferred without addition. Then, supplementary addition processing is performed outside the columns.

For example, the processing unit is divided into groups (in this example, groups corresponding to (processing unit column number)/Y. Then, in the group (within the horizontal pixel addition number), horizontal pixel addition is performed on the basis of the second embodiment (first example) regarding a portion which suits the number of shared columns, and the remaining portion (one column) which does not suit the number of shared columns is separately read by all pixel readout on the basis of the first embodiment (first example). Then, supplementary addition processing is performed outside the columns. Although a flow chart of the specific procedure is not shown, it may be thought on the basis of the first example described above.

For example, (1) in FIG. 18 shows the case where horizontal four-pixel addition is performed on the basis of two column sharing. Since the least common multiple of the number of shared columns (=2) and the horizontal pixel addition number (=4) is 4, the processing unit is set to four columns. In this case, one group is calculated from (processing unit)/(horizontal pixel addition number). Addition processing is performed within columns in units of two columns (A+B, C+D), and the result is transmitted to the outside of columns. Then, the digital operation section 29 provided outside the columns performs addition processing of (A+B)+(C+D) and as a result, horizontal four-pixel addition (A+B+C+D) is completed.

Although not shown, for example, in the case where horizontal nine-pixel addition is performed on the basis of three column sharing, the least common multiple of the number of shared columns (=3) and the horizontal pixel addition number (=9) is 9. Accordingly, in this case, processing in one group is completed by setting the processing unit to nine columns. Then, addition processing is performed within columns in units of three columns (A+B+C, D+E+F, G+H+I), and the result is transmitted to the outside of columns. Then, the digital operation section 29 provided outside the columns performs addition processing of (A+B+C)+(D+E+F)+(G+H+I) and as a result, horizontal nine-pixel addition (A+B+C+D+E+F+G+H+I) is completed.

Although not shown, for example, in the case where horizontal five-pixel addition is performed on the basis of two column sharing, the least common multiple of the number of shared columns (=2) and the horizontal pixel addition number (=5) is 10. Accordingly, in this case, the processing unit is set to ten columns. In this case, two groups are calculated from (processing unit)/(horizontal pixel addition number). Since one group includes five columns, this case is a combination of two-time addition of two columns and one column with no addition. Therefore, in each group, addition processing of every two columns is performed within columns (A+B, C+D, G+H, I+J), and the remaining portion is not added (E and F). These are transmitted to the outside of columns and addition processing of (A+B)+(C+D)+E is performed by the digital operation section 29 provided outside columns to thereby complete the horizontal five-pixel addition (A+B+C+D+E), and addition processing of F+(G+H)+(I+J) is performed by the digital operation section 29 to thereby complete the horizontal five-pixel addition (F+G+H+I+J).

By adopting the structure of the third embodiment (third example: case 1), in the case of performing horizontal Y-pixel addition in the X column sharing configuration (Y>X), the amount of information horizontally transferred can be reduced to X/Y of that in the case of all pixel transfer without increasing the time for AD conversion processing or CDS processing. As a result, a horizontal transfer time and the power consumption at the time of horizontal transfer can be reduced.

(2) in FIG. 18 shows an AD conversion section 302CC_2 of the third embodiment (third example: case 2). This is the case where the horizontal pixel addition number (=Y) is smaller than the number of shared columns (=X) and is also the case based on general expansion of the second example. In this case, first, in order to perform horizontal Y-pixel addition, the least common multiple of the number of shared columns (=X) and the horizontal pixel addition number (=Y) is set as a processing unit in the horizontal direction. For a portion in which horizontal addition in units of column sharing within a range of processing unit is possible, horizontal transfer is performed by performing addition processing using the count processor 352CC. For a portion in which horizontal addition in units of column sharing is difficult, a count result of each column is horizontally transferred without addition. Then, supplementary addition processing is performed outside the columns.

For example, the processing unit is divided into groups corresponding to (processing unit)/(horizontal pixel addition number) (in this example, groups corresponding to (processing unit column number)/X). For a portion in which horizontal addition in units of column sharing within a group (within the number of shared columns) is possible, horizontal transfer is performed by performing addition processing using the count processor 352CC. For a portion in which horizontal addition in units of column sharing is difficult, separate reading is performed by all pixel readout on the basis of the first embodiment (first example) without addition. Then, supplementary addition processing is performed outside the columns. Although a flow chart of the specific procedure is not shown, it may be thought on the basis of the second example described above.

For example, (2) in FIG. 18 shows the case where horizontal two-pixel addition is performed on the basis of four column sharing. Since the least common multiple of the number of shared columns (=4) and the horizontal pixel addition number (=2) is 4, the processing unit is set to four columns. In this case, one group is calculated from (processing unit)/(the number of shared columns). In four column sharing, addition processing (A+B, C+D) of every two columns may be performed separately in two steps, and the result may be transmitted to the outside of columns. Since (A+B) and (C+D) after the addition is completed are horizontally transferred, it is not necessary to perform supplementary addition processing in the digital operation section 29.

Although not shown, for example, in the case where horizontal three-pixel addition is performed on the basis of six column sharing, the least common multiple of the number of shared columns (=6) and the horizontal pixel addition number (=3) is 6. Accordingly, in this case, processing in one group is completed by setting the processing unit to six columns. Moreover, in six column sharing, addition processing (A+B+C, D+E+F) of every three columns may be performed separately in two steps, and the result may be transmitted to the outside of columns. Since (A+B+C) and (D+E+F) after the addition is completed are horizontally transferred, it is not necessary to perform supplementary addition processing in the digital operation section 29.

Moreover, although not shown, for example, in the case where horizontal two-pixel addition is performed on the basis of five column sharing, the least common multiple of the number of shared columns (=5) and the horizontal pixel addition number (=2) is 10. Accordingly, in this case, the processing unit is set to ten columns. In this case, two groups are calculated from (processing unit)/(the number of shared columns). One group includes five columns. Accordingly, in five column sharing, addition processing (A+B, C+D or G+H, I+J) of every two columns may be performed separately in two steps, but one column (E, F) is not an object for addition. Accordingly, addition processing (A+B, C+D or G+H, I+J) of every two columns and (E, F) with no addition are transmitted to the outside of columns. Since (A+B), (C+D), (G+H), and (I+J) after the addition is completed are horizontally transferred, the digital operation section 29 provided outside columns can complete two-pixel addition of (E+F) by performing supplementary addition processing for E and F.

By adopting the structure of the third embodiment (third example: case 2), in the case of performing horizontal Y-pixel addition in the X column sharing configuration (Y<X), the amount of information horizontally transferred can be reduced to Y/X of that in the case of all pixel transfer without increasing the time for AD conversion processing or CDS processing. As a result, a horizontal transfer time and the power consumption at the time of horizontal transfer can be reduced.

Fourth Example

Two Column Sharing & Horizontal Three-Pixel Addition & Color

Figure 19:
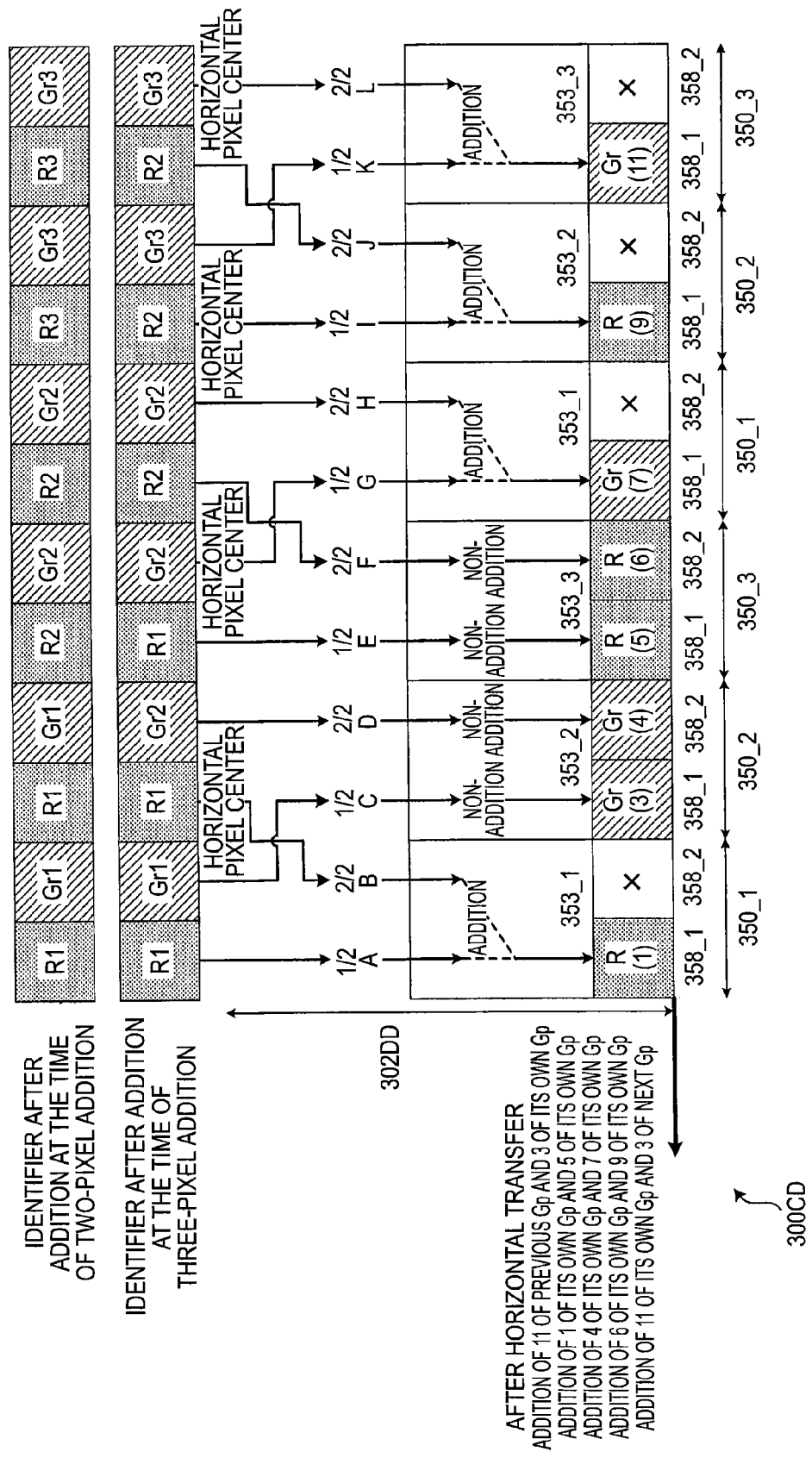
FIG. 19 is a view for explaining the third embodiment (fourth example) of column signal processing.

FIG. 19 is a view for explaining the third embodiment (fourth example) of column signal processing.

A column AD converter 300CD of the third embodiment (fourth example) is an example of the configuration, in which one AD conversion section 302CC is shared between two columns (two vertical signal lines 19), when the solid state imaging device 1 is for color imaging. Moreover, as signal processing, a case where pixel addition of three pixels is performed in the horizontal direction is shown. Similar to the second embodiment (fourth and fifth examples), a basic form of the Bayer arrangement will be described as the color arrangement of a color separation filter used for color imaging.

As can be seen from the explanation in the second embodiment (fourth example), the addition should be performed for the same color. Therefore, horizontal pixel addition is possible with twelve columns, which is twice the six columns when monochrome, as a column sharing unit. However, if the horizontal pixel addition within columns is not possible, the addition is performed outside the columns. "Twice" is specified from the fact that the horizontal repetition pitch of color separation filters in the Bayer arrangement is two pixels. When monochrome, a basic processing unit is "2×6". In the case of color, however, twelve columns are set as a unit because one cycle is completed on the basis of the horizontal repetition pitch of color separation filters.

For example, in FIG. 19, an explanation will be given in a state where A to L are given from the left in a twelve column unit. Pixel addition within columns is performed for A and B (R pixels), pixel addition within columns is performed for G and H (Gr pixels), pixel addition within columns is performed for I and J (R pixels), and pixel addition within columns is performed for K and L (Gr pixels). Pixel addition within columns is not performed for C and D of R pixels and E and F of Gr pixels. After the horizontal transfer, the digital operation section 29 adds 3(C) and 11(K+L) of one-left (one-previous) group Gp, adds 1(A+B) and 5 (E) of its own group Gp, adds 4(D) and 7(G+H) of its own group Gp, adds 6(F) and 9(I+J) of its own group Gp, and adds 11 (K+L) of its own group Gp and 3(C) of one-right (next) group Gp.

By adopting the structure of the third embodiment (fourth example), in the case of performing horizontal three-pixel addition in the two column sharing configuration, a horizontal transfer time and the power consumption at the time of horizontal transfer can be reduced without increasing the time for AD conversion processing or CDS processing even when the solid state imaging device 1 is for color imaging.

Fifth Example

Three Column Sharing & Horizontal Two-Pixel Addition & Color

Figure 20:
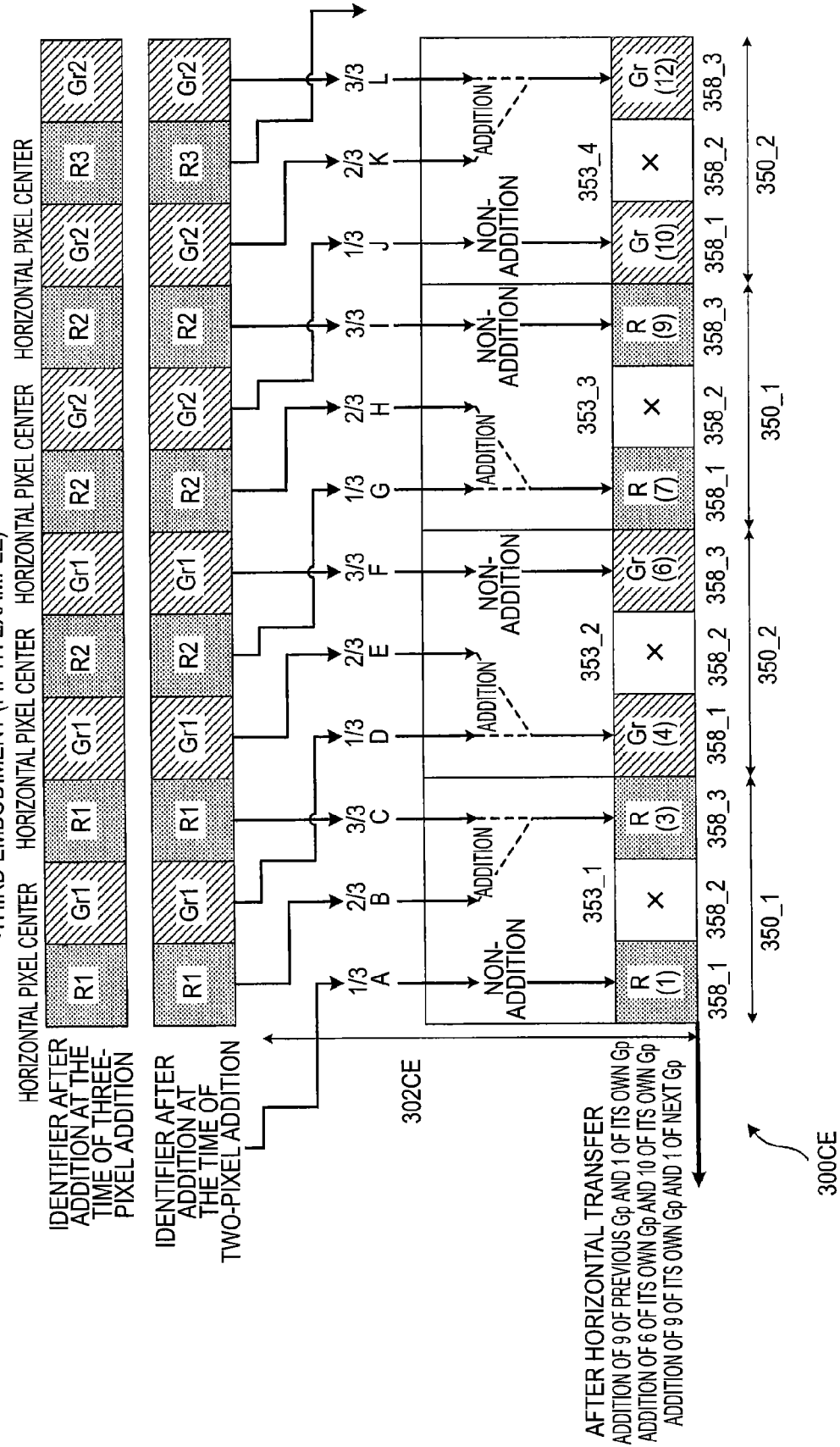
FIG. 20 is a view for explaining the third embodiment (fifth example) of column signal processing.

FIG. 20 is a view for explaining the third embodiment (fifth example) of column signal processing.

A column AD converter 300CE of the third embodiment (fifth example) is an example of the configuration, in which one AD conversion section 302CD is shared between three columns (three vertical signal lines 19), when the solid state imaging device 1 is for color imaging. Moreover, as signal processing, a case where pixel addition of two pixels is performed in the horizontal direction is shown. Similar to the second embodiment (fourth and fifth examples), a basic form of the Bayer arrangement will be described as the color arrangement of a color separation filter used for color imaging.

As can be seen from the explanation in the second embodiment (fifth example), the addition should be performed for the same color. Therefore, horizontal pixel addition is possible with twelve columns, which is twice the six columns when monochrome, as a column sharing unit. However, if the horizontal pixel addition within columns is not possible, the addition is performed outside the columns.

For example, in FIG. 20, an explanation will be given in a state where A to L are given from the left in a twelve column unit. Pixel addition within columns is performed for B and C (R pixels), pixel addition within columns is performed for D and E (Gr pixels), pixel addition within columns is performed for G and H (R pixels), and pixel addition within columns is performed for K and L (Gr pixels). Pixel addition within columns is not performed for A and I of R pixels and F and J of Gr pixels. After the horizontal transfer, the digital operation section 29 adds 9(I) of one-left (one-previous) group Gp and 1(A) of its own group Gp, adds 6(F) and 10(J) of its own group Gp, and adds 9(I) of its own group Gp and 1(A) of one-right (next) group Gp.

By adopting the structure of the third embodiment (fifth example), in the case of performing horizontal two-pixel addition in the three column sharing configuration, a horizontal transfer time and the power consumption at the time of horizontal transfer can be reduced without increasing the time for AD conversion processing or CDS processing even when the solid state imaging device 1 is for color imaging.

As described above, in the third embodiment, even if the number of shared columns is not equal to the horizontal pixel addition number, horizontal pixel addition within columns is applied for apart and addition is performed outside the columns for a portion in which it is difficult to apply the horizontal pixel addition within columns. This is advantageous over the case, in which horizontal pixel addition outside columns is performed for all portions, in that a horizontal transfer time and the power consumption at the time of horizontal transfer can be reduced without increasing the time for AD conversion processing or CDS processing.

For example, an example in which horizontal pixel addition outside columns is performed for all portions is proposed in JP-A-2008-11012. In this case, however, even if horizontal transfer is performed at the time of addition, the amount of information horizontally transferred is not reduced. For this reason, the power consumption is not largely reduced compared with that in the all pixel mode. Moreover, in the case where the frame rate is limited by the horizontal transfer capability, the frame rate is not improved unless the amount of information horizontally transferred is reduced.

As a method of performing horizontal addition within columns, the method of the second embodiment was proposed. This method is advantageous in terms of power consumption or the frame rate because the amount of information horizontally transferred can be reduced. The method of the second embodiment is applied to the case where a sharing unit of a column circuit and a horizontal pixel addition unit are equal. In this case, since temporary storage of the P phase data and rewriting of the P phase data into the counter 353 before D phase processing are not necessary, the processing becomes simple compared with all pixel readout. This is a pixel addition method based on the sharing unit of a column circuit, which is peculiar in the second embodiment.

However, if the sharing unit is different from the horizontal pixel addition unit, it is difficult to perform the horizontal pixel addition within columns for all portions. Accordingly, it is difficult to perform the pixel addition based on the sharing unit of a column circuit described in the second embodiment.

On the other hand, processing in which the sharing unit is different from the horizontal pixel addition unit may be requested. In order to meet such a request, the third embodiment was proposed. In the third embodiment, the amount of information horizontally transferred is reduced in the possible range by performing pixel addition only for a portion, in which pixel addition within columns is possible, and by performing pixel addition after horizontal transfer for a portion, in which pixel addition within columns is difficult. As a result, a reduction in power consumption and an improvement in the frame rate in the limited horizontal transfer rate are possible. In particular, if the counting section 350 (count processor 352) of column sharing in the first and second embodiments is used, they can be realized without providing a large-sized circuit. In this case, the structure of the counting section 350 (count processor 352) of column sharing applied in this case is not limited to those in the first and second embodiments, as described above.

Column Signal Processing

Fourth Embodiment—Power Consumption Reduction

Figure 21:
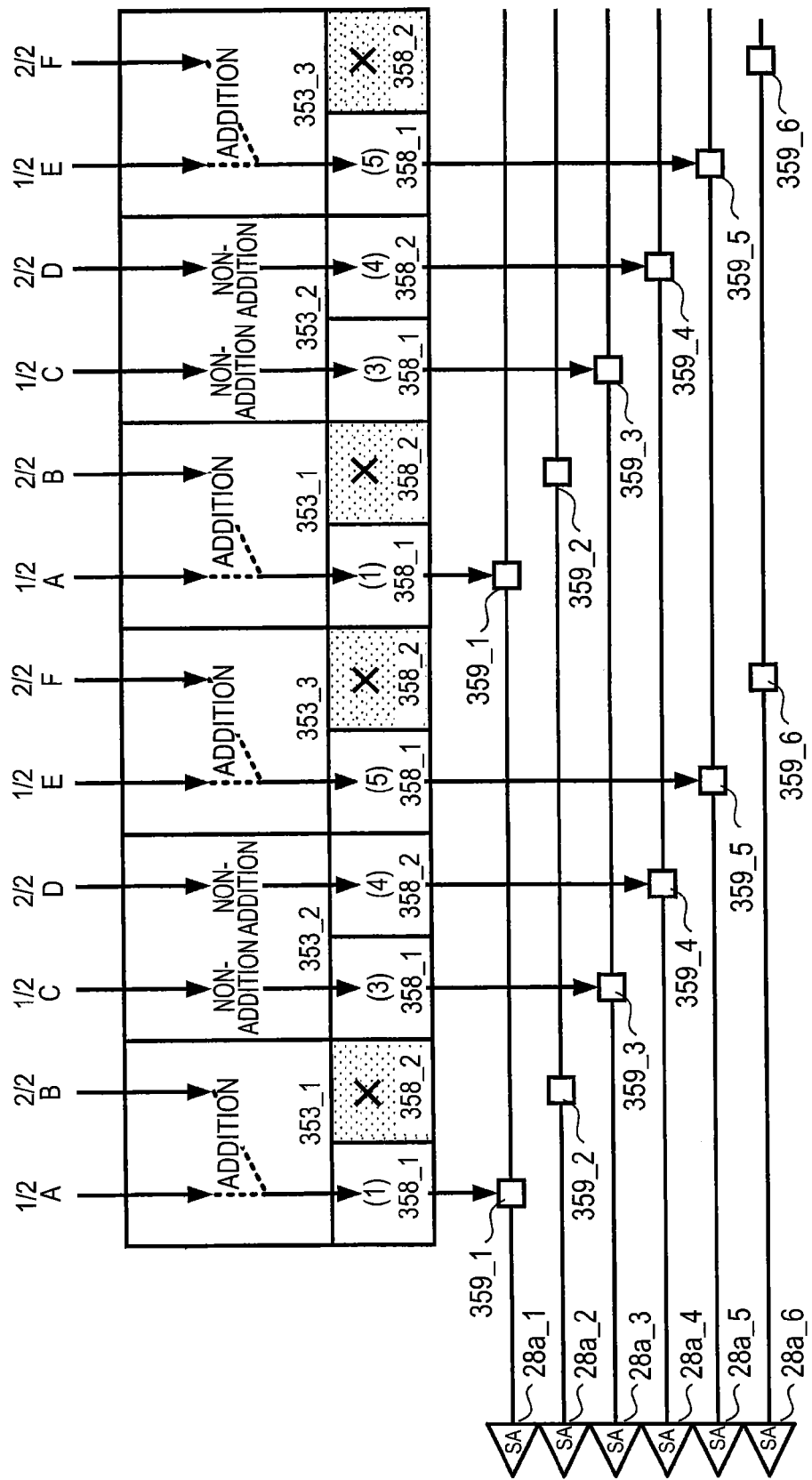
FIG. 21 is a view for explaining a fourth embodiment of column signal processing.

FIG. 21 is a view for explaining a fourth embodiment of column signal processing. The fourth embodiment is a modification of the second or third embodiment. In the fourth embodiment, a method of reducing the power consumption when the amount of information horizontally transferred is reduced is applied. Here, as a modification of the third embodiment, an example of three-pixel addition based on two column sharing in the case of monochrome (black and white) pixels is shown.

By performing addition in the possible range within columns, four items of information may be horizontally transferred in units of six columns. In this case, the amount of information horizontally transferred is reduced to 2/3 of that in the case of an all pixel readout.

Six columns are connected to different horizontal transfer systems Htr. Here, it is assumed that the horizontal transfer system Htr refers to a section including the horizontal transfer driver 359 and the sense amplifier 28a for reading of the horizontally transferred information.

When performing horizontal three-pixel addition in the two column sharing configuration, a horizontal transfer system Htr_2 including a sense amplifier 28a_2 and a horizontal transfer driver 359_2 and a horizontal transfer system Htr_6 including a sense amplifier 28a_6 and a horizontal transfer driver 359_6 are not necessarily used. Accordingly, the number of horizontal transfer systems Htr necessarily used is reduced to 2/3 of that at the time of all pixel readout. Usually, a current continuously flows from the sense amplifier 28a to the horizontal transfer driver 359. However, this DC current may be cut off if not necessarily used. Accordingly, the DC current may be reduced to about 1/3.

Although not shown in the drawing, the same concept may also be applied to the case of horizontal two-pixel addition in the three pixel sharing configuration. Also in this case, the number of horizontal transfer systems Htr necessarily used is reduced to 2/3 of that at the time of all pixel readout.

Also in the case of color imaging, the concept which is similar to that for monochrome imaging may be applied. In the case of horizontal three-pixel addition in the two pixel sharing configuration among the cases of color imaging, however, the power efficiency is not maximized unless twelve horizontal transfer systems Htr are prepared, as can be seen from the fourth example in which twelve columns are set as a unit. In the case of horizontal three-pixel addition in the two pixel sharing configuration among the cases of color imaging, if six horizontal transfer systems Htr are provided and only the horizontal transfer system Htr for transfer of B and H is turned off in FIGS. 19 and 21, the reduction rate of power consumption becomes 1/6. In the example shown in FIG. 21, an improvement in the frame rate at the time of horizontal pixel addition is difficult to expect up to 1/3 which is the original amount of horizontal three-pixel addition. This is because the amount of information horizontally transferred is reduced to only 2/3 of that at the time of all pixel readout.

Column Signal Processing

Fifth Embodiment—Improvement in Horizontal Transfer Efficiency

Figure 22:
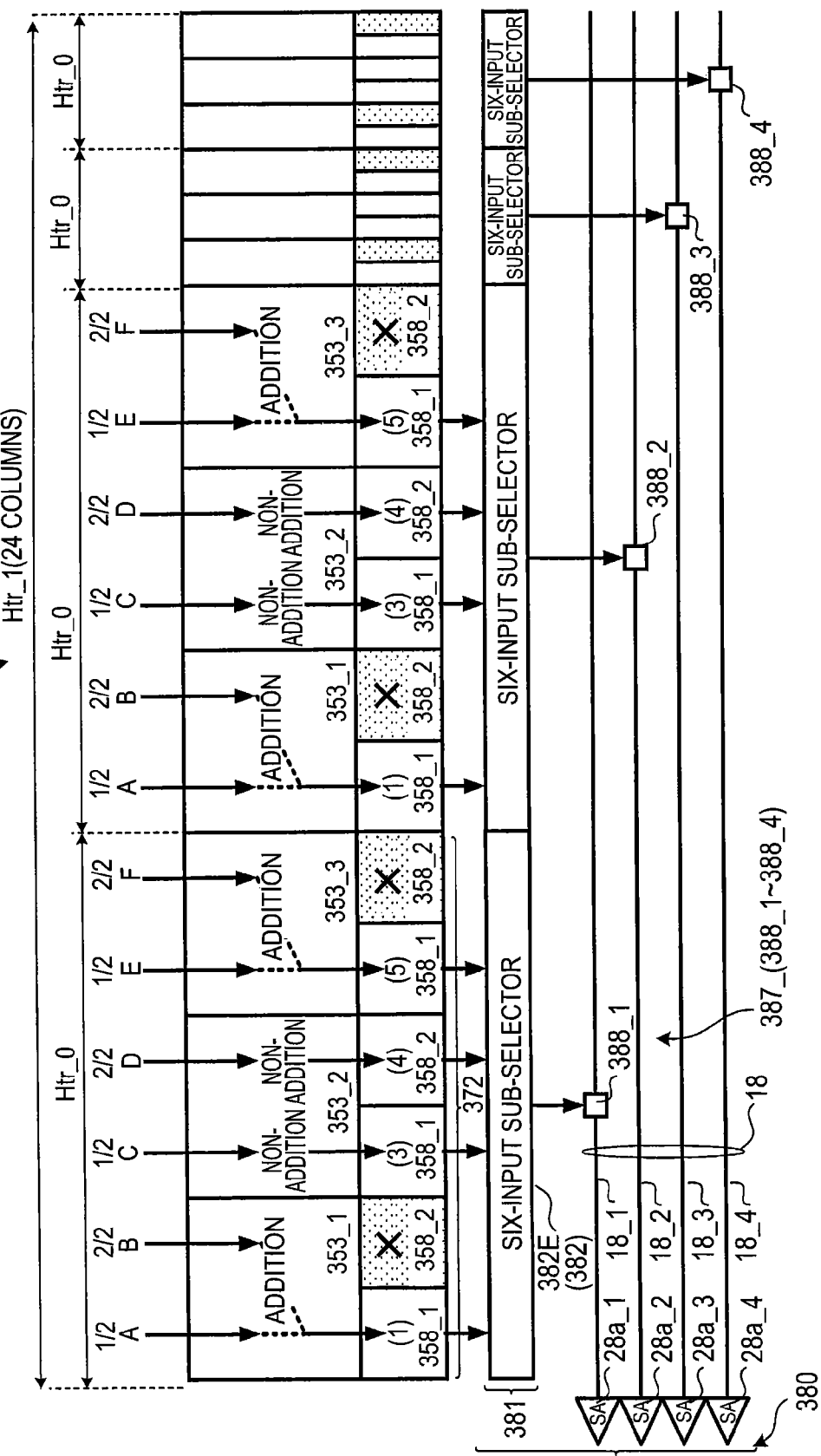
FIG. 22 is a view for explaining a fifth embodiment of column signal processing.

FIG. 22 is a view for explaining a fifth embodiment of column signal processing. The fifth embodiment is a modification of the second or third embodiment. In the fifth embodiment, a method of improving the horizontal transfer efficiency when the amount of information horizontally transferred is reduced is applied. Here, as a modification of the third embodiment, an example of three-pixel addition based on two column sharing in the case of monochrome (black and white) pixels is shown. In addition, the case where the number of horizontal transfer channels is four is shown.

When the frame rate is limited by the horizontal transfer rate, the frame rate is improved by improving the horizontal transfer efficiency. In this case, the horizontal transfer rate can be improved by reducing the parasitic capacitance of the horizontal signal line 18. As a result, the frame rate is improved.

Here, as a structure of reducing the parasitic capacitance of the horizontal signal line 18, a structure in which the data of each data storage section 370 (a group of temporary storage sections 358 or the data storage section 360) is output to the horizontal signal line 18 through an output driver for every column is not applied, but a structure in which the data of each data storage section 370 is output to the horizontal signal line 18 transistor a smaller number of output drivers than the number of all columns of the data storage section 370 is applied.

Although various structures may be considered as the structure, a method of outputting the data to the horizontal signal line 18 using a data selector method is adopted in the present embodiment. The data storage section 370 has a bit number of data holding circuits 372 (temporary storage sections 358 or latches 362) which hold the data for every column (vertical signal line 19). A data selection unit 380 includes a selector section 381, which has a plurality of sub-selectors 382, and a driver section 387, which has a plurality of horizontal transfer drivers 388 (horizontal transfer DR: corresponding to the horizontal transfer driver 359). The sub-selector 382 is an example of a signal selector which selects any of the data of the data holding circuits 372 of a plurality of columns. The horizontal transfer driver 388 is an example of a transfer driving section which drives the horizontal signal line 18 on the basis of the data selected by the sub-selector 382.

All columns of the data storage section 370 are divided into a plurality of blocks each including M columns (M is a positive integer of 3 or more), and one horizontal transfer driver 388 is provided for every block. Moreover, for every block, an "M input-1 output" type sub-selector 382 is provided between the horizontal transfer driver 388 and each data holding circuit 372 of M columns. An output end of the horizontal transfer driver 388 is connected to the output section 28 (sense amplifier 28a) through the horizontal signal line 18 which is a bus line. FIG. 22 shows the case where four horizontal transfer channels are set, and the above-described configuration is applied for each channel. In addition, it is preferable to perform data transfer in the complementary data form.

The horizontal transfer system is hierarchized using the sub-selectors 382. A parent class is selected by a selection transistor in the horizontal transfer driver 388 controlled by the horizontal scanning section 12 (not shown) and a child class is selected by the sub-selector 382 controlled by the communication and timing control section 20 (not shown).

In the present embodiment, an example of M=6 is shown. The six data holding circuits 372 (latch group: in the drawing, six temporary storage sections 358: the same hereinbelow) are input in common to one six-input-type sub-selector 382 (hereinafter, referred to as a six-input sub-selector 382E), an output of the six-input sub-selector 382E controls the horizontal transfer driver 388, and the horizontal transfer driver 388 drives a horizontal transfer channel. The horizontal scanning section 12 selects a specific latch group by turning on a selection transistor in the specific horizontal transfer driver 388. One horizontal transfer system includes six data holding circuits 372, one six-input sub-selector 382E, and one horizontal transfer driver 388.

Each six-input sub-selector 382E is controlled by the communication and timing control section 20 using a common control wiring line. That is, the communication and timing control section 20 has a function of a selection controller which controls each sub-selector 382 (here, the six-input sub-selector 382E) of the selector section 381 to select the data. Even when many sub-selectors 382 (six-input sub-selector 382E) are used, it can be said that there is no steep increase in the number of control wiring lines from the communication and timing control section 20.

The number of horizontal transfer channels is 4, a horizontal transfer system Htr_0 is prepared for each of them, and one horizontal transfer system Htr_1 is provided for the four horizontal transfer systems Htr_0. Four adjacent horizontal transfer drivers 388 drive horizontal signal lines 18_0 to 18_3 of different horizontal transfer channels, respectively. The content of the horizontal transfer channel (horizontal signal lines 18_0 to 18_3) is read by the sense amplifier 28a of the output section 28 (not shown). If necessary, it is read to the outside of a chip after digital processing.

Thus, in the horizontal transfer system Htr_ of the present embodiment, in the configuration including the counting section 350 (counter 353) and the data storage section 370 in which the data holding circuit 372 for horizontal transfer is built, the horizontal transfer driver 388 of the data selection unit 380 is set as a horizontal transfer system Htr_0_k shared between M columns (in this example, six columns), and the six-input sub-selector 382E that determines which data holding circuit 372 is to be connected to the input end of the horizontal transfer driver 388 is used. By sharing the horizontal transfer driver 388 among a number of columns, the horizontal transfer system Htr_ can be hierarchized. As a result, the horizontal transfer efficiency can be improved. Although the horizontal transfer system Htr_0_k of adjacent six columns also has the same structure, it is connected to a different horizontal transfer channel (in this example, four horizontal transfer channels). Therefore, in the case of a 4-channel configuration, a circuit configuration with a period of 24 columns is obtained.

That is, the horizontal signal lines 18 for four channels are provided, and each sub-selector 382 (six-input sub-selector 382E) of the selector section 381 and each horizontal transfer driver 388 of each driver section 387 are equally distributed for the horizontal signal lines 18_1 to 18_4 of four channels. This is to realize the balance of use states of the horizontal transfer drivers 388 or the horizontal signal lines 18_1 to 18_4 regardless of whether or not there is a thinning-out operation. This relationship is also maintained for all vertical columns of the pixel array section 10.

The same is true for the case where the number of inputs of the sub-selector 382 is set to a number other than 6 or the case where the number of channels is set to a number other than 4. When the horizontal signal lines 18 for J channels are provided, each sub-selector 382 of the selector section 381 and each horizontal transfer driver 388 of the driver section 387 are equally distributed for the horizontal signal lines 18 of J channels, and this relationship is also maintained for all vertical columns of the pixel array section 10.

Regarding the relationship between the horizontal transfer driver 388 and the horizontal signal line 18 which is a bus line connected to the output side of the horizontal transfer driver 388, a horizontal transfer system Htr_ of the present embodiment sets "M" columns (in the present embodiment, six columns) as one group. Similar to the fourth embodiment shown in FIG. 21, the number of horizontal transfer drivers 388 connected to the horizontal signal lines 18 can be reduced to 1/M compared with the case where the horizontal transfer driver 359 is provided for every column. As a result, since the parasitic capacitance of a horizontal transfer channel which should be driven by the horizontal transfer driver 388 can be reduced, a high-speed operation can be realized eventually.

Moreover, since the horizontal transfer drivers 388 are not connected in multiple stages, it is not necessary to provide an additional transistor on the path of a current which flows when the horizontal transfer driver 388 performs driving. Accordingly, the series resistance does not increase. Since one horizontal transfer driver 388 is sufficient regardless of the configuration of the sub-selector 382, the series resistance when driving the horizontal signal line 18 does not increase. As a result, high-speed data transfer can be reliably performed compared with the case where the configuration of the present embodiment is not adopted.

By performing addition in the possible range within columns, four items of information may be horizontally transferred in units of six columns. In this case, the amount of information horizontally transferred is reduced to 2/3 of that in the case of an all pixel readout. Although the information of six columns is transferred to each horizontal transfer driver 359 in the fourth embodiment shown in FIG. 21, the information of six columns is transferred to one horizontal transfer driver 359 through the six-input sub-selector 382E in the fifth embodiment. Using the six-input sub-selector 382E is based on being repeated with six columns as a unit. In addition, such a configuration is divided into four groups for every group of six columns, and the four groups are connected to the sense amplifier 28a through different horizontal signal lines 18.

By introducing such a sub-selector, effects of speed improvements including a speed improvement, which is based on a reduction in the parasitic capacitance of the horizontal transfer system Htr, and a speed improvement, which is based on an improvement in the use efficiency in a mode, such as a thinning-out mode (horizontal pixel addition is also an example), are acquired. For details of these points, for example, Japanese Patent Application No. 2008-147950 (corresponding to JP-A-2009-296311) proposed by this application may be referred to.

The advantages of the improvement in use efficiency in the thinning-out mode or the like may also be obtained when the number of items of information to be horizontally transferred within a six column unit is reduced to 4. In this example, since the number of items of information to be horizontally transferred within a six column unit is reduced to 4, the time taken for horizontal transfer can be reduced to 2/3 only by the speed improvement based on an improvement in the use efficiency in a mode, such as the thinning-out mode. If the effects obtained through a reduction in the parasitic capacitance of the horizontal transfer system Htr are included, the horizontal transfer time can be further reduced.

Although not shown in the drawing, the same concept may also be applied to the case of horizontal two-pixel addition in the three pixel sharing configuration. Also in this case, since the number of items of information to be horizontally transferred within a six column unit is reduced to 4, the same effects are obtained.

Also in the case of color imaging, the concept which is similar to that for monochrome imaging may be applied. In the case of horizontal three-pixel addition in the two pixel sharing configuration among the cases of color imaging, however, the horizontal transfer efficiency is not maximized unless a twelve-input sub-selector is used, as can be seen from the fourth example in which twelve columns are set as a unit.

Sixth Embodiment

Imaging Apparatus

Figure 23:
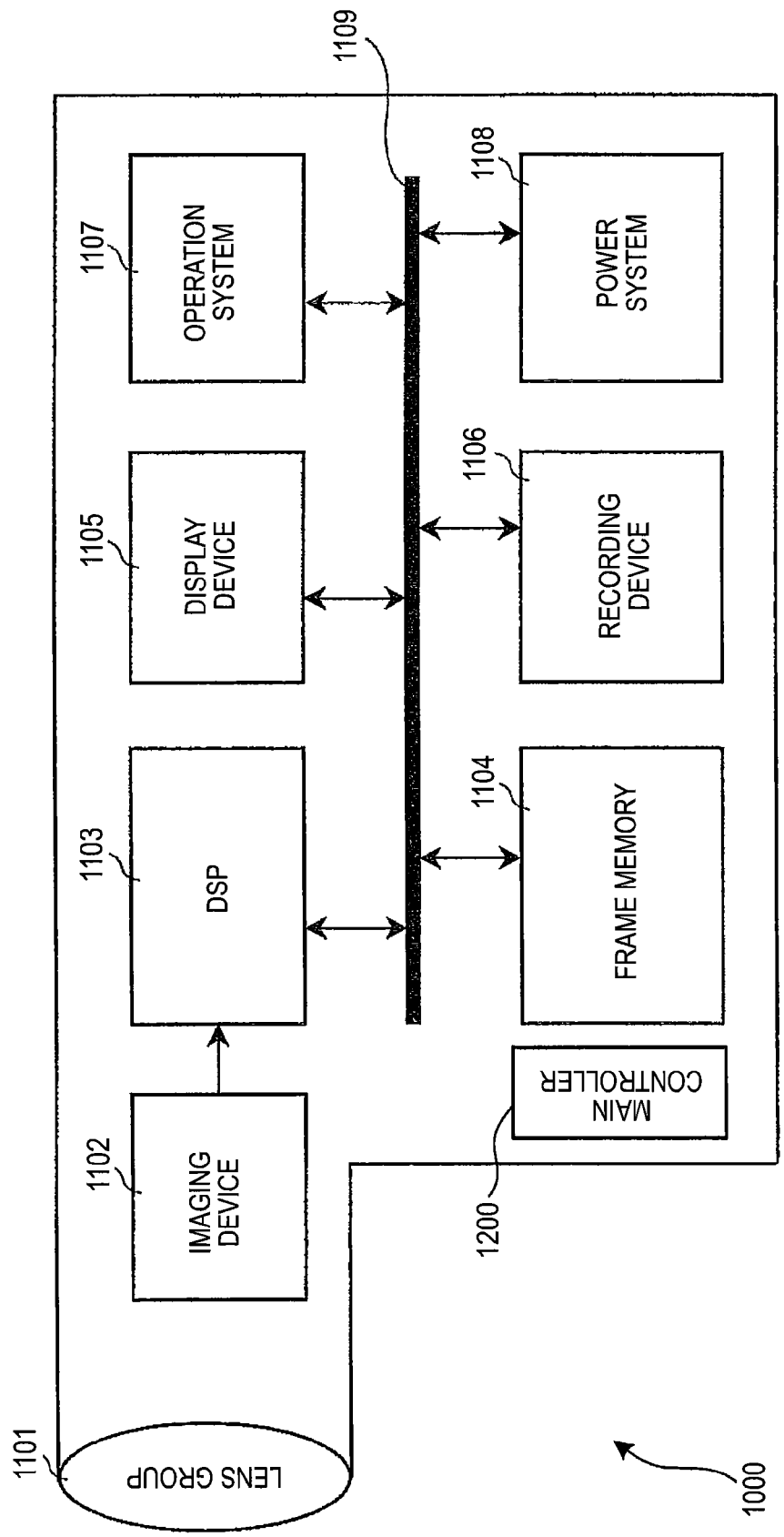
FIG. 23 is a view for explaining an imaging apparatus (sixth embodiment) to which the solid state imaging device of the present embodiment is applied.

FIG. 23 is a view for explaining a sixth embodiment. The sixth embodiment is an imaging apparatus to which the solid state imaging device 1 according to each of the embodiments described above is applied.

As shown in FIG. 23, an imaging apparatus 1000 includes an optical system having a lens group 1101 and the like, a solid state imaging device 1102, a DSP circuit 1103 which is a camera signal processing circuit, a frame memory 1104, a display device 1105, a recording device 1106, an operation system 1107, a power system 1108, and the like. The DSP circuit 1103, the frame memory 1104, the display device 1105, the recording device 1106, the operation system 1107, and the power system 1108 are connected to each other through a bus line 1109. The imaging apparatus 1000 further includes a main controller 1200 which performs overall control of the whole apparatus.

The lens group 1101 receives incident light (image light) from a subject and forms an image on the imaging surface of the solid state imaging device 1102. The solid state imaging device 102 converts the incident light, which is formed on the imaging surface by the lens group 1101, into an electric signal in units of a pixel and then outputs it as a pixel signal. As the solid state imaging device 1102, the solid state imaging device 1 according to each of the embodiments described above is used.

The display device 1105 is formed by a panel type display device, such as a liquid crystal display device or an organic electroluminescence display device, and displays a moving image or a still image imaged by the solid state imaging device 1102. The recording device 1106 records the moving image or the still image imaged by the solid state imaging device 1102 in recording media, such as a video tape or a DVD (Digital Versatile Disk).

The operation system 1107 gives an operation command regarding various functions of the imaging apparatus 1000 by the user operation. The power system 1108 appropriately supplies power for operations of the DSP circuit 1103, the frame memory 1104, the display device 1105, the recording device 1106, and the operation system 1107 to them.

The imaging apparatus 1000 is provided, for example, as a camera or a portable apparatus having an imaging function in order to perform 'imaging'. In addition, 'imaging' includes not only taking a picture in the usual sense of camera photograph but also has broader applications, such as fingerprint detection.

Since such an imaging apparatus 1000 is configured to include the solid state imaging device 1 according to each of the embodiments described above, the same effects as in the solid state imaging device 1 according to each embodiment can be acquired.

The present application contains subject matter related to that disclosed in Japanese Priority Patent Applications JP 2009-230236 filed in the Japan Patent Office on Oct. 2, 2009, the entire contents of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A solid state imaging device comprising:
    an AD conversion section that has one comparison section, which receives a reference signal from a reference signal generator that generates the reference signal whose level gradually changes and which compares the reference signal with an analog signal to be processed, and one counting section, which receives a count clock for AD conversion and performs a count operation on the basis of a comparison result of the comparison section, for each of M signal lines to which the signal to be processed is supplied and that acquires digital data of the signal to be processed on the basis of output data of the counting section;

an operation period control section that controls an operation period of the counting section on the basis of the comparison result of the comparison section; and a control section that performs control regarding which of the signals to be processed, which are supplied through the M signal lines, is to be processed and which one of m levels of the signals to be processed is to be processed and also controls the processing order.

2. The solid state imaging device according to claim 1, wherein the control section performs control such that AD conversion is performed on the signals to be processed in order of a combination of levels with the same meaning.

3. The solid state imaging device according to claim 2, further comprising:

a pixel array section in which unit pixels that output the signals to be processed are arrayed in a matrix; and a selection section that selects in order the signals to be processed, which are supplied through signal lines of a plurality of columns of the pixel array section, and that supplies the signals to the comparison section, wherein the comparison section and the counting section are provided for every plural lines of the pixel array section, and the reference signal generator supplies the reference signal to each comparison section of the AD conversion section in common.

4. The solid state imaging device according to claim 3, wherein the AD conversion section performs AD conversion processing for a light receiving signal level and a reference level of the signal to be processed, which is output from the unit pixel, as the m levels.

5. The solid state imaging device according to claim 4, further comprising:

a storage section that is provided corresponding to each of the M signal lines in order to store digital data regarding the reference level, wherein the AD conversion section acquires the digital data regarding the reference level of each signal to be processed and then stores the digital data in the corresponding storage section at the time of AD conversion processing regarding the reference level, and reads the stored digital data from the storage section corresponding to the signal to be processed and performs AD conversion processing regarding the reference level with the read value as a start point at the time of AD conversion processing regarding the light receiving signal level, thereby acquiring digital data corresponding to a difference between the reference level and the light receiving signal level.

6. The solid state imaging device according to claim 4, wherein the AD conversion section includes:

a counter having a reset end, which sets an output as a reset level, and a preset end, which sets an output as a preset level; and a rewrite control section that rewrites the data, which is stored in the storage section, as a value of the counter by controlling the reset end and the preset end on the basis of the data stored in the storage section which stores the output data of the counter.

7. The solid state imaging device according to claim 6, wherein the AD conversion section acquires digital data regarding an addition result of at least two of M signals to be processed.

8. The solid state imaging device according to claim 7, wherein the AD conversion section acquires digital data regarding all addition results of the M signals to be processed.

9. The solid state imaging device according to claim 7, wherein in order to acquire digital data regarding an addition result of Y (different from X) signals to be processed when one comparison section and one counting section are provided for signals to be processed which are supplied through X signal lines, the AD conversion section acquires an addition result with the least common multiple of X and Y as a basic processing unit using the counting section for a portion in which addition of the Y signals to be processed is possible, but separately performs AD conversion of signals to be processed using the counting section for a portion in which addition of the Y signals to be processed is difficult.

10. A solid state imaging device comprising:

an AD conversion section that has one comparison section, which receives a reference signal from a reference signal generator that generates the reference signal whose level gradually changes and which compares the reference signal with an analog signal to be processed, and one counting section, which receives a count clock for AD conversion and performs a count operation on the basis of a comparison result of the comparison section, for each of M signal lines to which the signal to be processed is supplied and that acquires digital data of the signal to be processed on the basis of output data of the counting section; and an operation period control section that controls an operation period of the counting section on the basis of the comparison result of the comparison section, wherein in order to acquire digital data regarding an addition result of Y (different from X) signals to be processed when one comparison section and one counting section are provided for signals to be processed which are supplied through X signal lines, the AD conversion section acquires an addition result with the least common multiple of X and Y as a basic processing unit using the counting section for a portion in which addition of the Y signals to be processed is possible, but separately performs AD conversion of signals to be processed using the counting section for a portion in which addition of the Y signals to be processed is difficult.

11. The solid state imaging device according to claim 10, wherein an operation section that acquires an addition result of the Y signals to be processed by adding the addition result acquired by the counting section and the AD conversion result of the signal to be processed separately acquired is provided separately from the AD conversion section.

12. The solid state imaging device according to claim 11, wherein the signal lines for data transfer are provided corresponding to channels the number of which is equal to the least common multiple of X and Y, and signal lines of the processing unit are equally distributed for the signal lines for data transfer of the channels.

13. The solid state imaging device according to claim 12, wherein one transfer section that transfers the digital data acquired by the AD conversion section to a subsequent-stage circuit is provided for the M signal lines to which the signals to be processed are supplied.

14. The solid state imaging device according to claim 13, further comprising:

a data storage section having a plurality of data holding circuits which hold the digital data acquired by the AD conversion section;

a selection section having a plurality of signal selecting sections which select any of the data of the plurality of data holding circuits;

a selection control section that controls each signal selecting section of the selection section to select data;
a driving section having a transfer driving section, which drives the signal lines for data transfer on the basis of the data selected by the signal selecting section and is provided for each of the plurality of signal selecting sections; and
a scanning section that controls each transfer driving section of the driving section to transfer data to a subsequent-stage circuit through the signal lines for data transfer,
wherein the transfer driving section has a transfer transistor, which drives the signal line for data transfer on the basis of the data selected by the signal selecting section, and a selection transistor, which selects any of the plurality of signal selecting sections on the basis of an instruction from the scanning section, and is configured such that the data selected by the signal selecting section is transferred to the subsequent-stage circuit through the signal lines for data transfer when both the transfer transistor and the selection transistor are turned on.

15. The solid state imaging device according to claim 14, wherein the signal lines for data transfer are provided corresponding to a plurality of channels, and
each signal selecting section of the selection section and each transfer driving section of the driving section are equally distributed for each signal line for data transfer of the plurality of channels.

16. An imaging apparatus comprising:
a pixel array section in which unit pixels that output the signals to be processed are arrayed in a matrix;
a vertical scanning section that reads the signal to be processed from each unit pixel of the pixel array section;
an AD conversion section that has one comparison section, which receives a reference signal from a reference signal generator that generates the reference signal whose level gradually changes and which compares the reference signal with the signal to be processed of each unit pixel, and one counting section, which receives a count clock for AD conversion and performs a count operation on the basis of a comparison result of the comparison section, for each of M signal lines to which the signal to be processed is supplied and that acquires digital data of the signal to be processed on the basis of output data of the counting section;
an operation period control section that controls an operation period of the counting section on the basis of the comparison result of the comparison section;
a horizontal scanning section that transfers the digital data acquired by the AD conversion section to a subsequent-stage circuit; and
a control section that performs control regarding which of the signals to be processed, which are supplied through the M signal lines, is to be processed and which one of m levels of the signals to be processed is to be processed and also controls the processing order.

17. An imaging apparatus comprising:
a pixel array section in which unit pixels that output the signals to be processed are arrayed in a matrix;
a vertical scanning section that reads the signal to be processed from each unit pixel of the pixel array section;
an AD conversion section that has one comparison section, which receives a reference signal from a reference signal generator that generates the reference signal whose level gradually changes and which compares the reference signal with the signal to be processed of each unit pixel, and one counting section, which receives a count clock for AD conversion and performs a count operation on the basis of a comparison result of the comparison section, for each of M signal lines to which the signal to be processed is supplied and that acquires digital data of the signal to be processed on the basis of output data of the counting section;
an operation period control section that controls an operation period of the counting section on the basis of the comparison result of the comparison section;
a horizontal scanning section that transfers the digital data acquired by the AD conversion section to a subsequent-stage circuit; and
an operation section that performs digital operation processing on the basis of data horizontally transferred,
wherein, in order to acquire digital data regarding an addition result of Y (different from X) signals to be processed when one comparison section and one counting section are provided for signals to be processed which are supplied through X signal lines, the AD conversion section acquires an addition result with the least common multiple of X and Y as a basic processing unit using the counting section for a portion in which addition of the Y signals to be processed is possible, but separately performs AD conversion of signals to be processed using the counting section for a portion in which addition of the Y signals to be processed is difficult, and
the operation section acquires an addition result of the Y signals to be processed by adding the addition result acquired by the counting section and the AD conversion result of the signal to be processed separately acquired.

* * * * *